United States Patent
Iwashita et al.

(10) Patent No.: US 8,021,824 B2
(45) Date of Patent: Sep. 20, 2011

(54) POLYMER COMPOUND, RESIST COMPOSITION AND METHOD OF FORMING RESIST PATTERN

(75) Inventors: Jun Iwashita, Kawasaki (JP); Sho Abe, Kawasaki (JP); Makiko Irie, Kawasaki (JP); Takeshi Iwai, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 216 days.

(21) Appl. No.: 12/449,547

(22) PCT Filed: Feb. 6, 2008

(86) PCT No.: PCT/JP2008/051907
§ 371 (c)(1),
(2), (4) Date: Aug. 13, 2009

(87) PCT Pub. No.: WO2008/099725
PCT Pub. Date: Aug. 21, 2008

(65) Prior Publication Data
US 2010/0081080 A1  Apr. 1, 2010

(30) Foreign Application Priority Data

Feb. 15, 2007 (JP) ............... P2007-034588
Nov. 21, 2007 (JP) ............... P2007-302250

(51) Int. Cl.
*G03F 7/039* (2006.01)
*G03F 7/20* (2006.01)
*G03F 7/30* (2006.01)
*C08F 28/02* (2006.01)

(52) U.S. Cl. ............. 430/270.1; 430/326; 430/910; 526/288

(58) Field of Classification Search .............. None
See application file for complete search history.

(56) References Cited

U.S. PATENT DOCUMENTS

| | | | |
|---|---|---|---|
| 4,289,865 | A | 9/1981 | Wilson et al. |
| 5,945,517 | A | 8/1999 | Nitta et al. |
| 6,153,733 | A | 11/2000 | Yukawa et al. |
| 6,235,849 | B1 | 5/2001 | Jayaraman et al. |
| 6,777,157 | B1 | 8/2004 | Barclay et al. |
| 7,074,543 | B2 | 7/2006 | Iwai et al. |
| 2003/0118935 | A1 | 6/2003 | Matsuzawa |
| 2005/0074693 | A1* | 4/2005 | Kishimura et al. ........ 430/270.1 |

FOREIGN PATENT DOCUMENTS

| | | |
|---|---|---|
| JP | 9-208554 | 8/1997 |
| JP | 11-35551 | 2/1999 |
| JP | 11-35552 | 2/1999 |
| JP | 11-35573 | 2/1999 |
| JP | 11-322707 | 11/1999 |
| JP | 2001-296663 | 10/2001 |
| JP | 2003-186191 | 7/2003 |
| JP | 2003-241385 | 8/2003 |
| JP | 2003-525311 | 8/2003 |
| JP | 2004-117883 | 4/2004 |
| JP | 2004-151355 | 5/2004 |
| WO | 2004/074242 | 9/2004 |

OTHER PUBLICATIONS

Snyder et al., "Diels-Alder Reactions of α,β-Unsaturated Sulfonyl Compounds", J. Am. Chem. Soc., 1951, vol. 73 (7), pp. 3258-3260.
International Search Report dated Mar. 4, 2008 for PCT application corresponding to present U.S. application.

* cited by examiner

*Primary Examiner* — Sin J. Lee
(74) *Attorney, Agent, or Firm* — Wenderoth, Lind & Ponack, L.L.P.

(57) ABSTRACT

A polymer compound including a structural unit (a0) represented by general formula (a0-1) shown below:

[Chemical Formula 1]

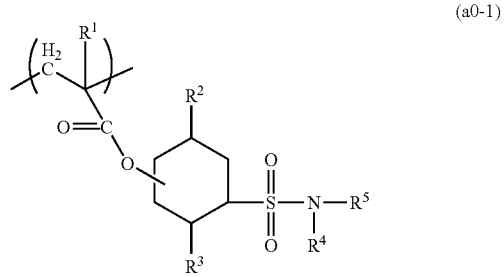

(a0-1)

wherein $R^1$ represents a hydrogen atom, an alkyl group of 1 to 5 carbon atoms or a fluorinated alkyl group of 1 to 5 carbon atoms; $R^2$ and $R^3$ each independently represents a hydrogen atom, an alkyl group or an alkoxy group, or $R^2$ and $R^3$ may be bonded together to form an alkylene group that may include an oxygen atom or sulfur atom at an arbitrary position, —O— or —S—; $R^4$ and $R^5$ each independently represents a hydrogen atom, an alkyl group that may include an oxygen atom at an arbitrary position, a cycloalkyl group that may include an oxygen atom at an arbitrary position or an alkoxycarbonyl group.

8 Claims, No Drawings

POLYMER COMPOUND, RESIST COMPOSITION AND METHOD OF FORMING RESIST PATTERN

TECHNICAL FIELD

The present invention relates to a novel polymer compound, a resist composition and a method of forming a resist pattern which can be used in lithography applications.

Priority is claimed on Japanese Patent Application No. 2007-034588, filed Feb. 15, 2007, and Japanese Patent Application No. 2007-302250, filed Nov. 21, 2007, the contents of which are incorporated herein by reference.

BACKGROUND ART

In lithography techniques, for example, a resist film composed of a resist material is formed on a substrate, and the resist film is subjected to selective exposure of radial rays such as light or an electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a wavelength shorter than these excimer lasers, such as $F_2$ excimer lasers, electron beams, extreme ultraviolet radiation (EUV), and X rays.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist is used, which includes a base resin that exhibits a changed solubility in an alkali developing solution under action of acid and an acid generator that generates acid upon exposure.

For example, a chemically amplified positive resist contains, as a base resin, a resin which exhibits increased solubility in an alkali developing solution under action of acid, and an acid generator. In the formation of a resist pattern, when acid is generated from the acid generator upon exposure, the exposed portions become soluble in an alkali developing solution.

Currently, resins that contain structural units derived from (meth)acrylate esters within the main chain (acrylic resins) are widely used as base resins for resists that use ArF excimer laser lithography, as they exhibit excellent transparency in the vicinity of 193 nm (for example, see Patent Document 1). Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of an acrylate ester having a hydrogen atom bonded to the α-position and a methacrylate ester having a methyl group bonded to the α-position. The term "(meth)acrylate" is a generic term that includes either or both of an acrylate having a hydrogen atom bonded to the α-position and a methacrylate having a methyl group bonded to the α-position.

[Patent Document 1] Japanese Unexamined Patent Application, First Publication No. 2003-241385

DISCLOSURE OF INVENTION

Problems to be Solved by the Invention

With the expectation of further progress in lithography techniques and further expansion in the potential fields of application for such lithography techniques, there are growing demands for the development of novel materials that can be used in lithography applications.

The present invention takes the above circumstances into consideration, with an object of providing a novel polymer compound, a resist composition and a method of forming a resist pattern which can be used in lithography applications.

Means for Solving the Problems

For solving the above-mentioned problems, the present inventors propose the following aspects.

Namely, a first aspect of the present invention is a polymer compound including a structural unit (a0) represented by general formula (a0-1) shown below.

[Chemical Formula 1]

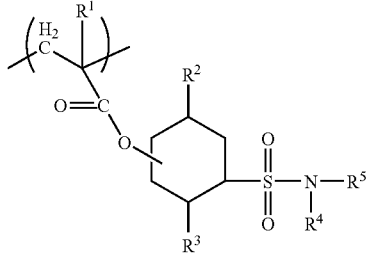

wherein $R^1$ represents a hydrogen atom, an alkyl group of 1 to 5 carbon atoms or a fluorinated alkyl group of 1 to 5 carbon atoms; $R^2$ and $R^3$ each independently represents a hydrogen atom, an alkyl group or an alkoxy group, or $R^2$ and $R^3$ may be bonded together to form an alkylene group that may include an oxygen atom or sulfur atom at an arbitrary position, —O— or —S—; $R^4$ and $R^5$ each independently represents a hydrogen atom, an alkyl group that may include an oxygen atom at an arbitrary position, a cycloalkyl group that may include an oxygen atom at an arbitrary position or an alkoxycarbonyl group.

A second aspect of the present invention is a resist composition including a resin component (A) which contains the polymer compound according to the first aspect described above and an acid-generator component (B) which generates acid upon irradiation.

A third aspect of the present invention is a method of forming a resist pattern including: applying a resist composition of the second aspect to a substrate to form a resist film on the substrate; subjecting the resist film to exposure; and developing the resist film to form a resist pattern.

In the present description and claims, the term "structural unit" refers to a monomer unit that contributes to the formation of a polymer compound (namely, a resin, polymer or copolymer).

The expression "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom at the α-position, and acrylate esters having a substituent (an atom other than a hydrogen atom or a group) bonded to the carbon atom at the α-position. As the substituent, a lower alkyl group, a halogenated lower alkyl group or a halogen atom can be mentioned.

With respect to the "structural unit derived from an acrylate ester", the "α-position (the carbon atom at the α-position)" refers to the carbon atom having the carbonyl group bonded thereto, unless specified otherwise.

The term "exposure" is used as a general concept that includes irradiation with any form of radiation.

Unless specified otherwise, the term "alkyl group" includes linear, branched and cyclic monovalent saturated hydrocarbon groups. This definition also applies to alkyl groups within an "alkoxycarbonyl group".

A "lower alkyl group" is an alkyl group of 1 to 5 carbon atoms.

The term "aliphatic" is a relative concept used in relation to the term "aromatic", and defines a group or compound or the like that has no aromaticity.

The term "alkylene group" includes linear, branched and cyclic divalent saturated hydrocarbon groups, unless specified otherwise.

A "halogenated alkyl group" describes a group in which some or all of the hydrogen atoms of an alkyl group have been substituted with halogen atoms. Examples of the halogen atom include a fluorine atom, a chlorine atom, a bromine atom and an iodine atom.

Effects of the Invention

According to the present invention, there can be provided a novel polymer compound, a resist composition and a method of forming a resist pattern.

BEST MODE FOR CARRYING OUT THE INVENTION

Polymer Compound

[Structural Unit (a0)]

A polymer compound of the present invention (hereafter, referred to as "polymer compound (A1)") includes a structural unit (a0) represented by general formula (a0-1) shown above.

In general formula (a0-1), $R^1$ represents a hydrogen atom, an alkyl group of 1 to 5 carbon atoms or a fluorinated alkyl group of 1 to 5 carbon atoms.

Specific examples of the alkyl group of 1 to 5 carbon atoms for $R^1$ include linear or branched lower alkyl groups such as a methyl group, an ethyl group, a propyl group, an isopropyl group, an n-butyl group, an isobutyl group, a tert-butyl group, a pentyl group, an isopentyl group and a neopentyl group.

Examples of the fluorinated alkyl group of 1 to 5 carbon atoms for $R^1$ include groups in which part or all of the hydrogen atoms within the alkyl groups of 1 to 5 carbon atoms described above have been substituted with a fluorine atom.

From the viewpoint of industrial availability, $R^1$ is preferably a hydrogen atom, a methyl group or a trifluoromethyl group, and a hydrogen atom or a methyl group is particularly desirable.

In formula (a0-1), $R^2$ and $R^3$ each independently represents a hydrogen atom, an alkyl group or an alkoxy group, or $R^2$ and $R^3$ may be bonded together to form an alkylene group that may include an oxygen atom or sulfur atom at an arbitrary position, —O— or —S—.

The alkyl groups for $R^2$ and $R^3$ may be linear, branched or cyclic monovalent saturated hydrocarbon groups, and are preferably saturated hydrocarbon groups of 1 to 10 carbon atoms, more preferably saturated hydrocarbon groups of 1 to 6 carbon atoms, and most preferably saturated hydrocarbon groups of 1 to 4 carbon atoms.

With respect to the alkoxy groups for $R^2$ and $R^3$, the alkyl groups may be linear, branched or cyclic monovalent saturated hydrocarbon groups, and are preferably saturated hydrocarbon groups of 1 to 10 carbon atoms, more preferably saturated hydrocarbon groups of 1 to 6 carbon atoms, and most preferably saturated hydrocarbon groups of 1 to 4 carbon atoms.

$R^2$ and $R^3$ are preferably bonded together to form an alkylene group that may include an oxygen atom or sulfur atom at an arbitrary position, —O— or —S—.

The alkylene group formed when $R^2$ and $R^3$ are bonded together is a linear, branched or cyclic divalent saturated hydrocarbon group, and is preferably a group of 1 to 5 carbon atoms, more preferably a group of 1 to 4 carbon atoms, still more preferably a group of 1 or 2 carbon atoms, and a group of one carbon atom (namely, a methylene group) is particularly desirable.

When $R^2$ and $R^3$ are bonded together to form an alkylene group that may include an oxygen atom or sulfur atom at an arbitrary position, —O— or —S—, the structural unit (a0) is a structural unit represented by general formula (a0-1-1), (a0-1-2) or (a0-1-3) shown below.

[Chemical Formula 2]

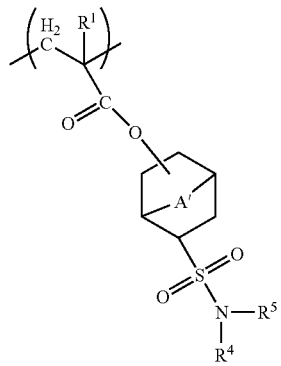

(a0-1-1)

-continued

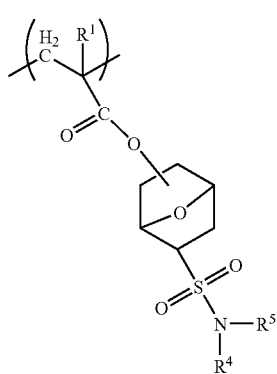

(a0-1-2)

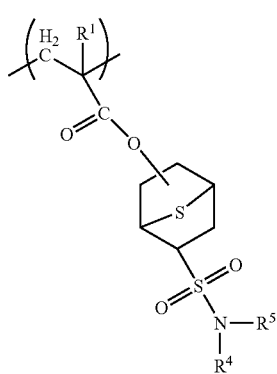

(a0-1-3)

In these formulas (a0-1-1), (a0-1-2) and (a0-1-3), $R^1$, $R^4$ and $R^5$ are as defined above for $R^1$, $R^4$, and $R^5$, respectively in the aforementioned formula (a0-1).

In formula (a0-1-1), A' represents an alkylene group that may include an oxygen atom or sulfur atom at an arbitrary position, and is preferably an alkylene group of 1 to 5 carbon atoms that may include an oxygen atom or sulfur atom at an arbitrary position. Specific examples thereof include a methylene group, an ethylene group, an n-propylene group, an isopropylene group, —$CH_2$—O—$CH_2$—, —$CH_2$—O—$(CH_2)_2$—, —$CH_2$—S—$CH_2$— and —$CH_2$—S—$(CH_2)_2$—.

In formula (a0-1), $R^4$ and $R^5$ each independently represents a hydrogen atom, an alkyl group that may include an oxygen atom at an arbitrary position, a cycloalkyl group that may include an oxygen atom at an arbitrary position or an alkoxycarbonyl group.

The alkyl group for $R^4$ and $R^5$ is preferably a linear or branched monovalent saturated hydrocarbon group. The linear or branched monovalent saturated hydrocarbon group is preferably a saturated hydrocarbon group of 1 to 10 carbon atoms, more preferably a saturated hydrocarbon group of 1 to 6 carbon atoms, and most preferably a saturated hydrocarbon group of 1 to 4 carbon atoms. The alkyl group for $R^4$ and $R^5$ may include an oxygen atom at an arbitrary position. Examples of such alkyl group include an alkoxy group and an alkoxyalkyl group.

The cycloalkyl group for $R^4$ and $R^5$ is preferably a cyclic monovalent saturated hydrocarbon group, more preferably a saturated hydrocarbon group of 3 to 20 carbon atoms, still more preferably a saturated hydrocarbon group of 4 to 15 carbon atoms, and most preferably a saturated hydrocarbon group of 5 to 12 carbon atoms. The cycloalkyl group for $R^4$ and $R^5$ may include an oxygen atom at an arbitrary position.

With respect to the alkoxycarbonyl group for $R^4$ and $R^5$, the alkyl group is preferably a linear, branched or cyclic monovalent saturated hydrocarbon group, more preferably a saturated hydrocarbon group of 1 to 10 carbon atoms, and still more preferably a saturated hydrocarbon group of 1 to 6 carbon atoms. As the alkoxycarbonyl group for $R^4$ and $R^5$, chain-like tertiary alkoxycarbonyl groups such as a tert-butoxycarbonyl group and a tert-pentyloxycarbonyl group are particularly desirable.

When the polymer compound (A1) of the present invention is used as a resin component (A) in a positive resist composition described later, it is preferable that either one of, or both of $R^4$ and $R^5$ be an acid dissociable, dissolution inhibiting group.

For example, when one of $R^4$ and $R^5$ is an acid dissociable, dissolution inhibiting group, specific examples of the structural unit (a0) include structural units represented by general formula (a0-1-4) shown below.

[Chemical Formula 3]

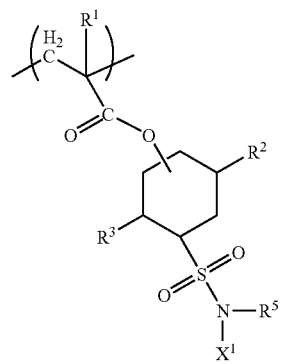

(a0-1-4)

In formula (a0-1-4), $R^1$, $R^2$, $R^3$ and $R^5$ are as defined above for $R^1$, $R^2$, $R^3$ and $R^5$, respectively in the aforementioned formula (a0-1), and $X^1$ represents an acid dissociable, dissolution inhibiting group.

The acid dissociable, dissolution inhibiting group for $R^4$ and $R^5$ in the structural unit (a0) (for example, $X^1$ in the aforementioned formula (a0-1-4)) is "an alkyl group that may include an oxygen atom at an arbitrary position, a cycloalkyl group that may include an oxygen atom at an arbitrary position or an alkoxycarbonyl group", and during formation of a resist pattern when prepared as a resist composition, has an alkali dissolution-inhibiting effect that renders the entire polymer compound (A1) insoluble in an alkali developing solution prior to dissociation, and then following dissociation by the action of acid, increases the solubility of the entire polymer compound (A1) in the alkali developing solution.

As the acid dissociable, dissolution inhibiting group, any of the groups that have been proposed as acid dissociable, dissolution inhibiting groups for the base resins of chemically amplified resists can be used. Specifically, among the acid dissociable, dissolution inhibiting groups mentioned in relation to a structural unit (a1) described later, a group corresponding to "an alkyl group that may include an oxygen atom at an arbitrary position, a cycloalkyl group that may include an oxygen atom at an arbitrary position or an alkoxycarbonyl group", can be used. More specifically, a tertiary alkyl group, an acetal-type acid dissociable, dissolution inhibiting group such as an alkoxyalkyl group, and an alkoxycarbonyl group can be used.

In the "tertiary alkyl group" for $R^4$ and $R^5$ in the structural unit (a0), a tertiary carbon atom within the chain-like or cyclic alkyl group is bonded to the nitrogen atom at the terminal of the sulfonamide group ($SO_2N$ group). In this tertiary alkyl group, during formation of a resist pattern using the resist composition, the action of acid causes cleavage of the bond between the nitrogen atom at the terminal of the sulfonamide group ($SO_2N$ group) and the tertiary carbon atom.

As the chain-like tertiary alkyl group for $R^4$ and $R^5$, an aliphatic branched tertiary alkyl group is preferable.

The term "aliphatic branched" refers to a branched structure having no aromaticity.

As the aliphatic branched tertiary alkyl groups for $R^4$ and $R^5$, tertiary alkyl groups of 4 to 8 carbon atoms are more preferable, and specific examples thereof include a tert-butyl group, a tert-pentyl group and a tert-heptyl group, and a tert-butyl group is particularly desirable.

As the cyclic tertiary alkyl group for $R^4$ and $R^5$, a tertiary alkyl group including an aliphatic cyclic group can be used.

The term "aliphatic cyclic group" refers to a monocyclic group or polycyclic group that has no aromaticity.

Examples of the aliphatic cyclic groups include groups in which one or more hydrogen atoms have been removed from a monocycloalkane or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

As the tertiary alkyl group including an aliphatic cyclic group, for example, a group which has a tertiary carbon atom on the ring structure of the cyclic alkyl group can be mentioned. Specific examples include a 2-methyl-2-adamantyl group and a 2-ethyl-2-adamantyl group. Further, groups having an aliphatic cyclic group such as an adamantyl group, and a branched alkylene group having a tertiary carbon atom bonded thereto, as in the group bonded to the oxygen atom at the terminal of the carbonyloxy group in the structural units represented by general formula (a1") shown below, can be used.

The "acetal-type acid dissociable, dissolution inhibiting group" for $R^4$ and $R^5$ in the structural unit (a0) is bonded to the nitrogen atom at the terminal of the sulfonamide group ($SO_2N$ group). With respect to the acetal-type acid dissociable, dissolution inhibiting group, during formation of a resist pattern using the resist composition, when acid is generated upon exposure, the generated acid acts to break the bond between the nitrogen atom and the acetal-type acid dissociable, dissolution inhibiting group.

As the acetal-type acid dissociable, dissolution inhibiting group, the same acetal-type acid dissociable, dissolution inhibiting groups as those mentioned in relation to the structural unit (a1) described later can be used.

The "alkoxycarbonyl group" for $R^4$ and $R^5$ in the structural unit (a0) is bonded to the nitrogen atom at the terminal of the sulfonamide group ($SO_2N$ group). With respect to the alkoxycarbonyl group, during formation of a resist pattern using the resist composition, when acid is generated upon exposure, the generated acid acts to break the bond between the nitrogen atom and the alkoxycarbonyl group.

Examples of the alkoxycarbonyl group include a methoxycarbonyl group, an ethoxycarbonyl group, a propyloxycarbonyl group, a butoxycarbonyl group, and a pentyloxycarbonyl group. Of these, chain-like tertiary alkoxycarbonyl groups such as a tert-butoxycarbonyl group and a tert-pentyloxycarbonyl group are preferable.

Specific examples of the structural unit (a0) include structural units represented by general formulas (A0-1-11) and (A0-1-12) shown below.

[Chemical Formula 4]

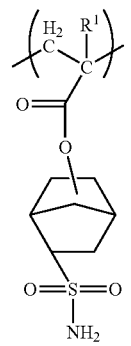

(A0-1-11)

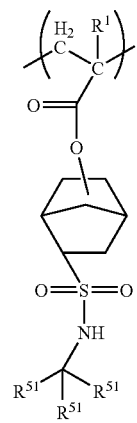

(A0-1-12)

wherein $R^1$ is as defined above for $R^1$ in the aforementioned formula (a0-1); the plurality of $R^{51}$ may be the same or different, and at least one $R^{51}$ represents a linear or branched alkyl group of 1 to 4 carbon atoms; and the remaining two $R^{51}$ each independently represents a linear or branched alkyl group of 1 to 4 carbon atoms or a monovalent aliphatic cyclic group of 4 to 20 carbon atoms, or the remaining two $R^{51}$ may be bonded to each other to form a divalent aliphatic cyclic group of 4 to 20 carbon atoms together with the carbon atoms to which the two $R^{51}$ are bonded.

The monovalent aliphatic cyclic group of 4 to 20 carbon atoms for $R^{51}$ is as defined above for the "aliphatic cyclic group" described in connection with the aforementioned tertiary alkyl group including an aliphatic cyclic group for $R^4$ and $R^5$, and specific examples thereof include a cyclopentyl group, a cyclohexyl group, a norbornyl group and an adamantyl group.

Examples of the linear or branched alkyl group of 1 to 4 carbon atoms include a methyl group, an ethyl group, a propyl group, an isopropyl group, an n-butyl group, an isobutyl group and a tert-butyl group.

When the plurality of $R^{51}$ each independently represents a linear or branched alkyl group of 1 to 4 carbon atoms, as a group represented by —$C(R^{51})_3$ in formula (A0-1-12), a tert-butyl group, a tert-pentyl group, a tert-hexyl group or the like can be used.

When one of the plurality of $R^{51}$ represents a linear or branched alkyl group of 1 to 4 carbon atoms and the remaining two $R^{51}$ each independently represents a linear or branched alkyl group of 1 to 4 carbon atoms or a monovalent aliphatic cyclic group of 4 to 20 carbon atoms, as a group represented by —$C(R^{51})_3$— in formula (A0-1-12), a 1-(1-adamantyl)-1-methylethyl group, a 1-(1-adamantyl)-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group or the like can be used.

When one of the plurality of $R^{51}$ represents a linear or branched alkyl group of 1 to 4 carbon atoms and the remaining two $R^{51}$ are bonded to each other to form a divalent aliphatic cyclic group of 4 to 20 carbon atoms together with the carbon atoms to which the two $R^{51}$ are bonded, as a group represented by —$C(R^{51})_3$— in formula (A0-1-12), a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group or the like can be used.

In the polymer compound (A1) of the present invention, as the structural unit (a0), one type of structural unit may be used alone, or two or more types of structural units may be used in combination.

Furthermore, the polymer compound (A1) of the present invention may be a polymer formed solely from one type of the structural unit (a0), namely, the proportion of the structural unit (a0) within the polymer compound (A1) is 100 mol %. The polymer compound (A1) may be a copolymer formed from two or more different types of structural units (a0), or a copolymer that also includes one or more other structural units.

In those cases where the polymer compound (A1) of the present invention is a copolymer that includes one or more other structural units besides the structural unit (a0), the proportion of the structural unit (a0) within the polymer compound (A1), relative to the combined total of all the structural units that constitute the polymer compound (A1), is preferably within a range from 10 to 80 mol %, more preferably from 15 to 80 mol %, still more preferably from 20 to 70 mol %, and most preferably from 20 to 60 mol %. By making this proportion of the structural unit (a0) at least as large as the lower limit of the above-mentioned range, a pattern can be formed easily using a resist composition prepared from the polymer compound (A1). On the other hand, by making the proportion of the structural unit (a0) not more than the upper limit of the above-mentioned range, a good balance can be achieved with the other structural units.

In those cases where the polymer compound (A1) of the present invention is a copolymer that includes one or more other structural units besides the structural unit (a0), examples of those other structural units include a structural unit (a1), structural unit (a2), structural unit (a3) and structural unit (a4) described below. Furthermore, examples of the structural unit (a3) include a structural unit (a'3) and a structural unit (a"3) described below.

Structural Unit (a1)

It is preferable that the polymer compound (A1) further include a structural unit (a1) derived from an acrylate ester containing an acid dissociable, dissolution inhibiting group.

In the present invention, when either one of, or both of $R^4$ and $R^5$ in the aforementioned general formula (a0-1) represents an acid dissociable, dissolution inhibiting group, the structural unit represented by this general formula (a0-1) falls within the category of the structural unit (a1), since the structural unit includes an acid dissociable, dissolution inhibiting group. However, such a structural unit is regarded as falling within the category of the structural unit (a0) rather than that of the structural unit (a1). In other words, the structural unit represented by general formula (a0-1) shown above is not included in the structural unit (a1).

The acid dissociable, dissolution inhibiting group within the structural unit (a1), during formation of a resist pattern when prepared as a resist composition, has an alkali dissolution-inhibiting effect that renders the entire polymer compound (A1) insoluble in an alkali developing solution prior to dissociation, and then following dissociation by the action of acid, increases the solubility of the entire polymer compound (A1) in the alkali developing solution. As the acid dissociable, dissolution inhibiting group, any of the groups that have been proposed as acid dissociable, dissolution inhibiting groups for the base resins of chemically amplified resists can be used. Generally, groups that form either a cyclic or chain-like tertiary alkyl ester with the carboxyl group of the (meth)acrylate ester, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples thereof include a tert-butyl group, a tert-pentyl group and a tert-heptyl group, and a tert-butyl group is particularly desirable.

The term "aliphatic cyclic group" refers to a monocyclic group or polycyclic group that has no aromaticity.

The "aliphatic cyclic group" within the structural unit (a1) preferably has 4 to 20 carbon atoms, and may or may not have a substituent. Examples of substituents include lower alkyl groups of 1 to 5 carbon atoms, a fluorine atom, fluorinated lower alkyl groups of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cyclic alkyl group can be mentioned. Specific examples include a 2-methyl-2-adamantyl group and a 2-ethyl-2-adamantyl group. Alternatively, groups having an aliphatic cyclic group such as an adamantyl group, and a branched alkylene group having a tertiary carbon atom bonded thereto, as in the group bonded to the oxygen atom of the carbonyloxy group (—C(O)—O—) in the structural units represented by general formula (a1") shown below, may also be used.

[Chemical Formula 5]

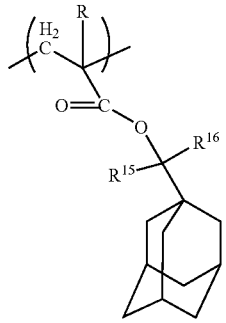

(a1")

wherein R represents a hydrogen atom, a halogen atom, a lower alkyl group or a halogenated lower alkyl group; and $R^{15}$ and $R^{16}$ each independently represents an alkyl group (which may be linear or branched, and preferably has 1 to 5 carbon atoms).

With respect to the structural unit represented by formula (a1"), examples of the halogen atoms for R (namely, the substituent at the α-position) include a fluorine atom, a chlorine atom, a bromine atom and an iodine atom. Examples of the lower alkyl group for R include linear or branched lower alkyl groups such as a methyl group, an ethyl group, a propyl group, an isopropyl group, an n-butyl group, an isobutyl group, a tert-butyl group, a pentyl group, an isopentyl group and a neopentyl group.

Examples of the halogenated lower alkyl group for R include groups in which a part or all of the hydrogen atoms of the aforementioned lower alkyl group have been substituted with halogen atoms. Examples of the halogen atom include a fluorine atom, a chlorine atom, a bromine atom and an iodine atom. R is preferably a hydrogen atom, a lower alkyl group or a halogenated lower alkyl group, more preferably a hydrogen atom, a lower alkyl group or a fluorinated lower alkyl group.

In terms of industrial availability, a hydrogen atom, a methyl group or a trifluoromethyl group is still more preferable, and a hydrogen atom or a methyl group is particularly desirable.

An "acetal-type acid dissociable, dissolution inhibiting group" generally substitutes a hydrogen atom at the terminal of an alkali-soluble group such as a carboxyl group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of the acetal-type acid dissociable, dissolution inhibiting groups include groups represented by general formula (p1) shown below.

[Chemical Formula 6]

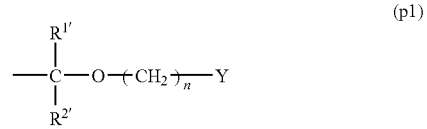

(p1)

wherein $R^{1'}$ and $R^{2'}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1'}$ and $R^{2'}$, the same as the lower alkyl groups for R in the formula (a1") above can be used. As the lower alkyl group for $R^{1'}$ and $R^{2'}$, a methyl group or an ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 7]

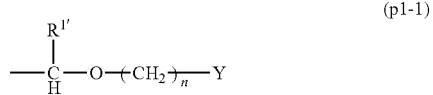

(p1-1)

wherein $R^{1'}$, n and Y are as defined above for $R^{1'}$, n and Y, respectively, in the aforementioned formula (a1").

As the lower alkyl group for Y, the same as the lower alkyl groups for R in the formula (a1") above can be used.

As the aliphatic cyclic group for Y, any of the aliphatic monocyclic or polycyclic groups which have been proposed for conventional ArF resists and the like can be appropriately selected for use. For example, the same groups as those described above in connection with the "aliphatic cyclic group" can be mentioned.

Further, as the acetal-type, acid dissociable, dissolution inhibiting group, groups represented by general formula (p2) shown below can also be mentioned.

[Chemical Formula 8]

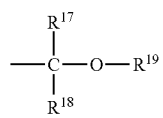

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is preferable that both of $R^{17}$ and $R^{18}$ be hydrogen atoms, or, either one of $R^{17}$ and $R^{18}$ be a hydrogen atom and the other be a methyl group. It is particularly desirable that both of $R^{17}$ and $R^{18}$ be hydrogen atoms.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, and which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one member selected from the group consisting of structural units represented by general formula (a1-0-1) shown below and structural units represented by general formula (a1-0-2) shown below.

[Chemical Formula 9]

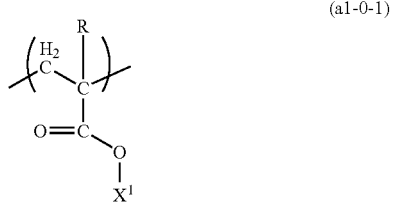

(a1-0-1)

wherein R represents a hydrogen atom, a lower alkyl group or a halogenated lower alkyl group; and $X^1$ represents an acid dissociable, dissolution inhibiting group.

[Chemical Formula 10]

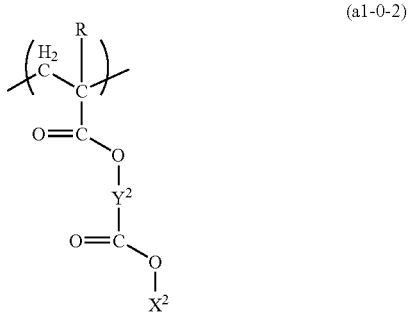

(a1-0-2)

wherein R represents a hydrogen atom, a lower alkyl group or a halogenated lower alkyl group; $X^2$ represents an acid dissociable, dissolution inhibiting group; and $Y^2$ represents an alkylene group or an aliphatic cyclic group.

In general formula (a1-0-1), the lower alkyl group and halogenated lower alkyl group for R are the same as the lower alkyl group and halogenated lower alkyl group which may be bonded to the α-position of the aforementioned acrylate ester. Specific examples of the lower alkyl group with respect to the above lower alkyl group and halogenated lower alkyl group include linear or branched lower alkyl groups such as a methyl group, an ethyl group, a propyl group, an isopropyl group, an n-butyl group, an isobutyl group, a tert-butyl group, a pentyl group, an isopentyl group and a neopentyl group.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups.

In general formula (a1-0-2), R is as defined for R in general formula (a1-0-1) above.

$X^2$ is the same as $X^1$ in general formula (a1-0-1).

$Y^2$ is preferably an alkylene group of 1 to 4 carbon atoms or a divalent aliphatic cyclic group. As the aliphatic cyclic group, the same groups as those exemplified above in connection with the explanation of the "aliphatic cyclic group" can be used, with the exception that two hydrogen atoms have been removed therefrom.

Specific examples of the structural unit (a1) include structural units represented by general formulas (a1-1) to (a1-4) shown below.

[Chemical Formula 11]

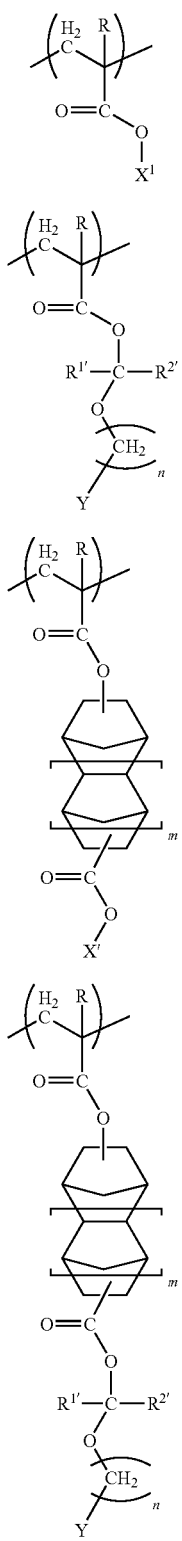

(a1-1)
(a1-2)
(a1-3)
(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents 0 or 1; R is as defined above; and each of $R^{1'}$ and $R^{2'}$ independently represents a hydrogen atom or a lower alkyl group of 1 to 5 carbon atoms.

It is preferable that at least one of $R^{1'}$ and $R^{2'}$ represent a hydrogen atom, and it is more preferable that both of $R^{1'}$ and $R^{2'}$ represent a hydrogen atom. n is preferably 0 or 1.

Examples of the tertiary alkyl ester-type acid dissociable, dissolution inhibiting group for X' are the same as the above-exemplified tertiary alkyl ester-type acid dissociable, dissolution inhibiting groups for $X^1$.

Examples of the aliphatic cyclic group for Y are the same as those exemplified above in connection with the explanation of "aliphatic cyclic group".

Specific examples of structural units represented by the above-mentioned general formulas (a1-1) to (a1-4) are shown below.

[Chemical Formula 12]

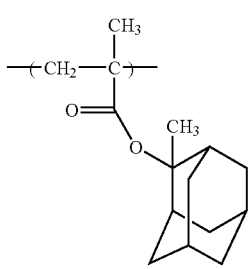

(a1-1-1)

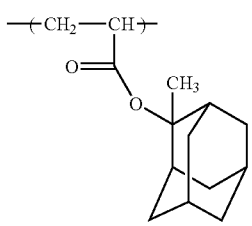

(a1-1-2)

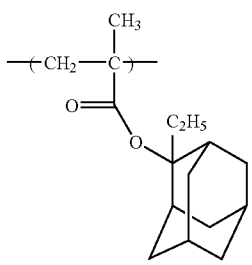

(a1-1-3)

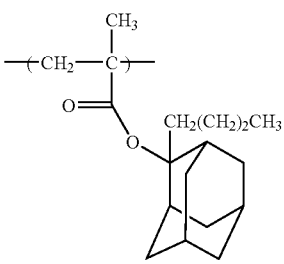

(a1-1-4)

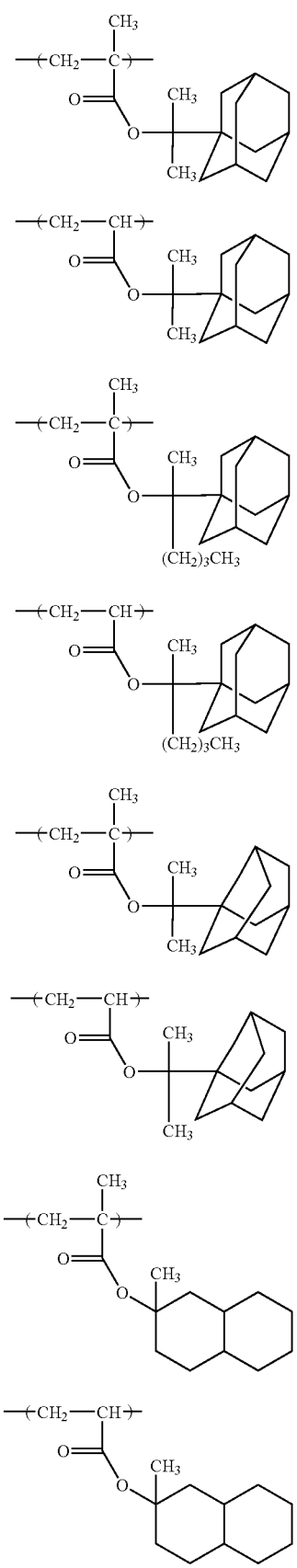
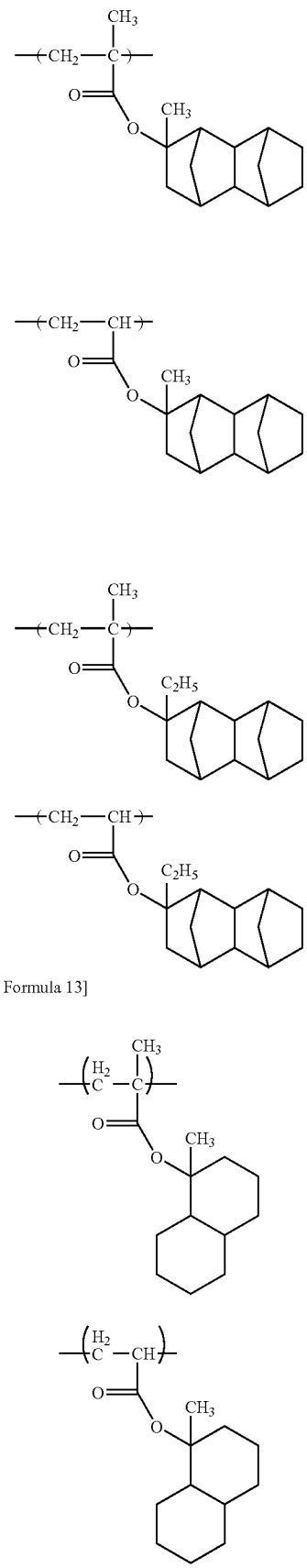
[Chemical Formula 13]

(a1-1-19)
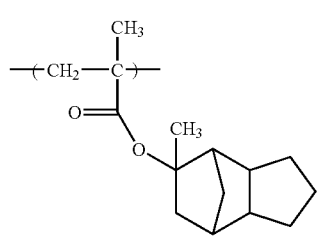
(a1-1-20)
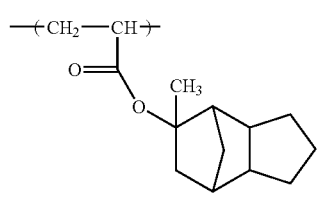
(a1-1-21)
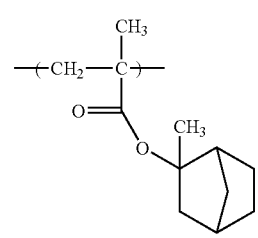
(a1-1-22)
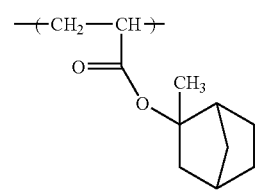
(a1-1-23)
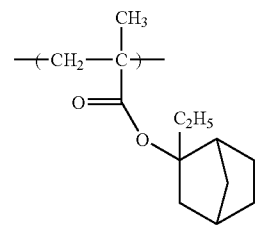
(a1-1-24)
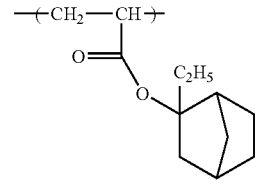
(a1-1-25)
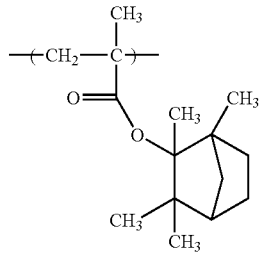
(a1-1-26)
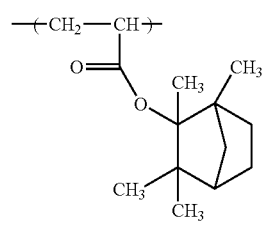
(a1-1-27)
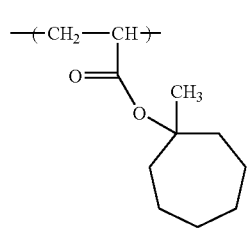
(a1-1-28)
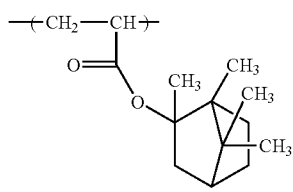
(a1-1-29)
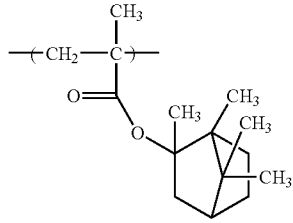
(a1-1-30)
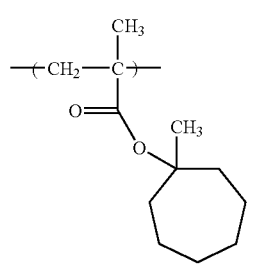
(a1-1-31)
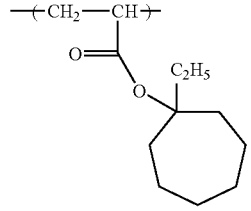
(a1-1-32)
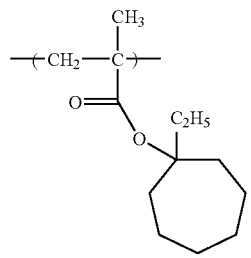

[Chemical Formula 14]
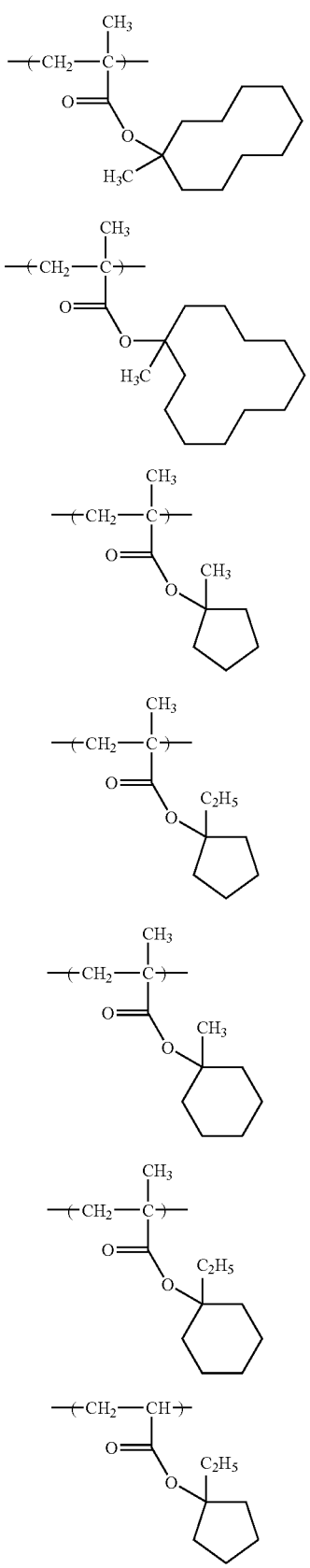
(a1-1-33)
(a1-1-34)
(a1-1-35)
(a1-1-36)
(a1-1-37)
(a1-1-38)
(a1-1-39)
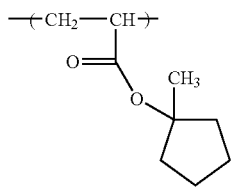
(a1-1-40)
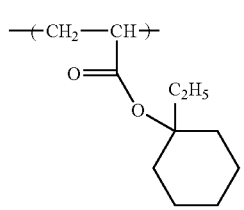
(a1-1-41)
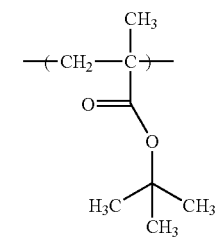
(a1-1-42)
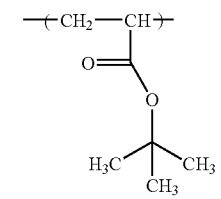
(a1-1-43)
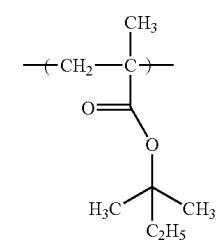
(a1-1-44)
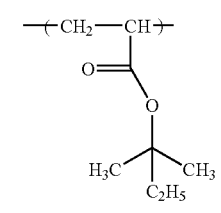
(a1-1-45)
[Chemical Formula 15]
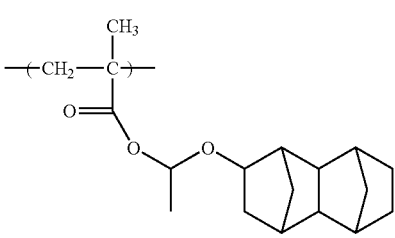
(a1-2-1)

(a1-2-2)
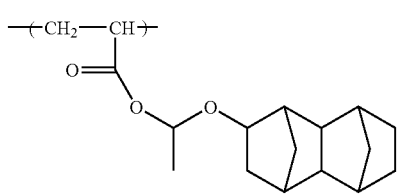
(a1-2-3)
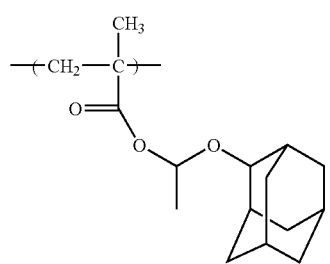
(a1-2-4)
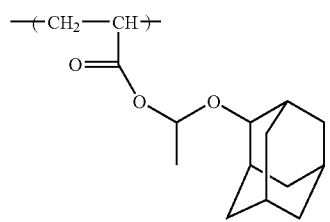
(a1-2-5)
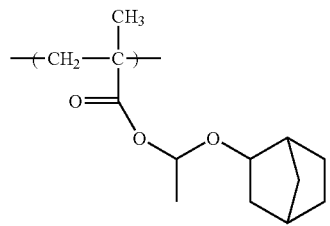
(a1-2-6)
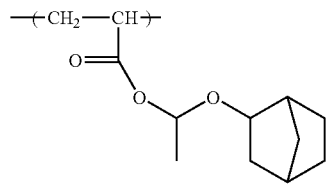
[Chemical Formula 16]
(a1-2-7)
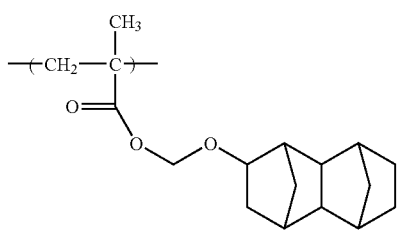
(a1-2-8)
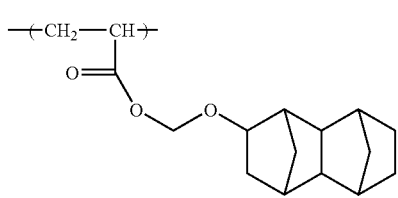
(a1-2-9)
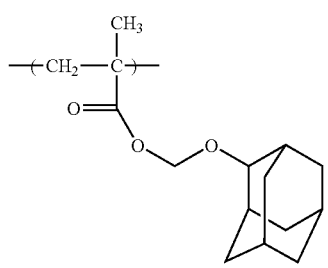
(a1-2-10)
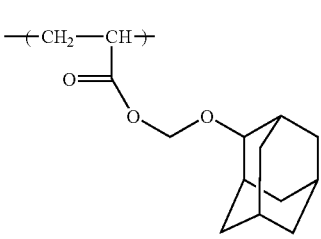
(a1-2-11)
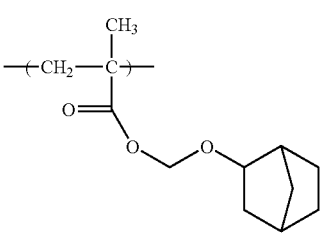
(a1-2-12)
(a1-2-13)
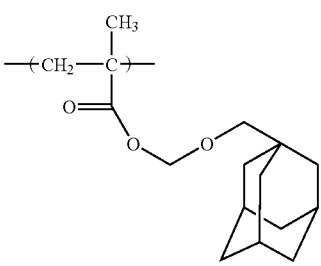
(a1-2-14)
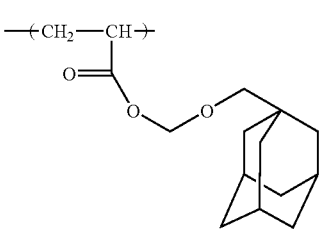
(a1-2-15)
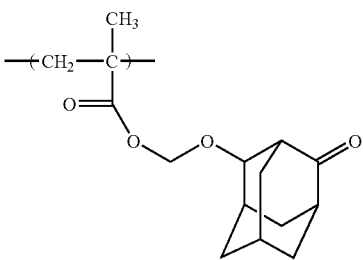

(a1-2-16)
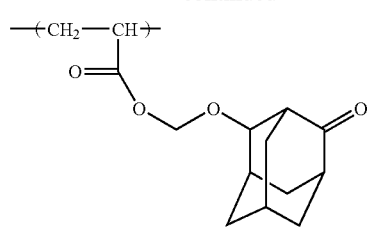
(a1-2-17)
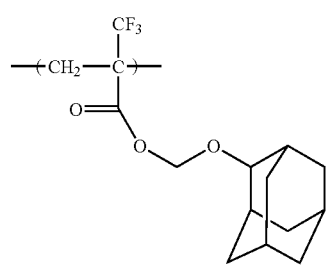
(a1-2-18)
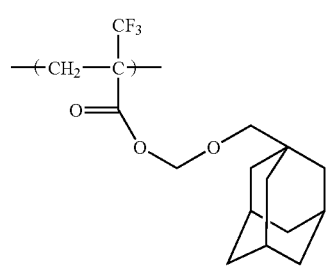
(a1-2-19)
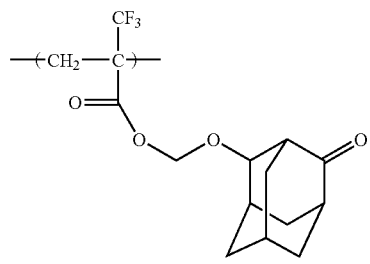
(a1-2-20)
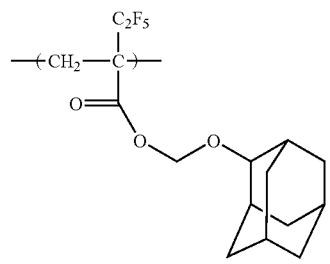
[Chemical Formula 17]
(a1-2-21)
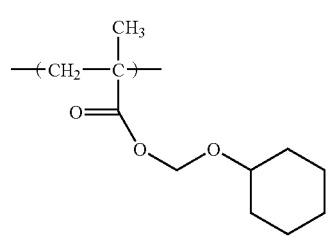
(a1-2-22)
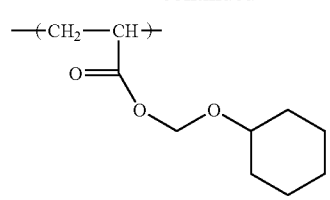
(a1-2-23)
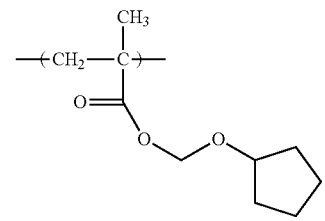
(a1-2-24)
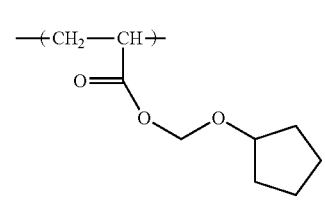
(a1-2-25)
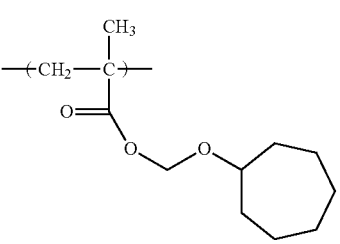
(a1-2-26)
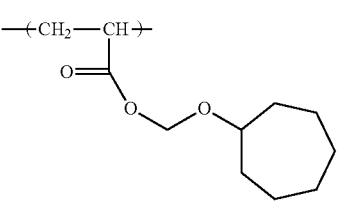
(a1-2-27)
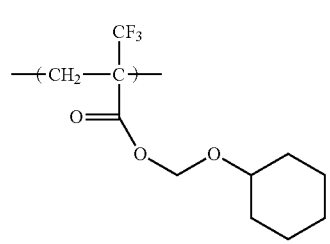
(a1-2-28)
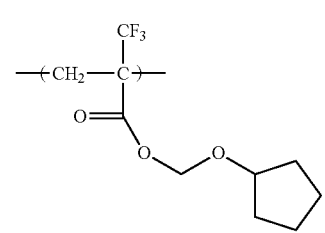

(a1-2-29) (a1-2-36)
(a1-2-30) (a1-2-37)
(a1-2-31) (a1-2-38)

[Chemical Formula 18]

(a1-2-32) (a1-2-39)

(a1-2-33)

[Chemical Formula 19]

(a1-2-34) (a1-3-1)

(a1-2-35)

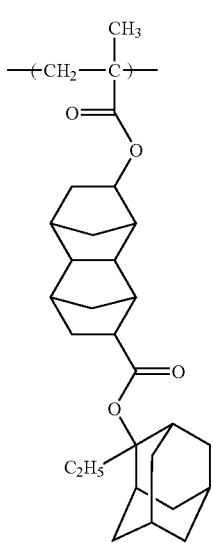
(a1-3-2)
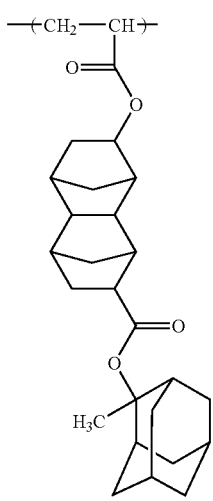
(a1-3-3)
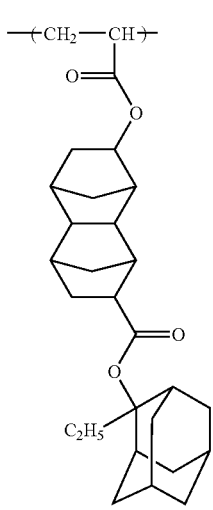
(a1-3-4)
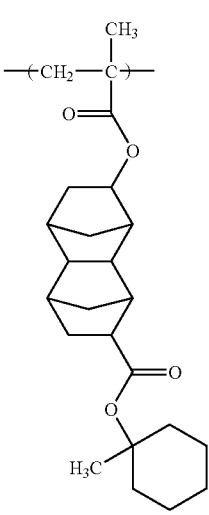
(a1-3-5)
(a1-3-6)
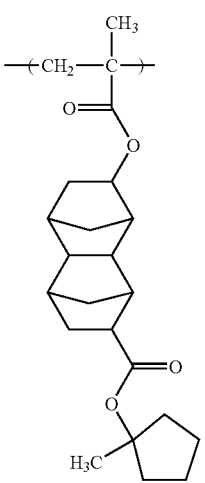
(a1-3-7)

(a1-3-8)
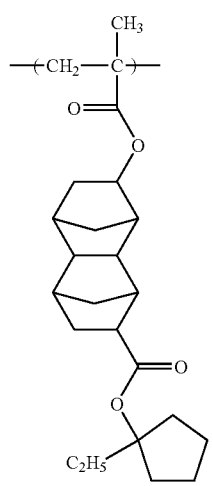
(a1-3-9)
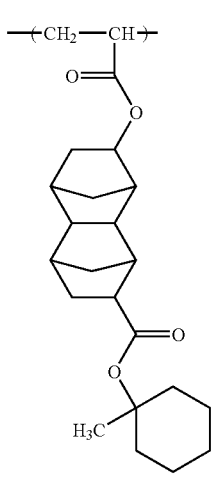
(a1-3-10)
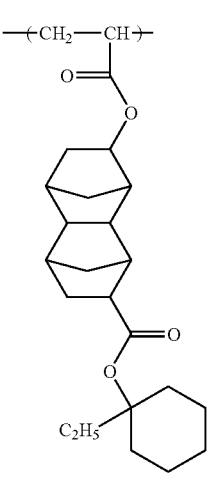
(a1-3-11)
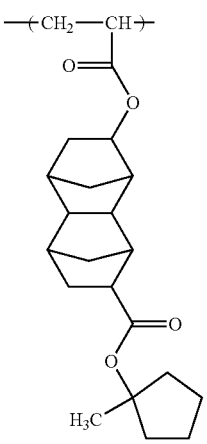
(a1-3-12)
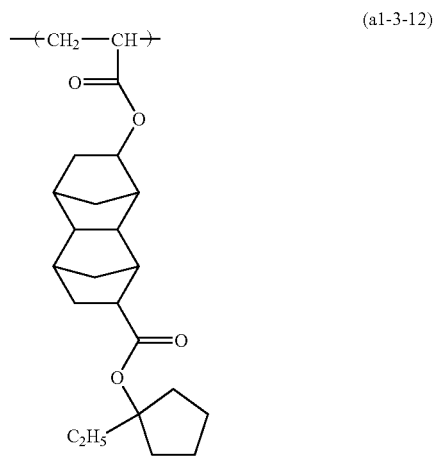
[Chemical Formula 20]
(a1-3-13)
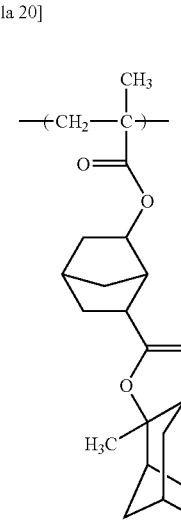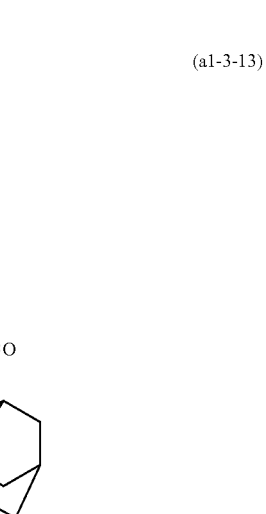

(a1-3-14)
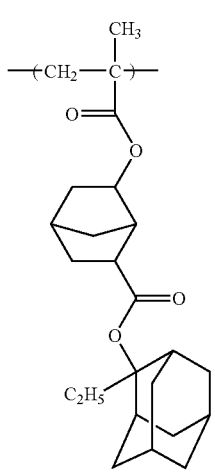
(a1-3-15)
(a1-3-16)
(a1-3-17)
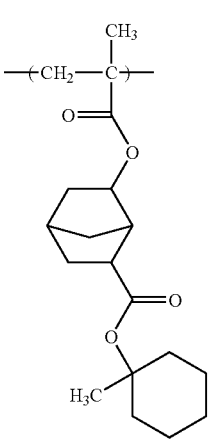
(a1-3-18)
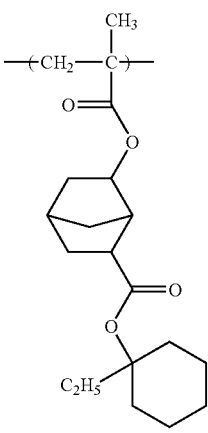
(a1-3-19)
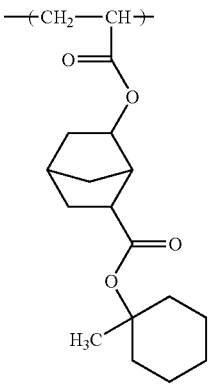
(a1-3-20)
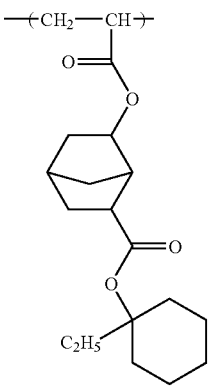

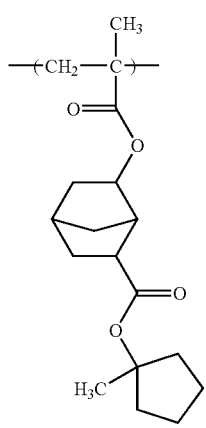
(a1-3-21)
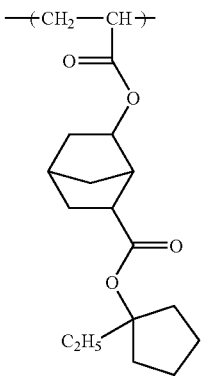
(a1-3-24)
[Chemical Formula 21]
(a1-3-22)
(a1-4-1)
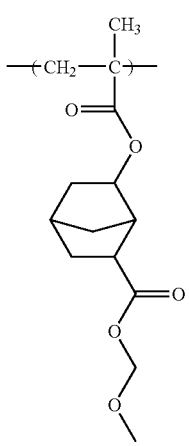
(a1-3-23)
(a1-4-2)
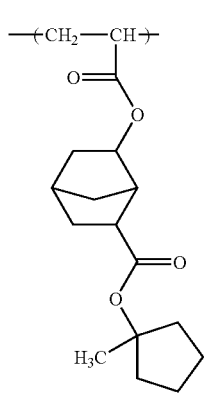

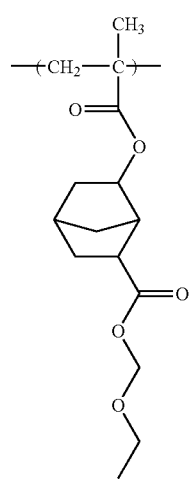
(a1-4-3)
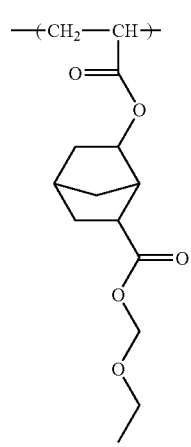
(a1-4-4)
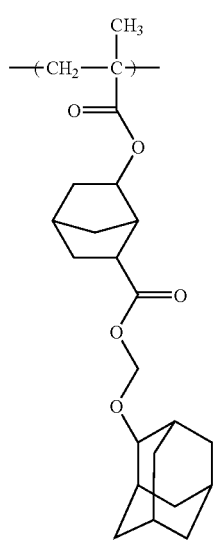
(a1-4-5)
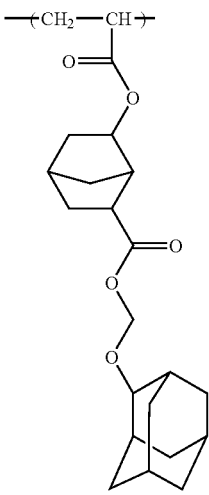
(a1-4-6)
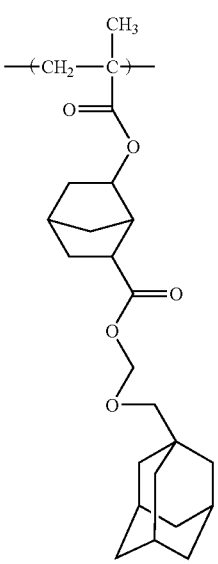
(a1-4-7)
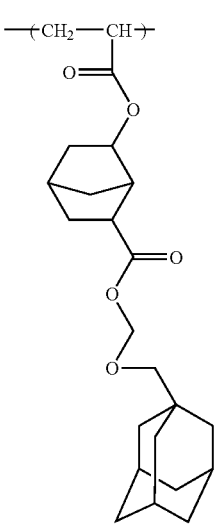
(a1-4-8)

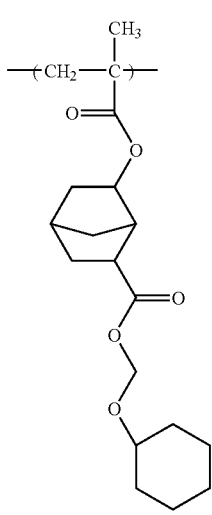 (a1-4-9)
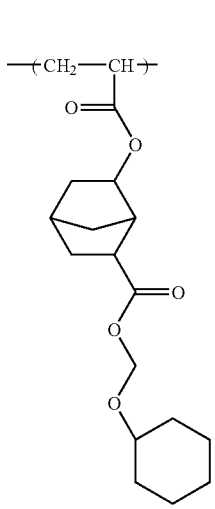 (a1-4-10)
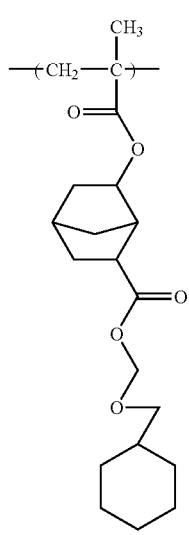 (a1-4-11)
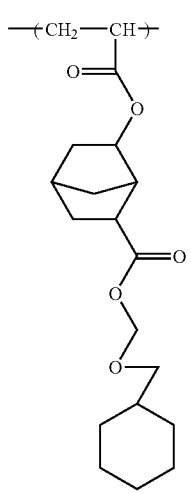 (a1-4-12)
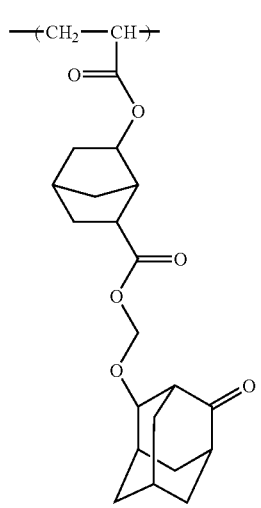 (a1-4-13)
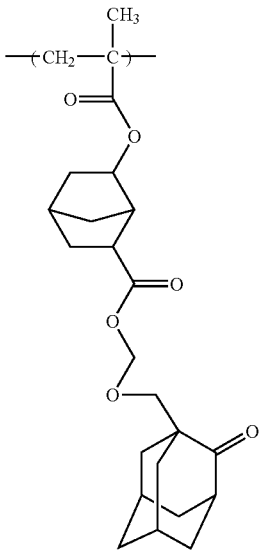 (a1-4-14)

-continued
(a1-4-15)
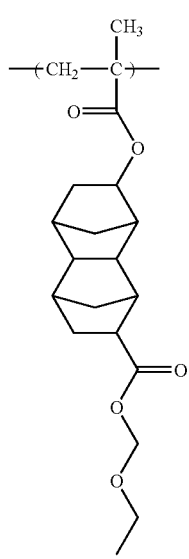
[Chemical Formula 22]
(a1-4-16)
(a1-4-17)
-continued
(a1-4-18)
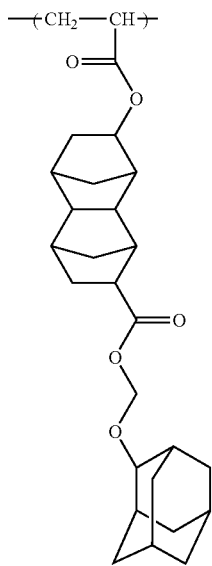
(a1-4-19)
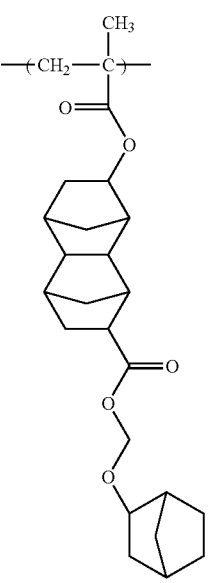
(a1-4-20)
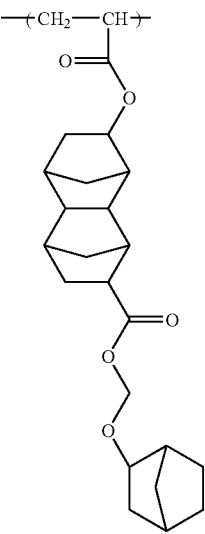

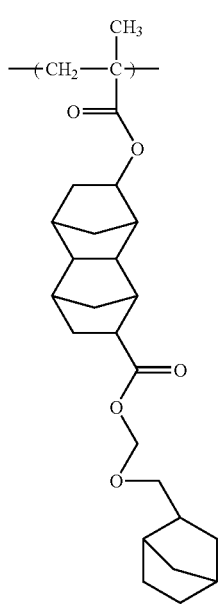
(a1-4-21)
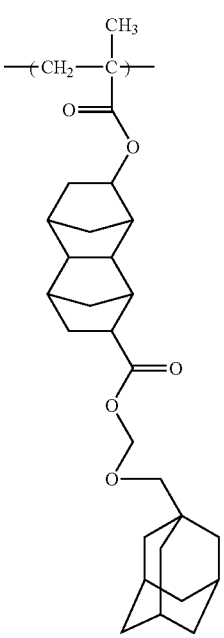
(a1-4-23)
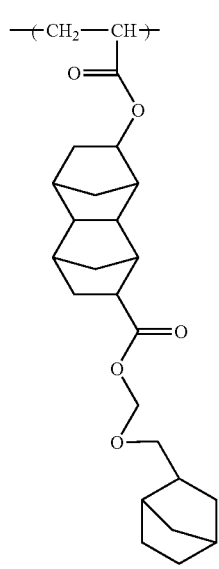
(a1-4-22)
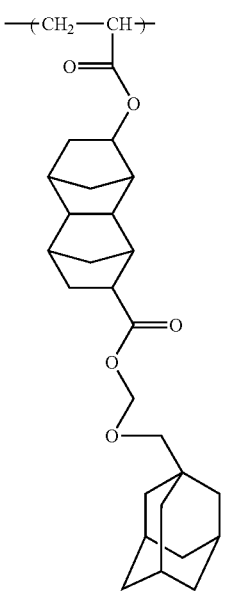
(a1-4-24)

(a1-4-25)

(a1-4-26)

(a1-4-27)

(a1-4-28)

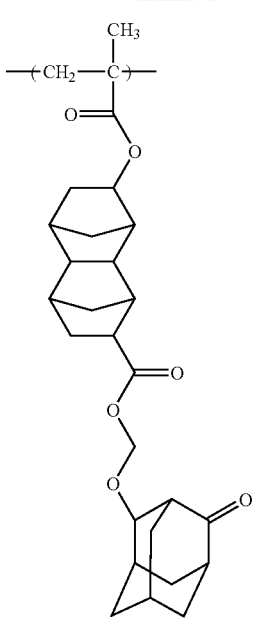

(a1-4-29)

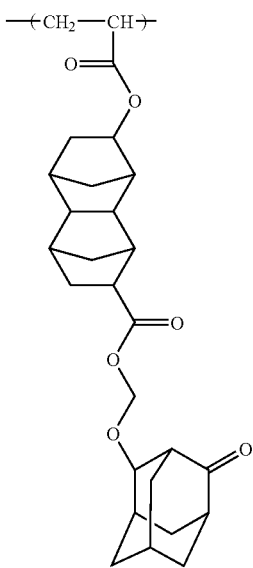

(a1-4-30)

In the polymer compound (A1), as the structural unit (a1), one type of structural unit may be used alone, or two or more types of structural units may be used in combination.

Among these, structural units represented by general formula (a1-1) are preferable. More specifically, at least one structural unit selected from the group consisting of structural units represented by formulas (a1-1-1) to (a-1-6) and (a1-1-35) to (a1-1-41) is more preferable.

Further, as the structural unit (a1), structural units represented by general formula (a1-1-01) shown below, which includes the structural units represented by formulas (a1-1-1) to (a1-1-4), and structural units represented by general formula (a1-1-02) shown below, which includes the structural units represented by formulas (a1-1-35) to (a1-1-41), are also preferable.

[Chemical Formula 23]

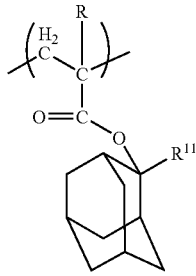

(a1-1-01)

wherein R represents a hydrogen atom, a lower alkyl group or a halogenated lower alkyl group; and $R^{11}$ represents a lower alkyl group.

[Chemical Formula 24]

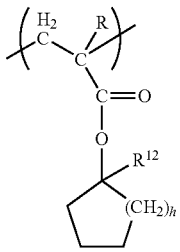

(a1-1-02)

wherein R represents a hydrogen atom, a lower alkyl group or a halogenated lower alkyl group; $R^{12}$ represents a lower alkyl group; and h represents an integer of 1 to 3.

In general formula (a1-1-01), R is as defined for R in general formula (a1-0-1) shown above. The lower alkyl group for $R^{11}$ is the same as the lower alkyl group for R above, and is preferably a methyl group or an ethyl group.

In general formula (a1-1-02), R is as defined for R in general formula (a1-0-1) shown above. The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

In the polymer compound (A1), the amount of the structural unit (a1) based on the combined total of all structural units constituting the polymer compound (A1) is preferably 5 to 70 mol %, more preferably 20 to 70 mol %, and still more preferably 25 to 55 mol %. By making the amount of the structural unit (a1) at least as large as the lower limit of the above-mentioned range, a pattern can be easily formed using a resist composition prepared from the polymer compound (A1). On the other hand, by making the amount of the structural unit (a1) no more than the upper limit of the above-mentioned range, a good balance can be achieved with the other structural units.

Structural Unit (a2)

In the present invention, in addition to the structural unit (a0), or in addition to the structural units (a0) and (a1), the polymer compound (A1) may further include a structural unit (a2) derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the polymer compound (A1) is used for forming a resist film, the lactone-containing cyclic group of the structural unit (a2) is effective in improving the adhesion between the resist film and the substrate, and increasing the compatibility with an alkali developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 25]

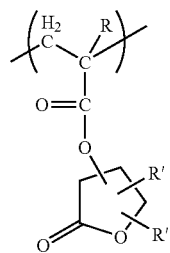

(a2-1)

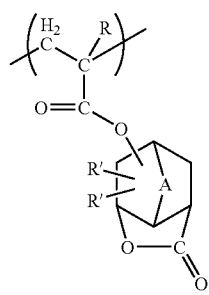

(a2-2)

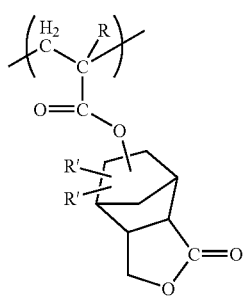

(a2-3)

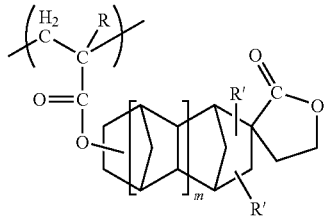

(a2-4)

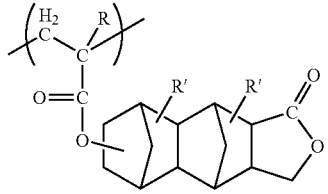

(a2-5)

wherein R represents a hydrogen atom, a lower alkyl group or a halogenated lower alkyl group; R' represents a hydrogen atom, a lower alkyl group or an alkoxy group of 1 to 5 carbon atoms; m represents an integer of 0 or 1; and A represents an alkylene group of 1 to 5 carbon atoms or an oxygen atom.

In general formulas (a2-1) to (a2-5), R is the same as R in the structural unit (a1).

The lower alkyl group for R' is the same as the lower alkyl group for R in general formula (a1-0-1) shown above.

Specific examples of alkylene groups of 1 to 5 carbon atoms for A include a methylene group, an ethylene group, an n-propylene group and an isopropylene group.

In the structural units represented by general formulas (a2-1) to (a2-5), in consideration of industrial availability, R' is preferably a hydrogen atom.

Specific examples of structural units represented by general formulas (a2-1) to (a2-5) above are shown below.

[Chemical Formula 26]

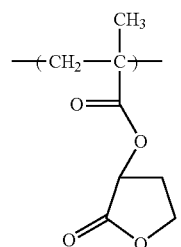

(a2-1-1)

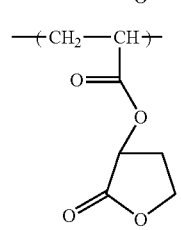

(a2-1-2)

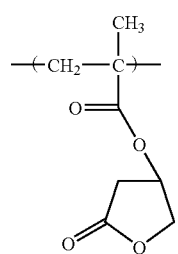 (a2-1-3)
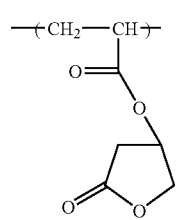 (a2-1-4)
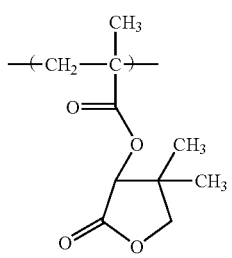 (a2-1-5)
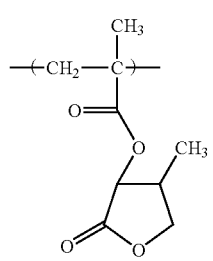 (a2-1-6)
[Chemical Formula 27]
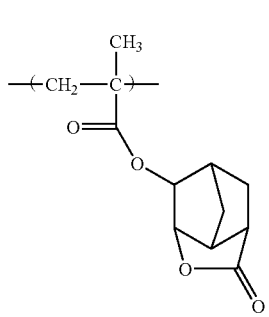 (a2-2-1)
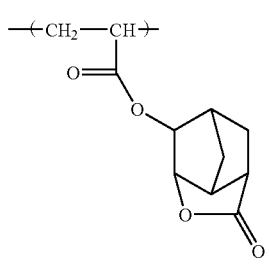 (a2-2-2)
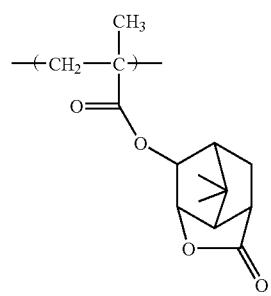 (a2-2-3)
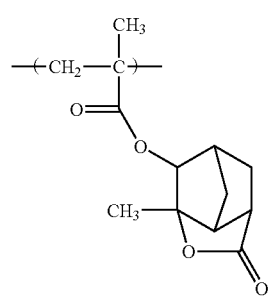 (a2-2-4)
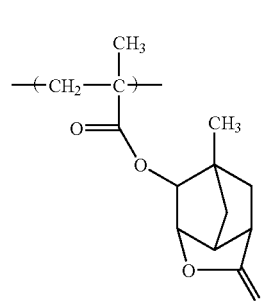 (a2-2-5)
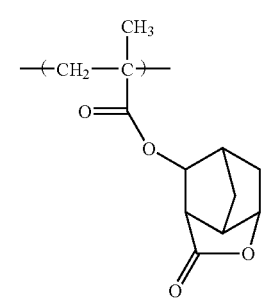 (a2-2-6)
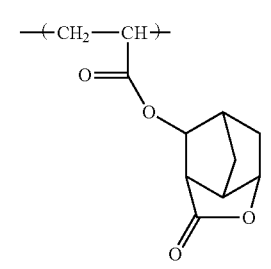 (a2-2-7)

-continued
(a2-2-8)
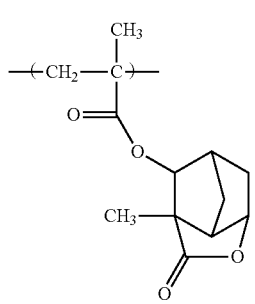
(a2-2-9)
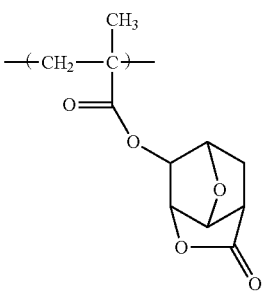
(a2-2-10)
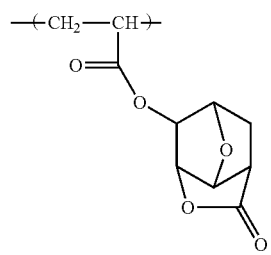
[Chemical Formula 28]
(a2-3-1)
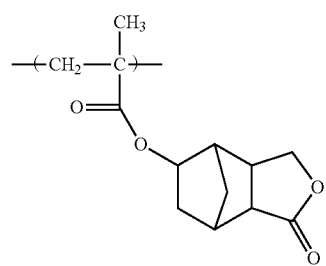
(a2-3-2)
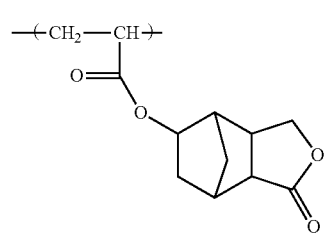
(a2-3-3)
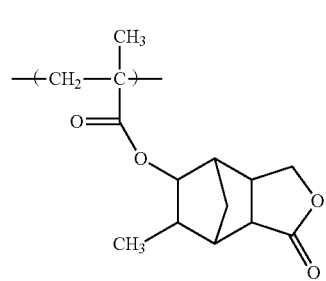
-continued
(a2-3-4)
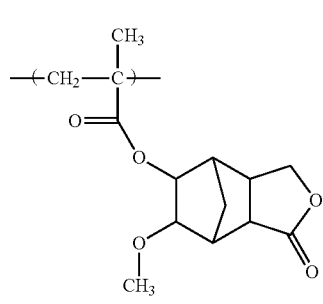
(a2-3-5)
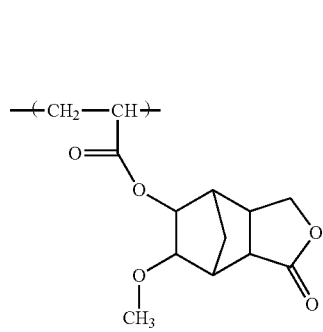
(a2-3-6)
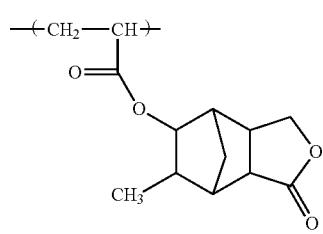
(a2-3-7)
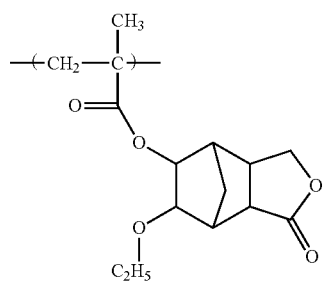
(a2-3-8)
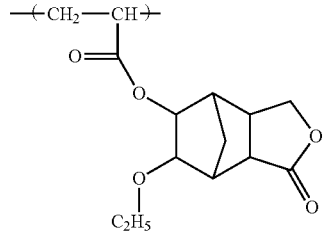
(a2-3-9)
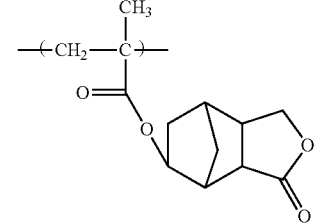

(a2-3-10)
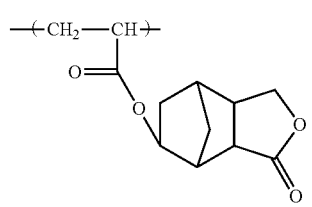
[Chemical Formula 29]
(a2-4-1)
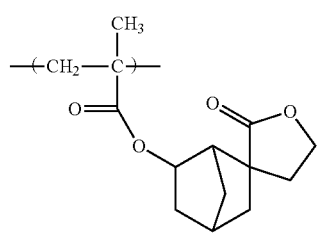
(a2-4-2)
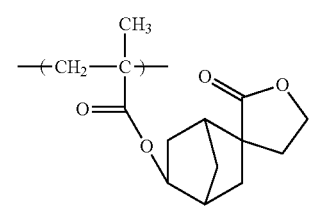
(a2-4-3)
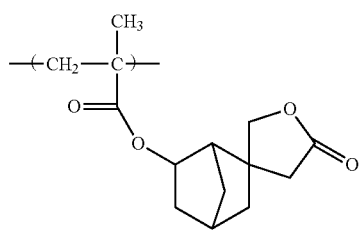
(a2-4-4)
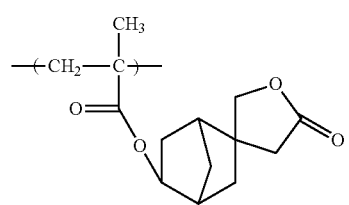
(a2-4-5)
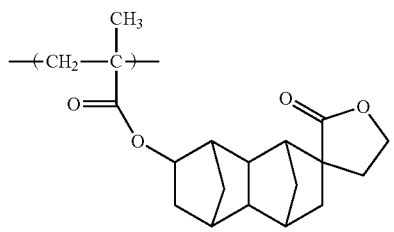
(a2-4-6)
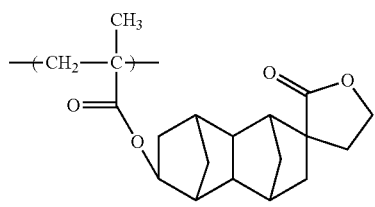
(a2-4-7)
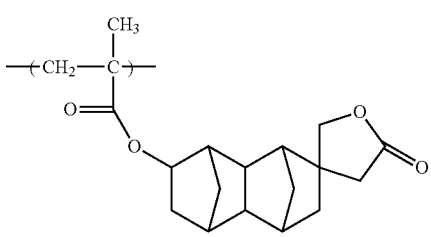
(a2-4-8)
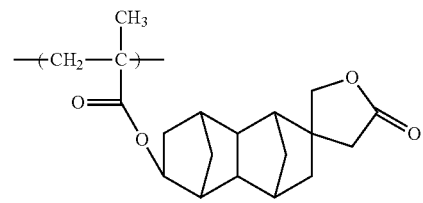
(a2-4-9)
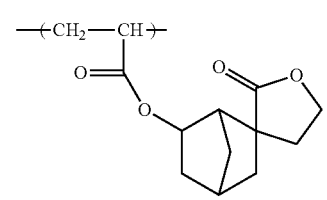
(a2-4-10)
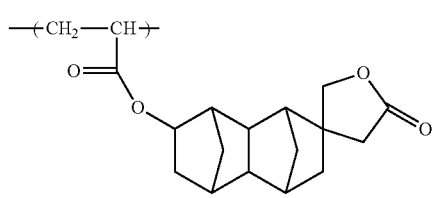
(a2-4-11)
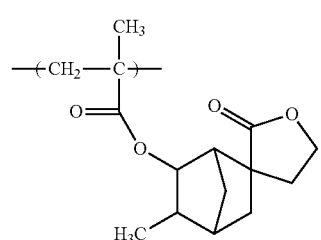
(a2-4-12)
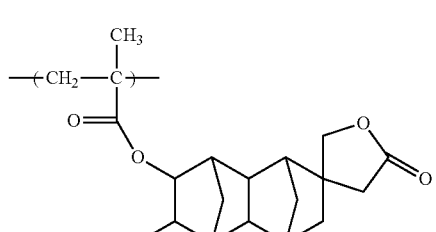
[Chemical Formula 30]
(a2-5-1)
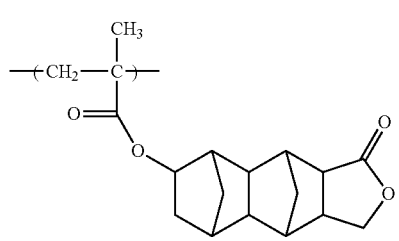

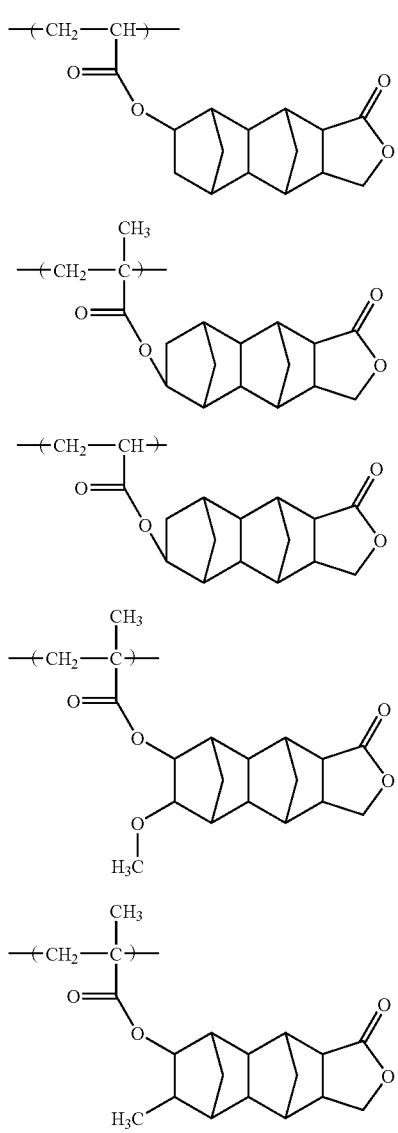

Of these, at least one structural unit selected from the group consisting of structural units represented by formulas (a2-1) to (a2-5) is preferable, and at least one structural unit selected from the group consisting of structural units represented by formulas (a2-1) to (a2-3) is more preferable. Specifically, it is preferable to use at least one structural unit selected from the group consisting of structural units represented by formulas (a2-1-1), (a2-1-2), (a2-2-1), (a2-2-2), (a2-3-1), (a2-3-2), (a2-3-9) and (a2-3-10).

In the polymer compound (A1), as the structural unit (a2), one type of structural unit may be used alone, or two or more types of structural units may be used in combination.

The proportion of the structural unit (a2) within the polymer compound (A1), relative to the combined total of all the structural units that constitute the polymer compound (A1), is preferably within a range from 1 to 60 mol %, more preferably from 10 to 55 mol %, and still more preferably from 20 to 55 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

It is preferable that the polymer compound (A1) further include a structural unit (a3) that is outside the definition of the structural unit (a0), and is derived from an acrylate ester that contains a polar group-containing aliphatic hydrocarbon group.

By including the structural unit (a3), the hydrophilicity of the polymer compound (A1) is improved, and hence, the compatibility of the polymer compound (A1) with the developing solution (alkali aqueous solution) is improved in those cases where a positive resist pattern is formed using the polymer compound (A1) as the resin component (A) of the positive resist composition, resulting in improved solubility of the exposed portions in the alkali developing solution, which contributes to a favorable improvement in the resolution. Furthermore, in those cases where a negative resist pattern is formed using the polymer compound (A1) as the resin component (A) of the negative resist composition, then as described below in relation to structural units (a'3) and (a''3), including the structural unit (a3) contributes to improvements in the crosslinking reactivity and the residual film properties.

Examples of the polar group include a hydroxyl group, a cyano group, a carboxyl group, or a hydroxyalkyl group in which a part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and monocyclic aliphatic hydrocarbon groups or polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 5 to 30 carbon atoms.

Of the various possibilities, structural units derived from an acrylate ester that include an aliphatic polycyclic group that contains a hydroxyl group, a cyano group, a carboxyl group or a hydroxyalkyl group in which a part of the hydrogen atoms of the alkyl group have been substituted with fluorine atoms are particularly desirable. Examples of the polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 31]

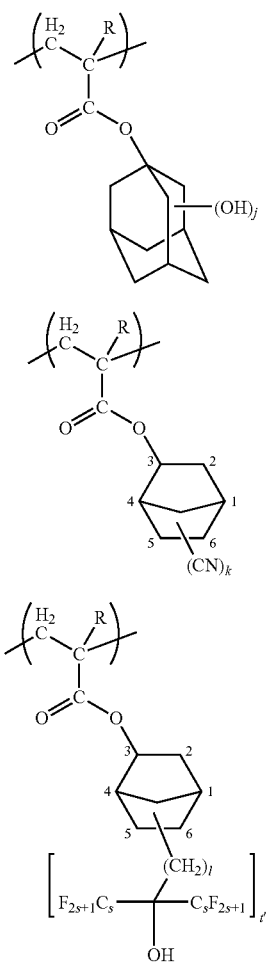

(a3-1)

(a-3-2)

(a3-3)

wherein R is as defined above for R in the aforementioned general formula (a1-0-1); j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbonyl group.

In formula (a3-3), t' is preferably 1, l is preferably 1 and s is preferably 1. Further, in formula (a3-3), it is preferable that a 2-norbonyl group or 3-norbonyl group be bonded to the terminal of the carboxyl group of the acrylic acid. The fluorinated alkyl alcohol is preferably bonded to the 5th or 6th position of the norbonyl group.

In the polymer compound (A1), as the structural unit (a3), one type of structural unit may be used alone, or two or more types of structural units may be used in combination.

In those cases where the polymer compound (A1) is used in a positive resist composition, in the polymer compound (A1), the amount of the structural unit (a3) based on the combined total of all structural units constituting the polymer compound (A1) is preferably 5 to 50 mol %, more preferably 5 to 40 mol %, and still more preferably 5 to 25 mol %.

In those cases where the polymer compound (A1) is used in a negative resist composition, in the polymer compound (A1), the amount of the structural unit (a3) based on the combined total of all structural units constituting the polymer compound (A1) is preferably 5 to 80 mol %, more preferably 10 to 70 mol %, and still more preferably 20 to 65 mol %.

In those cases where the polymer compound (A1) is used in a negative resist composition, it is more preferable that the structural unit (a3) be a "structural unit (a'3) derived from an acrylate ester containing a hydroxyl group-containing aliphatic cyclic group", and/or a "structural unit (a"3) derived from an acrylic acid that has no cyclic structure and has an alcoholic hydroxyl group on a side chain".

Structural Unit (a'3)

The structural unit (a'3) is a structural unit derived from an acrylate ester containing a hydroxyl group-containing aliphatic cyclic group.

When the polymer compound (A1) that includes the structural unit (a'3) is blended into a negative resist composition, the hydroxyl group (the alcoholic hydroxyl group) of this structural unit (a'3) reacts with a cross-linking agent (C) under the action of the acid generated from the acid-generator component (B), and this reaction causes the polymer compound (A1) to change from a state that is soluble in an alkali developing solution to a state that is insoluble.

The expression "hydroxyl group-containing aliphatic cyclic group" describes a group in which a hydroxyl group is bonded to an aliphatic cyclic group. The hydroxyl group may be bonded directly to an aliphatic ring, or may be bonded indirectly as a hydroxyalkyl group.

The number of hydroxyl groups bonded to the aliphatic cyclic group is preferably within a range from 1 to 3, and is most preferably 1.

The aliphatic cyclic group may or may not have a substituent. Examples of substituents include a lower alkyl group of 1 to 5 carbon atoms, a fluorine atom, a fluorinated lower alkyl group of 1 to 5 carbon atoms which is substituted with a fluorine atom, and an oxygen atom (=O).

The aliphatic cyclic group includes both hydrocarbon groups formed solely from carbon and hydrogen (alicyclic groups), and heterocyclic groups in which a portion of the carbon atoms that constitute the ring structure of an alicyclic group have been substituted with a hetero atom such as an oxygen atom, a nitrogen atom, or a sulfur atom. An alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The aliphatic cyclic group may be either a monocyclic group or a polycyclic group, but is preferably a polycyclic group. Further, an alicyclic hydrocarbon group is preferred. Furthermore, the group is preferably saturated. Moreover, the number of carbon atoms within the aliphatic cyclic group is preferably within a range from 5 to 30, and more preferably within a range from 5 to 15.

Specific examples of the aliphatic cyclic group (prior to bonding of the hydroxyl group) include the following.

Namely, examples of suitable monocyclic groups include groups in which two or more hydrogen atoms, including hydrogen atoms substituted with fluorinated hydroxyalkyl groups (this also applies below), have been removed from a monocycloalkane. Specific examples thereof include groups in which two ore more hydrogen atoms have been removed from cyclopentane or cyclohexane, and groups in which two hydrogen atoms have been removed from cyclohexane are preferable.

Examples of polycyclic groups include groups in which two or more hydrogen atoms have been removed from a bicycloalkane, a tricycloalkane, a tetracycloalkane or the like. Specific examples thereof include groups in which two or more hydrogen atoms have been removed from a polycycloalkane such as adamantane, norbornane, isobornane, tricyclodecane or tetracyclododecane.

These types of polycyclic groups can be selected appropriately from the multitude of groups proposed for forming acid dissociable, dissolution inhibiting groups for use within resins for positive resist compositions used within ArF excimer laser processes.

Of the various possibilities, groups in which two hydrogen atoms have been removed from cyclohexane, adamantane, norbornane or tetracyclododecane are readily available industrially, and are consequently preferred.

Of these monocyclic and polycyclic groups mentioned above, a group in which two hydrogen atoms have been removed from norbornane is particularly desirable.

As the aliphatic cyclic group of the structural unit (a'3), of the various possibilities described above, a cyclohexyl group, an adamantyl group, a norbornyl group, and a tetracyclododecanyl group are readily available industrially, and are consequently preferred. Of these, a cyclohexyl group or an adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a'3), the hydroxyl group-containing aliphatic cyclic group is preferably bonded to the oxygen atom at the terminal of the carbonyloxy group [—C(O)—O—] of the acrylate ester.

In such cases, in the structural unit (a'3), another substituent may be bonded to the α-position (the α-position carbon atom) of the acrylate ester instead of a hydrogen atom. Examples of preferred substituents include a lower alkyl group or a halogenated lower alkyl group. Of the various groups that can be bonded to the α-position, a hydrogen atom or a lower alkyl group is preferred, a hydrogen atom or a methyl group is even more preferred, and a hydrogen atom is the most desirable.

Specific examples of preferred structural units (a'3) include structural units represented by general formula (a'3-1) shown below.

[Chemical Formula 32]

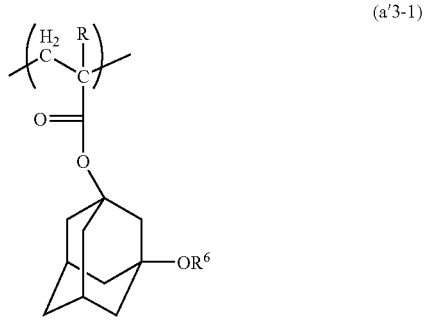

(a'3-1)

In the aforementioned general formula (a'3-1), R is as defined for R in general formula (a1-0-1) shown above.

$R^6$ represents an alkyl group having a hydroxyl group, or a hydrogen atom.

The alkyl group for $R^6$ is preferably a linear or branched alkyl group. Although there are no particular limitations on the number of carbon atoms within the alkyl group, the number of carbon atoms is preferably within a range from 1 to 5, more preferably from 1 to 4, and most preferably 2 or 3.

Although there are no particular limitations on the number of hydroxyl groups within the "alkyl group having a hydroxyl group", the number of hydroxyl groups is preferably within a range from 1 to 4, more preferably from 1 to 3, and most preferably 1 or 2. There are no particular limitations on the bonding positions of hydroxyl groups, although the hydroxyl groups are preferably bonded to the terminal of a main chain or side chain of the alkyl group, and more preferably bonded to the terminal of a main chain of the alkyl group. Although the hydroxyl group may be a tertiary hydroxyl group, a group that includes a secondary hydroxyl group is more preferable, and a group containing a primary hydroxyl group bonded to the terminal of an alkyl group is the most desirable.

In the present invention, $R^6$ is preferably a hydroxyalkyl group, a dihydroxyalkyl group or a hydrogen atom, and more preferably a hydroxymethyl group, a hydroxyethyl group, a hydroxypropyl group, a dihydroxypropyl group or a hydrogen atom.

In the polymer compound (A1), as the structural unit (a'3), one type of structural unit may be used alone, or two or more types of structural units may be used in combination.

The proportion of the structural unit (a'3) within the polymer compound (A1), relative to the combined total of all the structural units that constitute the polymer compound (A1), is preferably within a range from 5 to 80 mol %, more preferably from 10 to 70 mol %, and still more preferably from 20 to 65 mol %. Making this proportion at least as large as the lower limit of the above-mentioned range ensures that the effects obtained by including the structural unit (a'3) are achieved, whereas by making the proportion no more than the upper limit of the above-mentioned range, a good balance can be achieved with the other structural units.

Structural Unit (a''3)

The structural unit (a''3) is a structural unit derived from an acrylic acid that has no cyclic structure and has an alcoholic hydroxyl group on a side chain.

When the polymer compound (A1) that includes the structural unit (a''3) is blended into a negative resist composition, the alcoholic hydroxyl group of this structural unit (a''3) reacts with a cross-linking agent (C) under the action of the acid generated from the acid-generator component (B). Accordingly, the polymer compound (A1) changes more readily from a state that is soluble in an alkali developing solution to a state that is insoluble, which has the effect of improving the resolution. Further, thickness loss can also be suppressed. Furthermore, the controllability of the cross-linking reaction that occurs during pattern formation improves. Moreover, the film density also tends to increase. As a result, the heat resistance tends to improve. Moreover, the etching resistance also improves.

The expression "has no cyclic structure" means that the structural unit includes no aliphatic cyclic groups or aromatic groups. The structural unit (a''3) is readily distinguishable from the structural unit (a'3) as a result of having no cyclic structure.

Examples of structural units that have an alcoholic hydroxyl group on a side chain include structural units having a hydroxyalkyl group.

In the hydroxyalkyl group, the alkyl group is preferably a linear or branched alkyl group. Although there are no particular limitations on the number of carbon atoms within the alkyl group, the number of carbon atoms is preferably within a range from 1 to 20, more preferably from 4 to 16, and most preferably from 4 to 12. Although there are no particular limitations on the number of hydroxyl groups, the number of hydroxyl groups is preferably 1 or 2, and more preferably 1.

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group. In the structural unit (a"3), the hydroxyalkyl group preferably exists at either one, or both of these locations.

In those cases where the hydroxyalkyl group is not bonded to the α-position, the hydrogen atom at the α-position carbon atom may be replaced with an alkyl group or a halogenated alkyl group. These groups are as described above in relation to the group R within the aforementioned general formula (a1").

As the structural unit (a"3), structural units represented by general formula (a"3-1) shown below are preferred as such structural units yield superior effects for the present invention.

[Chemical Formula 33]

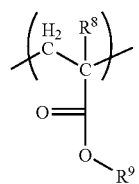

(a"3-1)

wherein $R^8$ represents a hydrogen atom, an alkyl group, a halogenated alkyl group or hydroxyalkyl group; and $R^9$ represents a hydrogen atom, an alkyl group or hydroxyalkyl group, with the proviso that at least one of $R^8$ and $R^9$ is a hydroxyalkyl group.

In the above formula (a"3-1), $R^8$ represents a hydrogen atom, an alkyl group, a halogenated alkyl group or hydroxyalkyl group.

The hydroxyalkyl group for $R^8$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or a hydroxyethyl group. There are no particular limitations on the number of hydroxyl groups or the bonding positions of those groups, although one hydroxyl group is typical. Further, although the hydroxyl group may be a tertiary hydroxyl group, a group that includes a secondary hydroxyl group is more preferable, and a group containing a primary hydroxyl group bonded to the terminal of an alkyl group is the most desirable.

The alkyl group for $R^8$ is preferably an alkyl group of not more than 10 carbon atoms, is more preferably an alkyl group of 1 to 8 carbon atoms, and is most preferably an ethyl group or a methyl group.

The halogenated alkyl group for $R^8$ is preferably a lower alkyl group of not more than 5 carbon atoms (most preferably an ethyl group or a methyl group) in which part or all of the hydrogen atoms have been substituted with halogen atoms (and preferably fluorine atoms).

$R^9$ represents a hydrogen atom, an alkyl group or hydroxyalkyl group.

Examples of the alkyl group and hydroxyalkyl group for $R^9$ include the same groups as the alkyl group and hydroxyalkyl group for $R^8$.

In the above general formula (a"3-1), at least one of $R^8$ and $R^9$ is a hydroxyalkyl group.

Specific examples of the structural unit represented by the aforementioned general formula (a"3-1) include structural units derived from a-(hydroxyalkyl)acrylic acids (not including structural units derived from acrylate esters), structural units derived from alkyl α-(hydroxyalkyl) acrylate esters, and structural units derived from hydroxyalkyl (α-alkyl)acrylate esters.

Of these, including a structural unit derived from an alkyl a-(hydroxyalkyl)acrylate ester as the structural unit (a"3) is preferred in terms of enhancing the effects of the structural unit (a3) described above and improving the film density. Of the various possibilities, structural units derived from ethyl a-(hydroxymethyl)acrylate or methyl α-(hydroxymethyl) acrylate are particularly desirable.

Furthermore, including a structural unit derived from a hydroxyalkyl (α-alkyl)acrylate ester as the structural unit (a"3) is preferred in terms of improving the crosslinking efficiency. Of such structural units, structural units derived from hydroxyethyl (meth)acrylate or hydroxymethyl (meth) acrylate are particularly desirable.

In the polymer compound (A1), as the structural unit (a"3), one type of structural unit may be used alone, or two or more types of structural units may be used in combination.

The proportion of the structural unit (a"3) within the polymer compound (A1), relative to the combined total of all the structural units that constitute the polymer compound (A1), is preferably within a range from 5 to 50 mol %, more preferably from 5 to 40 mol %, still more preferably from 5 to 30 mol %, and most preferably from 10 to 25 mol %. Making this proportion at least as large as the lower limit of the above-mentioned range ensures that the effects obtained by including the structural unit (a"3) are achieved, whereas by making the proportion no more than the upper limit of the above-mentioned range, a good balance can be achieved with the other structural units.

Structural Unit (a4)

It is preferable that the polymer compound (A1) further include a structural unit (a4) that is outside the definition of the structural units (a0) to (a3), and is derived from an acrylate ester that contains a non-acid-dissociable, aliphatic polycyclic group.

The expression "non-acid-dissociable" for the aliphatic polycyclic group within the structural unit (a4) means that even if the acid generated from the component (B) acts upon the structural unit, the aliphatic polycyclic group does not dissociate from the structural unit.

Examples of the aliphatic polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include structural units with structures represented by general formulas (a-4-1) to (a-4-5) shown below.

[Chemical Formula 34]

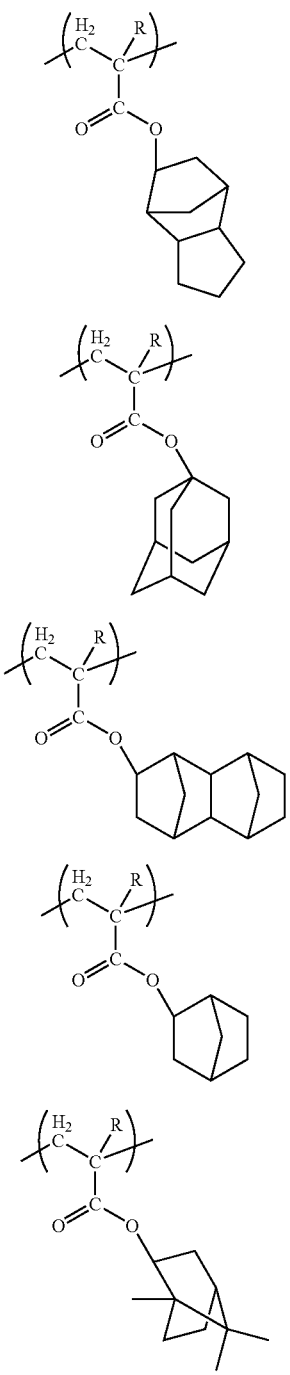

wherein R is as defined above for R in the aforementioned formula (a1-0-1).

In the polymer compound (A1), as the structural unit (a4), one type of structural unit may be used alone, or two or more types of structural units may be used in combination.

When the structural unit (a4) is included in the polymer compound (A1), the amount of the structural unit (a4) within the polymer compound (A1), relative to the combined total of all the structural units that constitute the polymer compound (A1), is preferably within a range from 1 to 50 mol %, more preferably from 5 to 45 mol %, and still more preferably from 10 to 45 mol %.

Structural Unit (a5)

The polymer compound (A1) may also include other structural units (a5) besides the aforementioned structural units (a0) to (a4), as long as the inclusion of these other structural units does not impair the effects of the present invention.

As the structural unit (a5), any other structural unit which cannot be classified as one of the above structural units (a0) to (a4) can be used without any particular limitations, and any of the multitude of conventional structural units used within resist resins for ArF excimer lasers or KrF excimer lasers (and particularly for ArF excimer lasers) can be used.

In the polymer compound (A1), as the structural unit (a5), one type of structural unit may be used alone, or two or more types of structural units may be used in combination.

In the present invention, the polymer compound (A1) may be a polymer composed solely of the structural unit (a0), but is preferably a copolymer having at least two types of structural units, including the structural units (a0) and (a1); a copolymer having at least two types of structural units, including the structural units (a0) and (a2); a copolymer having at least two types of structural units, including the structural units (a0) and (a3); a copolymer having at least three types of structural units, including the structural units (a0), (a1) and (a2); a copolymer having at least three types of structural units, including the structural unit (a0) and two types of the structural unit (a3); a copolymer having at least two types of structural units, including the structural units (a0) and (a4); or a copolymer having at least three types of structural units, including the structural units (a0), (a3) and (a4).

As the two types of the structural unit (a3) within the copolymer having at least three types of structural units, including the structural unit (a0) and two types of the structural unit (a3), for example, a combination of the structural units (a'3) and (a"3), a combination of the structural unit represented by formula (a3-1) and the structural unit (a'3), a combination of the structural unit represented by formula (a3-1) and the structural unit (a"3), and the like can be mentioned.

In the polymer compound (A1) of the present invention, preferred examples of the structural units include the following: as the copolymer having at least two types of structural units, including the structural units (a0) and (a1), copolymers (A1-11) having the structural units represented by general formula (A1-11) shown below and the like can be mentioned;

as the copolymer having at least two types of structural units, including the structural units (a0) and (a2), copolymers (A 1-12) having the structural units represented by general formula (A1-12) shown below, copolymers (A1-13) having the structural units represented by general formula (A1-13) shown below and the like can be mentioned;

as the copolymer having at least two types of structural units, including the structural units (a0) and (a3), copolymers (A1-14) having the structural units represented by general formula (A1-14) shown below, copolymers (A1-15) having the structural units represented by general formula (A1-15) shown below and the like can be mentioned;

as the copolymer having at least three types of structural units, including the structural units (a0), (a1) and (a2), copolymers (A1-16) having the structural units represented by general formula (A1-16) shown below, copolymers (A1-17) having the structural units represented by general formula (A1-17) shown below and the like can be mentioned;

as the copolymer having at least three types of structural units, including the structural unit (a0) and two types of the structural unit (a3), copolymers (A1-18) having the structural units represented by general formula (A1-18) shown below, copolymers (A1-19) having the structural units represented by general formula (A1-19) shown below and the like can be mentioned;

as the copolymer having at least two types of structural units, including the structural units (a0) and (a4), copolymers (A1-20) having the structural units represented by general formula (A1-20) shown below and the like can be mentioned; and as the copolymer having at least three types of structural units, including the structural units (a0), (a3) and (a4), copolymers (A1-21) having the structural units represented by general formula (A1-21) shown below and the like can be mentioned.

[Chemical Formula 35]

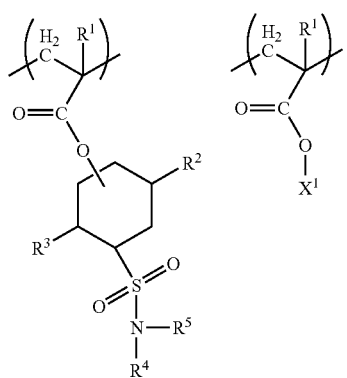

(A1-11)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); and R and $X^1$ are as defined above for R and $X^1$, respectively, in the aforementioned formula (a1-0-1).

[Chemical Formula 36]

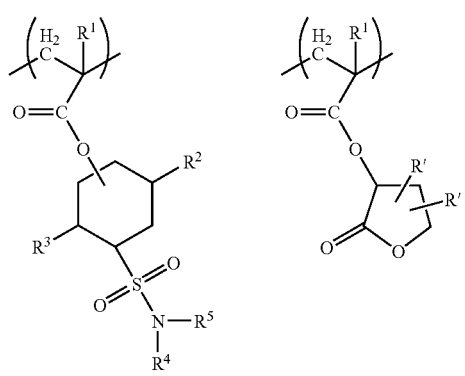

(A1-12)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); and R and R' are as defined above for R and R', respectively, in the aforementioned formula (a2-1).

[Chemical Formula 37]

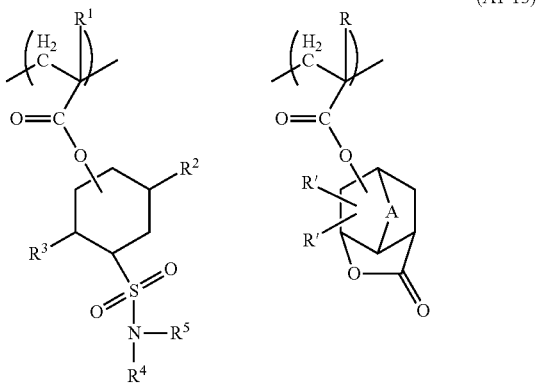

(A1-13)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); and R, R' and A are as defined above for R, R' and A, respectively, in the aforementioned formula (a2-2).

[Chemical Formula 38]

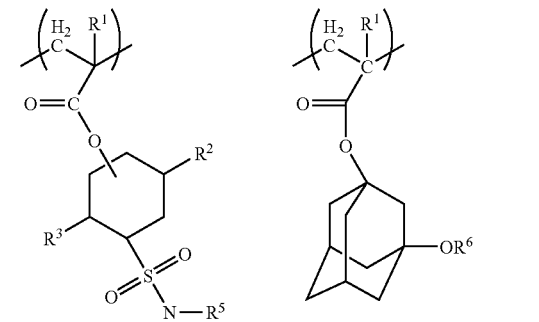

(A1-14)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); and R and $R^6$ are as defined above for R and $R^6$, respectively, in the aforementioned formula (a'3-1).

[Chemical Formula 39]

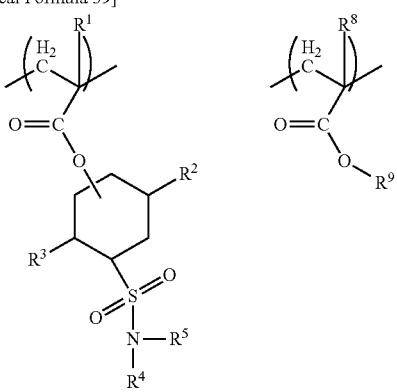

(A1-15)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); and $R^8$ and $R^9$ are as defined above for $R^8$ and $R^9$, respectively, in the aforementioned formula (a''3-1).

[Chemical Formula 40]

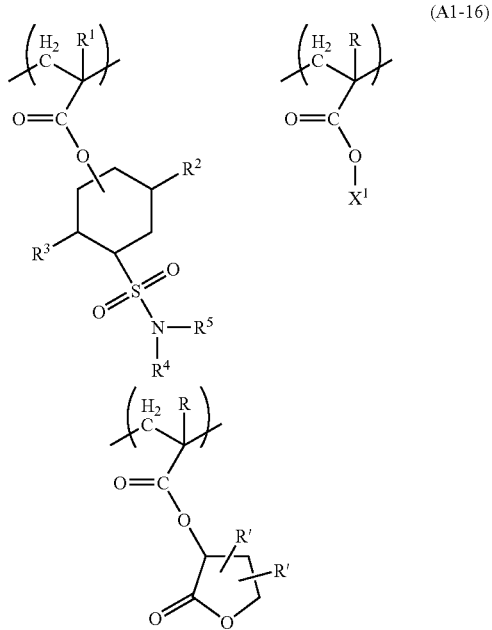

(A1-16)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); R and $X^1$ are as defined above for R and $X^1$, respectively, in the aforementioned formula (a1-0-1); R and R' are as defined above for R and R', respectively, in the aforementioned formula (a2-1); and the plurality of R may be the same or different.

[Chemical Formula 41]

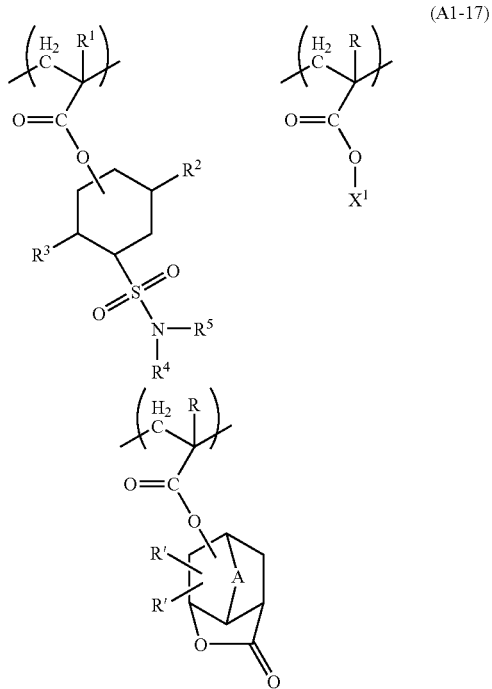

(A1-17)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); R and $X^1$ are as defined above for R and $X^1$, respectively, in the aforementioned formula (a1-0-1); R' and A are as defined above for R' and A, respectively, in the aforementioned formula (a2-2); and the plurality of R may be the same or different.

[Chemical Formula 42]

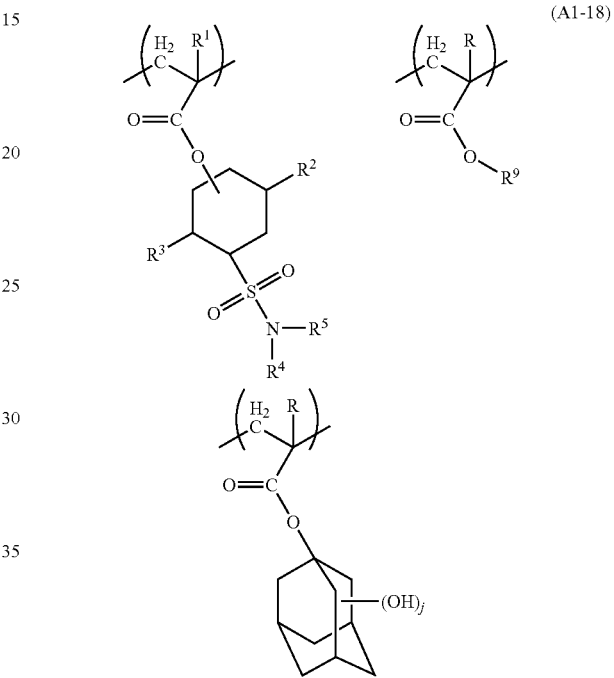

(A1-18)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); $R^8$ and $R^9$ are as defined above for $R^8$ and $R^9$, respectively, in the aforementioned formula (a''3-1); and R and j are as defined above for R and j, respectively, in the aforementioned formula (a3-1).

[Chemical Formula 43]

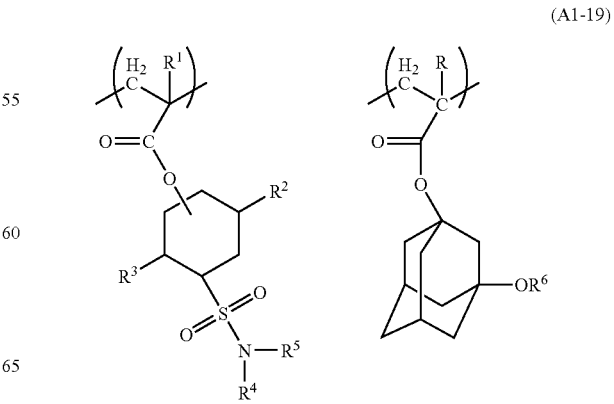

(A1-19)

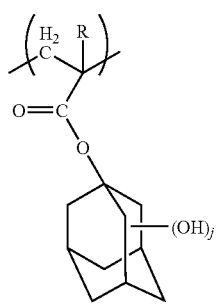

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); R and j are as defined above for R and j, respectively, in the aforementioned formula (a3-1); $R^6$ is the "alkyl group having a hydroxyl group" amongst those defined above for $R^6$ in the aforementioned formula (a'3-1); and the plurality of R may be the same or different.

[Chemical Formula 44]

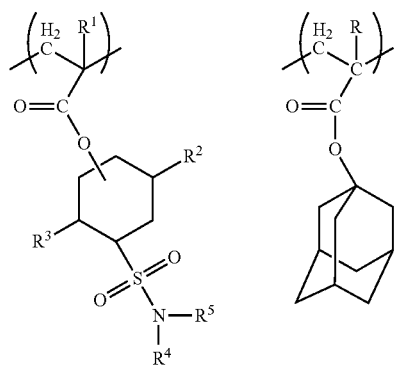

(A1-20)

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); and R is as defined above for R in the aforementioned formula (a-4-2).

[Chemical Formula 45]

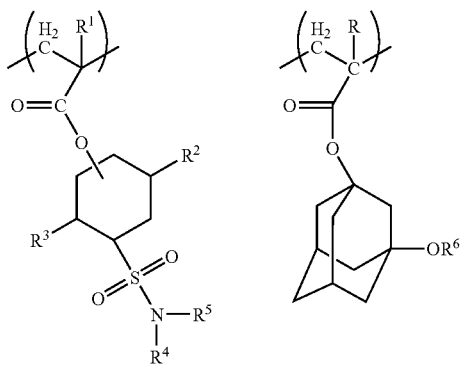

(A1-21)

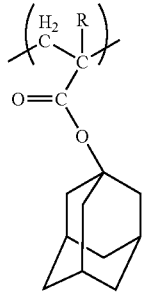

wherein $R^1$, $R^2$, $R^3$, $R^4$ and $R^5$ are as defined above for $R^1$, $R^2$, $R^3$, $R^4$ and $R^5$, respectively, in the aforementioned formula (a0-1); $R^6$ is the "alkyl group having a hydroxyl group" amongst those defined above for $R^6$ in the aforementioned formula (a'3-1); R is as defined above for R in the aforementioned formula (a-4-2); and the plurality of R may be the same or different.

In the polymer compound (A1) of the present invention, more preferred examples of the structural units include the following:

as a binary copolymer composed of the structural units (a0) and (a1), copolymers (A1-11') composed of two types of the structural units represented by the aforementioned general formula (A1-11) and the like can be mentioned;

as a binary copolymer composed of the structural units (a0) and (a2), copolymers (A1-12') composed of two types of the structural units represented by the aforementioned general formula (A1-12), copolymers (A1-13') composed of two types of the structural units represented by the aforementioned general formula (A1-13) and the like can be mentioned;

as a binary copolymer composed of the structural units (a0) and (a3), copolymers (A1-14') composed of two types of the structural units represented by the aforementioned general formula (A1-14), copolymers (A1-15') composed of two types of the structural units represented by the aforementioned general formula (A1-15) and the like can be mentioned;

as a ternary copolymer composed of the structural units (a0), (a1) and (a2), copolymers (A1-16') composed of three types of the structural units represented by the aforementioned general formula (A1-16), copolymers (A1-17') composed of three types of the structural units represented by the aforementioned general formula (A1-17) and the like can be mentioned;

as a ternary copolymer composed of the structural unit (a0) and two types of the structural unit (a3), copolymers (A1-18') composed of three types of the structural units represented by the aforementioned general formula (A1-18), copolymers (A1-19') composed of three types of the structural units represented by the aforementioned general formula (A1-19) and the like can be mentioned;

as a binary copolymer composed of the structural units (a0) and (a4), copolymers (A1-20') composed of two types of the structural units represented by the aforementioned general formula (A 1-20) and the like can be mentioned; and as a ternary copolymer composed of the structural units (a0), (a3) and (a4), copolymers (A1-21') composed of three types of the structural units represented by the aforementioned general formula (A1-21) and the like can be mentioned.

Amongst these polymer compounds (A1), a polymer composed solely of the structural unit (a0); a copolymer having at least two types of structural units, including the structural units (a0) and (a3); a copolymer having at least two types of structural units, including the structural units (a0) and (a4); or a copolymer having at least three types of structural units, including the structural units (a0), (a3) and (a4) can be suitably used as the resin component (A) of the negative resist composition described later, among the resist compositions of the present invention, by blending the cross-linking agent (C).

In particular, the binary copolymer composed of the structural units (a0) and (a3), the ternary copolymer composed of the structural unit (a0) and two types of the structural unit (a3), the binary copolymer composed of the structural units (a0) and (a4) and the ternary copolymer composed of the structural units (a0), (a3) and (a4) can be suitably used as the resin component (A) in the negative resist composition.

Further, a polymer composed solely of the structural unit (a0), a copolymer having at least two types of structural units, including the structural units (a0) and (a1); a copolymer having at least two types of structural units, including the structural units (a0) and (a2); and a copolymer having at least three types of structural units, including the structural units (a0), (a1) and (a2) can be suitably used as the resin component (A) of the positive resist composition described later, among the resist compositions of the present invention.

In particular, the polymer composed solely of the structural unit (a0), the binary copolymer composed of the structural units (a0) and (a1), the binary copolymer composed of the structural units (a0) and (a2) and the ternary copolymer composed of the structural units (a0), (a1) and (a2) can be suitably used as the resin component (A) in the positive resist composition.

With respect to the polymer compound (A1) of the present invention, in those cases where both of $R^4$ and $R^5$ within the structural unit (a0) represented by the aforementioned general formula (a0-1) represent a hydrogen atom, among the resist compositions of the present invention described later, the polymer compound (A1) can be suitably used for both the resin component (A) of the negative resist composition and the resin component (A) of the positive resist composition; whereas in those cases where either one of $R^4$ and $R^5$ represents an acid dissociable, dissolution inhibiting group, among the resist compositions of the present invention described later, the polymer compound (A1) can be suitably used for the resin component (A) of the positive resist composition.

Although there are no particular limitations on the weight average molecular weight (Mw) of the polymer compound (A1) (which is measured by gel permeation chromatography and referenced against polystyrene standards), in those cases where the polymer compound (A1) is used as the component (A) in the negative resist composition described later, the weight average molecular weight is preferably within a range from 1,000 to 8,000, more preferably from 2,000 to 7,000, and most preferably from 2,500 to 6,500. Further, in those cases where the polymer compound (A1) is used as the component (A) in the positive resist composition described later, the weight average molecular weight is preferably within a range from 3,000 to 50,000, more preferably from 4,000 to 30,000, and most preferably from 4,000 to 20,000. By making the weight average molecular weight no more than the upper limit of these above-mentioned ranges, the polymer compound (A1) exhibits satisfactory solubility in a resist solvent when used as a resist. On the other hand, by making the weight average molecular weight at least as large as the lower limit of these above-mentioned ranges, the dry etching resistance and cross-sectional shape of the resist pattern becomes satisfactory.

Further, the dispersity (Mw/Mn) is preferably within a range from 1.0 to 5.0, more preferably from 1.0 to 4.0, and most preferably from 1.2 to 3.8. Here, Mn is the number average molecular weight.

[Production of Polymer Compound (A1)]

The polymer compound (A1) can be obtained, for example, by conventional radical polymerization or the like of the monomers corresponding with each of the structural units, using a radical polymerization initiator such as dimethyl-2,2-azobis(2-methylpropionate) or azobisisobutyronitrile.

Furthermore, in the polymer compound (A1), by using a chain transfer agent such as HS—$CH_2$—$CH_2$—$CH_2$—C($CF_3$)$_2$—OH, a —C($CF_3$)$_2$—OH group can be introduced at the terminals of the polymer compound (A1). Such a copolymer having an introduced hydroxyalkyl group in which some of the hydrogen atoms of an alkyl group have been substituted with fluorine atoms is effective in reducing developing defects and LER (line edge roughness: unevenness of the side walls of a line pattern).

The polymer compound (A1) is a novel compound.

The monomer that yields the structural unit (a0) is a compound represented by general formula (I) shown below (hereafter referred to as "compound (I)").

[Chemical Formula 46]

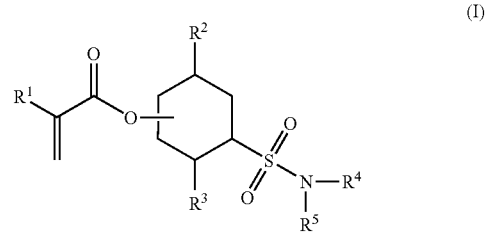

(I)

wherein $R^1$ represents a hydrogen atom, an alkyl group of 1 to 5 carbon atoms or a fluorinated alkyl group of 1 to 5 carbon atoms; $R^2$ and $R^3$ each independently represents a hydrogen atom, an alkyl group or an alkoxy group, or $R^2$ and $R^3$ may be bonded together to form an alkylene group that may include an oxygen atom or sulfur atom at an arbitrary position, —O— or —S—; $R^4$ and $R^5$ each independently represents a hydrogen atom, an alkyl group that may include an oxygen atom at an arbitrary position, a cycloalkyl group that may include an oxygen atom at an arbitrary position or an alkoxycarbonyl group.

In formula (I), $R^1$, $R^2$, $R^3$, $R^4$ and $R^5$ are as defined above for $R^1$, $R^2$, $R^3$, $R^4$ and $R^5$, respectively, in the aforementioned general formula (a0-1).

Although there are no particular limitations on the method used for producing the compound (I), examples of preferred methods include a method in which a sulfonamide derivative represented by general formula (III) shown below is added to a reaction system containing an α-substituted acrylic acid represented by general formula (II) shown below, thus yielding the compound (I) (production method A); and a method in which a sulfonamide derivative represented by general formula (III) shown below is reacted with water in the presence of an acid, followed an esterification with an α-substituted acrylic acid represented by general formula (II), thus yielding the compound (I) (production method B).

[Chemical Formula 47]

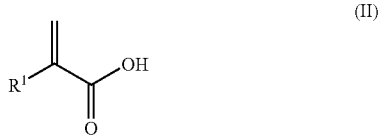

(II)

wherein $R^1$ represents a hydrogen atom, an alkyl group of 1 to 5 carbon atoms or a fluorinated alkyl group of 1 to 5 carbon atoms.

In formula (II), $R^1$ is as defined above for $R^1$ in the aforementioned general formula (a0-1).

[Chemical Formula 48]

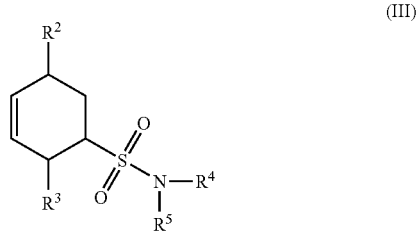

(III)

wherein $R^2$ and $R^3$ each independently represents a hydrogen atom, an alkyl group or an alkoxy group, or $R^2$ and $R^3$ may be bonded together to form an alkylene group that may include an oxygen atom or sulfur atom at an arbitrary position, —O— or —S—; $R^4$ and $R^5$ each independently represents a hydrogen atom, an alkyl group that may include an oxygen atom at an arbitrary position, a cycloalkyl group that may include an oxygen atom at an arbitrary position or an alkoxycarbonyl group.

In formula (III), $R^2$, $R^3$, $R^4$ and $R^5$ are as defined above for $R^2$, $R^3$, $R^4$ and $R^5$, respectively, in the aforementioned general formula (a0-1).

Of the above-mentioned production methods A and B, the production method A will be described in more detail below.

The production method A is a method in which a sulfonamide derivative represented by the above general formula (III) is added to a reaction system containing an α-substituted acrylic acid represented by the above general formula (II), thus yielding the compound (I).

In the production method A, an acid catalyst such as trifluoromethanesulfonic acid can be used, and a polymerization inhibitor such as hydroquinone and methoxyhydroquinone may also be added to the reaction solution where appropriate.

The production method A can be conducted either by adding a solvent or without adding any solvent. There are no particular limitations on the solvent used as long as it does not inhibit the reaction, and, for example, aliphatic hydrocarbons such as hexane, heptane and octane; aromatic hydrocarbons such as benzene and toluene; and the like can be used.

The reaction temperature in the production method A may differ, depending on the types of sulfonamide derivative (III), α-substituted acrylic acid (II) and acid catalyst used, but is typically within a range from 0° C. to 200° C., and preferably from 50° C. to 100° C.

Generally, the reaction time in the production method A is preferably within a range from 0.5 to 48 hours, and more preferably within a range from 1 to 24 hours.

Isolation/purification of an α-substituted acrylate ester derivative (I) from the reaction mixture obtained by the production method A or B can be conducted by the methods generally used in the isolation/purification of organic compounds. For example, after the neutralization using an alkali, the mixture is extracted with an organic solvent, and the obtained extraction liquid is concentrated. Thereafter, by further purifying the resultant through recrystallization, distillation, silica gel chromatography, and the like, an α-substituted acrylate ester derivative (I) of high purity can be obtained. Furthermore, by repeating such purification processes, a single diastereomer of high purity can be obtained.

The α-substituted acrylate ester derivative (I) obtained by the production method A or B can be suitably used as a material of polymer compounds for photoresists, even when it is obtained as a single diastereomer or a mixture of diastereomers.

Although stereoisomers (i.e., an exo-form and an endo-form) of the sulfamoyl group in the sulfonamide derivative (III) that is used as a material are available, either form can be suitably used in the production methods A and B, and the sulfamoyl group consisting solely of either one form or composed of a mixture of both forms can be used.

There are no particular limitations on the method for producing the sulfonamide derivative (III), and, for example, the sulfonamide derivative (III) can be synthesized by treating the norbornenesulfonyl chloride that is prepared from ethylenesulfonyl chloride and cyclopentadiene with ammonia (refer to Journal of the American Chemical Society, Vol. 73, pp. 3258-3260).

The polymer compound (A1) can be used favorably for preparing the resist composition according to the present invention described below.

The polymer compound (A1) of the present invention exhibits the required level of alkali solubility needed for either a positive resist composition or a negative resist composition. It is assumed that this is because the structural unit (a0) of the polymer compound (A1) includes a structure represented by $SO_2N(R^4)R^5$ at the side chain terminal.

Further, the polymer compound (A1) of the present invention exhibits excellent transparency to light having a wavelength in the vicinity of 193 nm. It is thought that this is because the cyclohexane ring and sulfonamide group ($SO_2N$ group) of the structural unit (a0) are both structures of comparatively superior transparency.

<<Resist Composition>>

The resist composition of the present invention includes a resin component (A) (hereafter, referred to as "component (A)") having the aforementioned polymer compound (A1), and an acid-generator component (B) (hereafter, referred to as "component (B)") that generates acid upon irradiation.

<Component (A)>

As the component (A), there is no particular limitation as long as it is a resin component that includes the aforementioned polymer compound (A1). In those cases where the component (A) is a resin component that is soluble in an alkali developing solution, the resist composition of the present invention is a negative resist composition. On the other hand, in those cases where the component (A) is a resin component that is insoluble but may become soluble in an alkali developing solution, the resist composition of the present invention is a positive resist composition.

In those cases where the resist composition of the present invention is a positive resist composition, it is preferable that an acid dissociable, dissolution inhibiting group be included within the component (A).

In the positive resist composition, the component (A) is insoluble in an alkali developing solution prior to exposure, and when the acid generated from the component (B) by exposure acts upon the component (A), the acid dissociable, dissolution inhibiting group is dissociated. As a result, the solubility of the entire component (A) in an alkali developing solution increases, so that the entire component (A) changes from an alkali-insoluble state to an alkali-soluble state. Therefore, in the formation of a resist pattern, by conducting selective exposure of a resist film formed by applying the positive resist composition onto a substrate, the exposed portions become alkali soluble, whereas the unexposed portions remain alkali insoluble, and hence, a resist pattern can be formed by alkali developing.

In those cases where the resist composition of the present invention is a positive resist composition, in addition to the polymer compound (A1), the component (A) may also include another resin component that has an acid dissociable, dissolution inhibiting group and exhibits increased solubility in an alkali developing solution under the action of acid.

As the resin component, any of the resin components that have been proposed as the base resins for chemically amplified positive resists can be used. Specific examples thereof include resins having the aforementioned structural unit (a1) and may also include any of the aforementioned structural units (a2) to (a5).

In those cases where the resist composition of the present invention is a negative resist composition, the component (A) is soluble in an alkali developing solution prior to exposure.

In the negative resist composition, when selective exposure is conducted during formation of a resist pattern, the action of the acid generated from the component (B) upon exposure causes crosslinking between the component (A) that is soluble in an alkali developing solution and the crosslinking agent. As a result, the exposed portions become alkali insoluble, whereas the unexposed portions remain alkali soluble, and hence, a resist pattern can be formed by alkali developing.

In those cases where the resist composition of the present invention is a negative resist composition, in addition to the polymer compound (A1) that is soluble in an alkali developing solution, the component (A) may also include another resin that is soluble in an alkali developing solution (alkali-soluble resin).

As the alkali-soluble resin, it is preferable to use a resin having a structural unit derived from at least one of α-(hydroxyalkyl)acrylic acid and a lower alkyl ester of α-(hydroxyalkyl)acrylic acid, as it enables formation of a satisfactory resist pattern with minimal swelling. Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

In the component (A), the polymer compound (A1) may be used as a single compound, or two or more compounds may be used in combination.

The component (A) may include a resin that is different from the polymer compound (A1), or may be composed solely of the polymer compound (A1). In the component (A), the proportion of the polymer compound (A1) is preferably at least 50% by weight, more preferably within a range from 80 to 100% by weight, and is most preferably 100% by weight.

There are no particular limitations on the amount of the component (A) within the resist composition, which may be set appropriately in accordance with factors such as the desired film thickness for the resist film being formed. Generally, as the concentration of the component (A) within the organic solvent solution of the resist composition is increased, the film thickness of the formed resist film also increases.

<Component (B)>

The resist composition of the present invention includes an acid-generator component (B) (hereafter, referred to as "component (B)") that generates acid upon irradiation.

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-0) shown below can be preferably used.

[Chemical Formula 49]

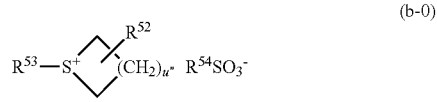

(b-0)

wherein $R^{54}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{54}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The linear or branched fluorinated alkyl group preferably has 1 to 10 carbon atoms, more preferably 1 to 8 carbon atoms, and most preferably 1 to 4 carbon atoms.

The cyclic fluorinated alkyl group preferably has 4 to 12 carbon atoms, more preferably 5 to 10 carbon atoms, and most preferably 6 to 10 carbon atoms.

Further, the fluorination ratio of the fluorinated alkyl group (percentage of the number of fluorine atoms within the fluorinated alkyl group, based on the total number of fluorine atoms and hydrogen atoms within the alkyl group) is preferably from 10 to 100%, more preferably from 50 to 100%, and it is particularly desirable that all of the hydrogen atoms are substituted with fluorine atoms, as the acid strength increases.

$R^{54}$ is most preferably a linear alkyl group or a fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same as the alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, and examples of the basic ring excluding the substituent include a naphthyl group, a phenyl group and an anthryl group. In terms of the effects of the present invention and absorption of exposure rays such as ArF excimer lasers, a phenyl group is preferable.

Examples of the substituent include a hydroxyl group and a lower alkyl group (linear or branched, and preferably has no more than 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be exemplified.

[Chemical formula 50]

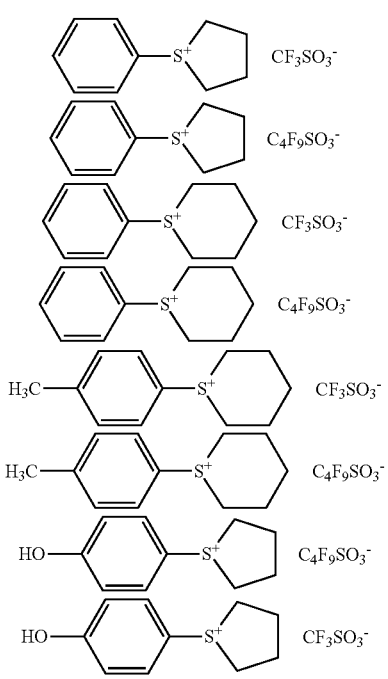

-continued

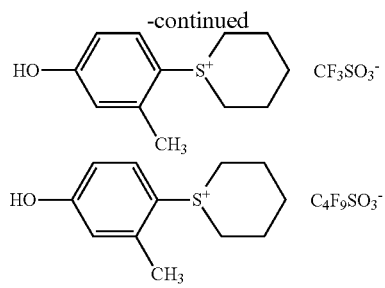

As the acid generator represented by general formula (b-0), one type of acid generator may be used alone, or two or more types may be used in combination.

As an onium salt-based acid generator other than those represented by general formula (b-0), a compound represented by general formula (b-1) or (b-2) shown below can be preferably used.

[Chemical Formula 51]

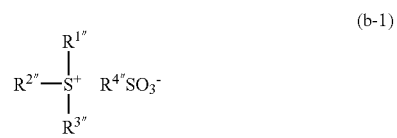

(b-1)

(b-2)

wherein $R^{1"}$ to $R^{3"}$, $R^{5"}$ and $R^{6"}$ each independently represents an aryl group or alkyl group; and $R^{4"}$ represents a linear, branched or cyclic alkyl group or fluorinated alkyl group, with the proviso that at least one of $R^{1"}$ to $R^{3"}$ represents an aryl group, and at least one of $R^{5"}$ and $R^{6"}$ represents an aryl group.

In formula (b-1), $R^{1"}$ to $R^{3"}$ each independently represents an aryl group or an alkyl group. Further, among $R^{1"}$ to $R^{3"}$, at least one group represents an aryl group. Among $R^{1"}$ to $R^{3"}$, two or more groups are preferably aryl groups, and it is particularly desirable that all of $R^{1"}$ to $R^{3"}$ are aryl groups.

The aryl group for $R^{1"}$ to $R^{3"}$ is not particularly limited. For example, an aryl group having 6 to 20 carbon atoms may be used in which some or all of the hydrogen atoms of the aryl group may or may not be substituted with alkyl groups, alkoxy groups, or halogen atoms. The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1"}$ to $R^{3"}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1''}$ to $R^{3''}$ is a phenyl group or a naphthyl group.

$R^{4''}$ represents a linear, branched or cyclic alkyl group or a fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1''}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and it is particularly desirable that all hydrogen atoms are substituted with fluorine atoms because the acid strength increases.

$R^{4''}$ is most preferably a linear or cyclic alkyl group or a fluorinated alkyl group.

In formula (b-2), $R^{5''}$ and $R^{6''}$ each independently represents an aryl group or an alkyl group. At least one of $R^{5''}$ and $R^{6''}$ represents an aryl group. It is preferable that both of $R^{5''}$ and $R^{6''}$ represent an aryl group.

As the aryl group for $R^{5''}$ and $R^{6''}$, the same as the aryl groups for $R^{1''}$ to $R^{3''}$ can be used.

As the alkyl group for $R^{5''}$ and $R^{6''}$, the same as the alkyl groups for $R^{1''}$ to $R^{3''}$ can be used.

It is particularly desirable that both of $R^{5''}$ and $R^{6''}$ represents a phenyl group.

As $R^{4''}$ in formula (b-2), the same as those mentioned above for $R^{4''}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate.

It is also possible to use onium salts in which the anion moiety of these onium salts has been replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may also be used.

[Chemical Formula 52]

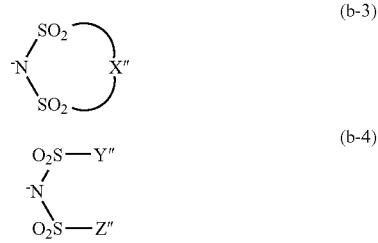

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the allylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or an electron beam is improved. The percentage of the fluorine atoms within the alkylene group or alkyl group, i.e., the fluorination ratio is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 53]

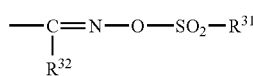

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 54]

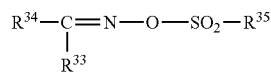

(B-2)

wherein, $R^{33}$ represents a cyano group, an alkyl group having no substituent, or a halogenated alkyl group; $R^{34}$ represents an aryl group; and $R^{35}$ represents an alkyl group having no substituent, or a halogenated alkyl group.

[Chemical Formula 55]

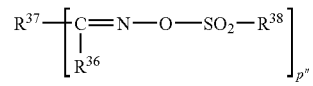

(B-3)

wherein $R^{36}$ represents a cyano group, an alkyl group having no substituent, or a halogenated alkyl group; $R^{37}$ represents a divalent or trivalent aromatic hydrocarbon group; $R^{38}$ represents an alkyl group having no substituent, or a halogenated alkyl group; and p" represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, and still more preferably 90% or more. A completely fluorinated alkyl group in which 100% of the hydrogen atoms are substituted with fluorine atoms is particularly desirable.

In general formula (B-3) above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 56]

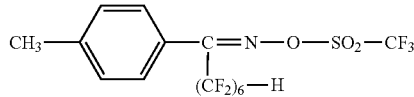
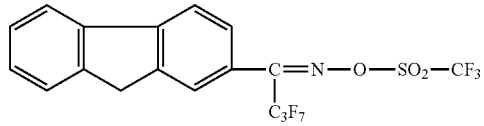
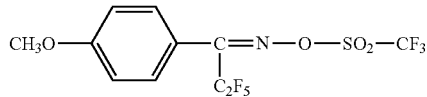
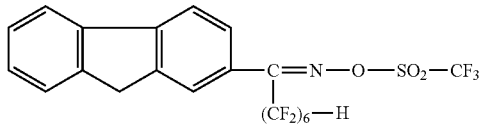
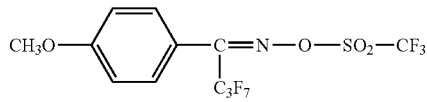
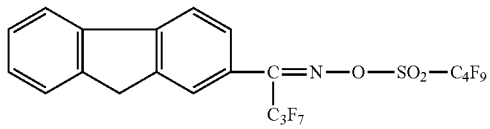
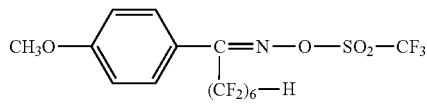
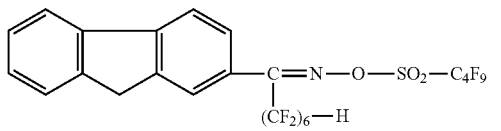
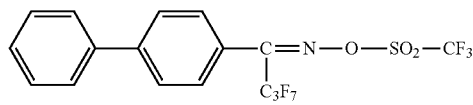
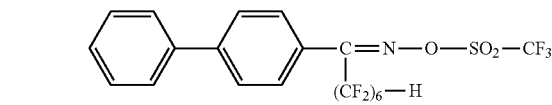
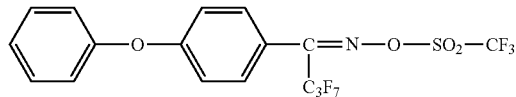
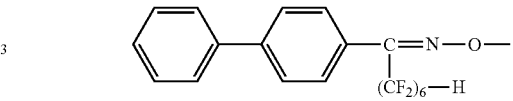
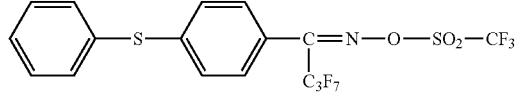
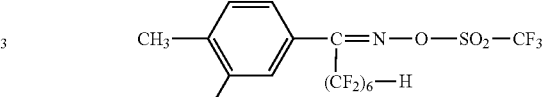
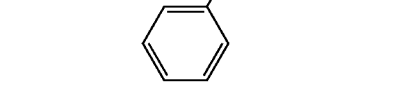

87 88
-continued
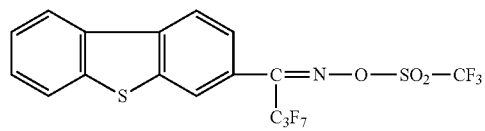
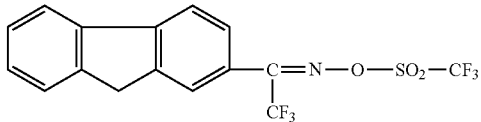
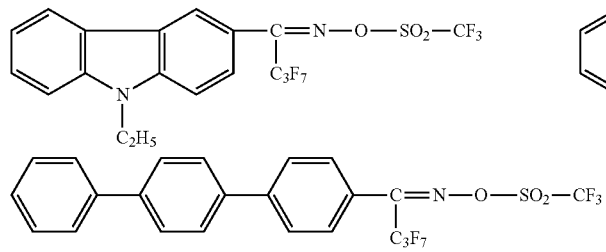
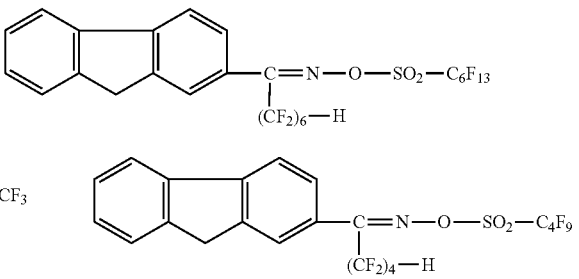
[Chemical Formula 57]
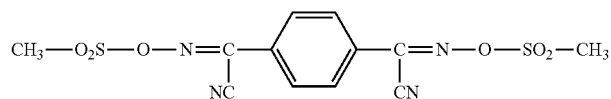
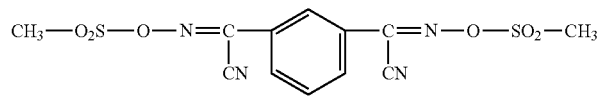
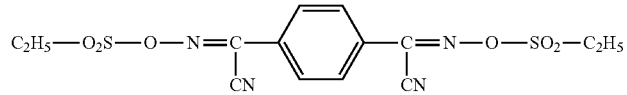
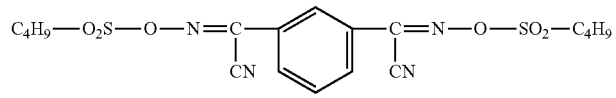
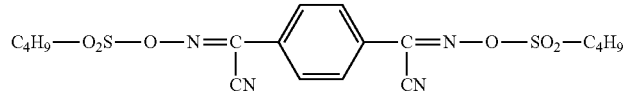
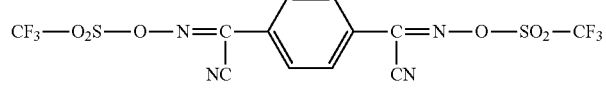
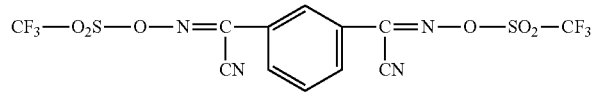
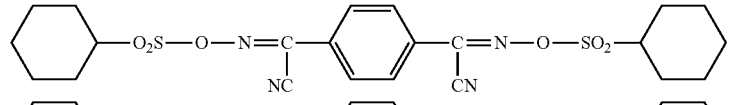
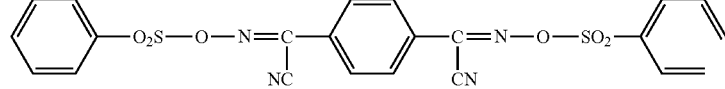
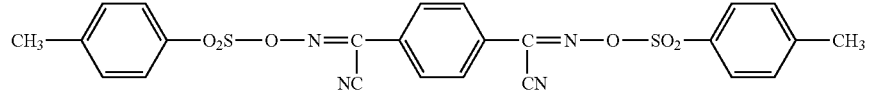
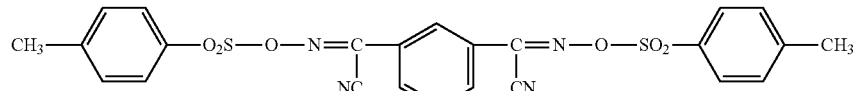
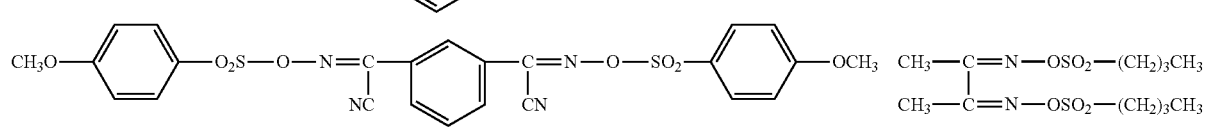

Among the above-exemplified compounds, the following 4 compounds are preferable.

[Chemical Formula 58]

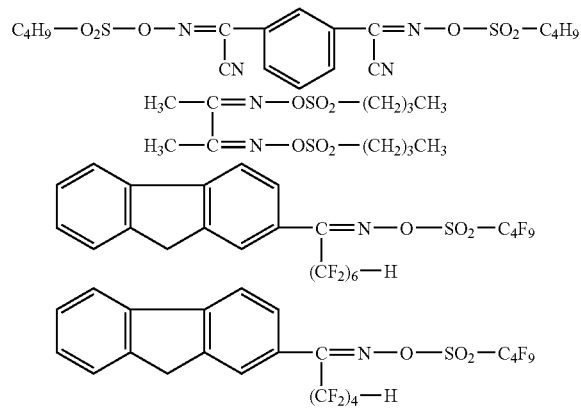

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis (phenylsulfonyldiazomethylsulfonyl)decane, 1,2-bis (cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, may be exemplified.

As the component (B), one type of these acid generators may be used alone, or two or more types may be used in combination.

In the present invention, as the component (B), it is particularly preferable to use an onium salt in which an anion is a fluorinated alkylsulfonate ion.

The amount of the component (B) within the resist composition of the present invention is 0.5 to 30 parts by weight, and preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.
<Component (C)>

In those cases where the resist composition of the present invention is a negative resist composition, it is preferable that a crosslinking agent (hereafter, referred to as "component (C)") be further blended into the resist composition.

There are no particular limitations on the component (C), which may be selected appropriately from the various crosslinking agents used within conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other suitable examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups; and compounds having an epoxy group.

Of these, compounds that use melamine are referred to as melamine-based crosslinking agents, compounds that use urea are referred to as urea-based crosslinking agents, compounds that use an alkylene urea such as ethylene urea or propylene urea are referred to as alkylene urea-based crosslinking agents, compounds that use glycoluril are referred to as glycoluril-based crosslinking agents, and compounds that use a compound having an epoxy group are referred to as epoxy-based crosslinking agents.

As the component (C), at least one type of crosslinking agent selected from the group consisting of melamine-based crosslinking agents, urea-based crosslinking agents, alkylene urea-based crosslinking agents, glycoluril-based crosslinking agents and epoxy-based crosslinking agents is preferred, and a glycoluril-based crosslinking agent is particularly desirable.

Examples of the melamine-based crosslinking agents include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based crosslinking agents include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based crosslinking agents include compounds represented by general formula (C-1) shown below.

[Chemical Formula 59]

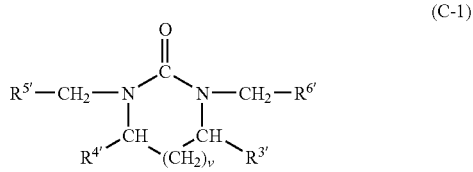
(C-1)

wherein $R^{5'}$ and $R^{6'}$ each independently represents a hydroxyl group or a lower alkoxy group; $R^{3'}$ and $R^{4'}$ each independently represents a hydrogen atom, a hydroxyl group or a lower alkoxy group; and v represents 0 or an integer of 1 to 2.

The lower alkoxy group for $R^{5'}$ and $R^{6'}$ may be either a linear or branched group, and is preferably an alkoxy group of 1 to 4 carbon atoms. $R^{5'}$ and $R^{6'}$ may be either the same or different, and are preferably the same.

The lower alkoxy group for $R^{3'}$ and $R^{4'}$ may be either a linear or branched group, and is preferably an alkoxy group of 1 to 4 carbon atoms. $R^{3'}$ and $R^{4'}$ may be either the same or different, and are preferably the same.

v represents 0 or an integer of 1 to 2, and is preferably 0 or 1.

As the alkylene urea-based crosslinking agent, compounds in which v is 0 (ethylene urea-based crosslinking agents) and/or compounds in which v is 1 (propylene urea-based crosslinking agents) are preferred.

Compounds represented by the above general formula (C-1) can be obtained by a condensation reaction between an alkylene urea and formalin, and by further reacting the resulting product with a lower alcohol.

Specific examples of the alkylene urea-based crosslinking agents include ethylene urea-based crosslinking agents such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based crosslinking agents such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based crosslinking agents include glycoluril derivatives in which the N-position is substituted with either one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of glycoluril-based crosslinking agents include mono-, di-, tri-, and/or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril.

There are no particular limitations on the epoxy-based crosslinking agents, and any crosslinking agent having an epoxy group may be used. Of such crosslinking agents, those having two or more epoxy groups are preferred. Including two or more epoxy groups improves the crosslinking reactivity.

The number of epoxy groups is preferably at least two, more preferably from 2 to 4, and is most preferably 2.

Preferred examples of the epoxy-based crosslinking agents are shown below.

[Chemical Formula 60]

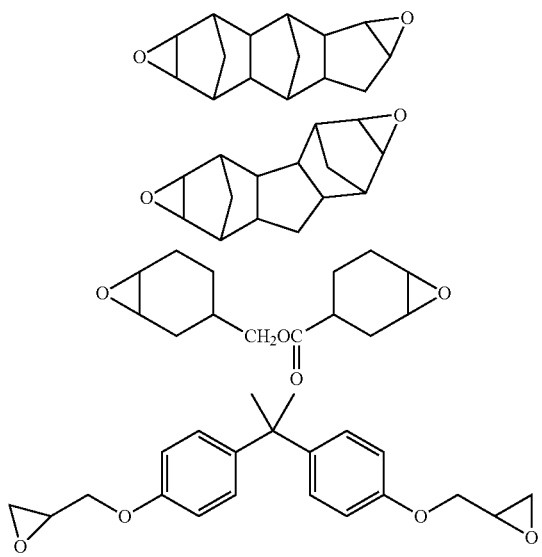

As the component (C), one type of crosslinking agent may be used alone, or two or more types may be used in combination.

Further, as the component (C), typically, an amino-based crosslinking agent such as a glycoluril having a methylol group or alkoxymethyl group is preferable, as it enables formation of a resist pattern with minimal swelling.

The quantity of the component (C) is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A). By ensuring that the quantity of the component (C) is at least as large as the lower limit of the above-mentioned range, the formation of crosslinking is able to proceed favorably, and a favorable resist pattern with minimal swelling is obtained. On the other hand, by ensuring that the quantity is not more than the upper limit of the above-mentioned range, the storage stability of the resist coating liquid improves, and deterioration in the sensitivity over time can be suppressed.

<Component (D)>

In the resist composition of the present invention, for improving the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although a cyclic amine, an aliphatic amine, and particularly a secondary aliphatic amine or tertiary aliphatic amine is preferable. Here, an aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (namely, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Of the above amines, alkyl alcohol amines and trialkylamines are preferred, and triisopropanolamine and tri-n-pentylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight, relative to 100 parts by weight of the component (A).

<Optional Component>

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

When added, the component (E) is typically used in a quantity within a range from 0.01 to 5.0 parts by weight per 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Organic Solvent>

The resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethyl sulfoxide (DMSO).

These organic solvents can be used individually, or as a mixed solvent containing two or more different solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA or PGME with a polar solvent is preferable. The mixing ratio (weight ratio) of the mixed solvent can be appropriately determined, taking into consideration the compatibility of the PGMEA or PGME with the polar solvent, but is preferably in a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

Further, a mixed solvent of PGME with dimethyl sulfoxide is also preferable. In this case, the mixing ratio (former:latter)

of such a mixed solvent is preferably from 9:1 to 1:9, more preferably from 8:2 to 2:8, and most preferably from 7:3 to 5:5.

There are no particular limitations on the quantity used of the component (S), although the quantity should be set in accordance with the coating film thickness, at a concentration that enables favorable application of the composition to a substrate or the like. In general, the component (S) is used in an amount such that the solid content of the resist composition becomes within the range from 2 to 20% by weight, and preferably from 3 to 15% by weight.

<<Method of Forming a Resist Pattern>>

The method of forming a resist pattern according to the present invention includes: applying a resist composition of the present invention to a substrate to form a resist film on the substrate; subjecting the resist film to exposure; and developing the resist film to form a resist pattern.

The substrate is not specifically limited and a conventionally known substrate can be used. For example, substrates for electronic components, and such substrates having wiring patterns formed thereon can be used. Specific examples thereof include a silicon wafer, a substrate made of metals such as copper, chromium, iron and aluminum, and a glass substrate. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be used. As the organic film, an organic antireflection film (organic BARC) can be used.

More specifically, the method for forming a resist pattern according to the present invention can be performed, for example, as follows.

Firstly, the resist composition is applied onto a substrate using a spinner or the like, and a prebake (post applied bake (PAB)) is conducted under temperature conditions of 80 to 150° C. for 40 to 120 seconds, preferably 60 to 90 seconds, to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide, preferably followed by rinsing with pure water, and drying, thereby forming a resist pattern.

An organic or inorganic antireflection film may be provided between the substrate and the applied coating layer of the resist composition.

Further, the wavelength to be used for exposure is not particularly limited and the exposure can be conducted using radiation such as an ArF excimer laser, a KrF excimer laser, a $F_2$ excimer laser, extreme ultraviolet rays (EUV), vacuum ultraviolet rays (VUV), an electron beam (EB), X-rays, and soft X-rays. The resist composition according to the present invention is particularly effective to an ArF excimer laser.

The resist composition of the present invention is a novel composition that has not been known until now.

The resist composition of the present invention exhibits superior transparency to light having a wavelength in the vicinity of 193 nm, and during formation of a resist pattern using the positive resist composition, enables favorable suppression of swelling and pattern collapse of the resist pattern. As a result, a resist pattern with excellent resolution can be formed.

Conventionally, acrylic resins that contain structural units derived from (meth)acrylate esters within the principal chain have been widely used as base resins for positive resists that use ArF excimer laser lithography, as they exhibit excellent transparency to light having a wavelength in the vicinity of 193 nm. However, because the dissolution rate of (meth) acrylic acid is excessively high, the occurrence of pattern swelling and pattern collapse has become a considerable problem as the field of pattern size miniaturization progresses.

The polymer compound (A1) of the present invention includes a side chain terminal represented by $SO_2N(R^4)R^5$, and the $SO_2NH_2$ group formed as a result of acid dissociation of the side chain terminal exhibits an adequate level of alkali solubility. Further, the polymer compound (A1) exhibits a high refractive index and glass transition temperature (Tg), as compared to known polymer compounds that are used for positive resist compositions and have a fluorinated hydroxyalkyl group. It is thought that because of these reasons, while suppressing the pattern swelling or pattern collapse, a positive resist pattern having excellent resolution can be formed.

Further, in the resist composition of the present invention, when a crosslinking agent component (C) is added, a negative resist pattern having excellent resolution can be formed.

In the conventional negative resist compositions, polymer compounds having fluorinated hydroxyalkyl groups are known to exhibit an appropriate level of alkali solubility and thus considered to be excellent. However, as a result of the steric hindrance caused by the fluorinated alkyl group, the hydroxyl groups of these fluorinated hydroxyalkyl groups do not contribute to the crosslinking reaction, meaning they tend to impede improvements in the crosslinking density.

On the other hand, in the negative resist composition using the polymer compound (A1) of the present invention, not only does the composition exhibit excellent transparency in the wavelength vicinity of 193 nm and an appropriate level of alkali solubility as described above, but also the sulfonamide group ($SO_2N$ group) at the side chain terminal undergoes a crosslinking reaction with the crosslinking agent component (C). As a result, when a negative resist pattern is formed, the crosslinking density of the exposed portions can be readily increased. Therefore, the alkali insolubility of the exposed portions of the resist composition is significantly improved, and a negative resist pattern having excellent resolution can be formed.

EXAMPLES

As follows is a more detailed description of the present invention based on a series of examples, although the scope of the present invention is by no way limited by these examples.

<Polymer Compound (A)>

In the following examples, the monomers (1) to (12) shown below were used for synthesizing the polymer compounds (A)-1 to (A)-15-3.

[Chemical Formula 61]
(1) 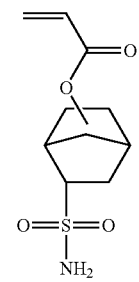
(1') 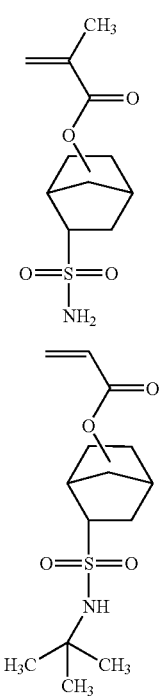
(2)
(3) 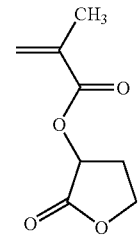
(4) 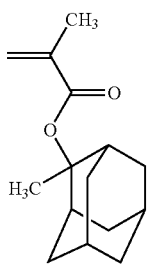
-continued
(5) 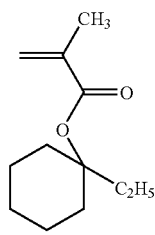
(6) 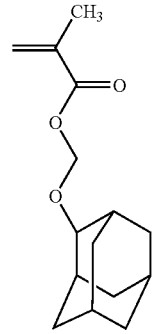
(7) 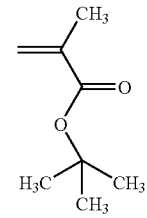
(8) 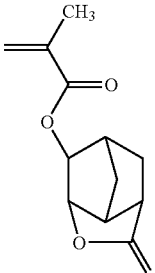
(9) 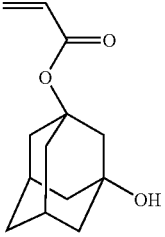
(10) 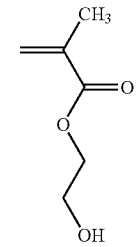

-continued

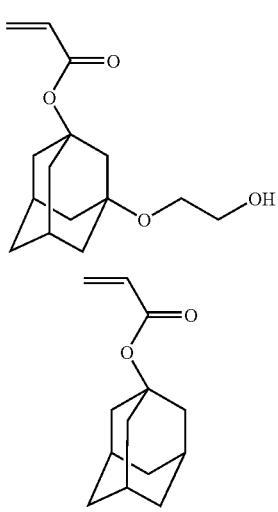

(11)
(12)

(Synthesis of Monomer (1))

Acrylation of norbornene-2-sulfonamide 0.0541 g of hydroquinone, 36.2 g (0.5 mol) of acrylic acid and 0.19 g (0.0013 mol) of trifluoromethanesulfonic acid were added to a 200 ml four-necked glass flask equipped with a stirrer, a thermometer and a reflux condenser, and the temperature was elevated to 80° C. while stirring. Then, 17.32 g (0.1 mol) of norbornene-2-sulfonamide was added thereto over 3 hours. Thereafter, a reaction was effected for 4 hours while maintaining the internal temperature at 80 to 85° C. After the completion of the reaction, the resultant was cooled to room temperature. Then, 30 g of distilled water and 100 g of ethyl acetate were added in this order while stirring, and 24.3 g (0.36 mol) of a 25% by weight aqueous ammonia was added to neutralize the resultant to a pH of 7.2. Then, the resultant was transferred to a separating funnel, and the aqueous phase was removed, followed by washing the organic phase with 30 g of distilled water twice. The organic phase having the aqueous phase removed was concentrated, and purification was conducted by silica gel chromatography, thereby obtaining 19.6 g (0.08 mol) of an acrylate ester represented by the above chemical formula (1) (yield: 80%).

$^1$H-NMR (300 MHz, CDCl$_3$, TMS)

δ: 6.38 (1H, m), 6.06 (1H, m), 5.79 (1H, m), 5.52 (0.5×1H, s), 5.41 (0.3×1H, m), 5.35 (0.5×1H, s), 5.28 (1H, s), 4.78 (0.3×1H, m), 4.70 (0.4×1H, m), 3.54 (0.3×1H, m), 3.44 (0.3×1H, m), 3.02 (0.4×1H, m), 2.77 (1H, m), 2.48 (1H, m), 1.99-1.84 (2H, m), 1.80-1.49 (3H, m), 1.37 (1H, m)

(Synthesis of Monomer (2))

Acrylation of norbornene-2-N-t-butylsulfonamide 0.0214 g of methoxyhydroquinone, 13.8 g (0.19 mol) of acrylic acid, 62 g of toluene and 0.56 g (0.0037 mol) of trifluoromethanesulfonic acid were added to a 200 ml four-necked glass flask equipped with a stirrer, a thermometer and a reflux condenser, and the temperature was elevated to 80° C. while stirring. Then, 14.1 g (0.06 mol) of norbornene-2-N-t-butylsulfonamide was added thereto over 3 hours. Thereafter, a reaction was effected for 2 hours while maintaining the internal temperature at 80 to 85° C. After the completion of the reaction, the resultant was cooled to room temperature.

Then, 100 g of ethyl acetate was added while stirring, and 106.7 g (0.10 mol) of a 10% by weight aqueous sodium carbonate solution was added to neutralize the resultant to a pH of 7.7. Then, the resultant was transferred to a separating funnel, and the aqueous phase was removed, followed by washing the organic phase with 100 g of distilled water twice. The organic phase having the aqueous phase removed was concentrated, and purification was conducted by silica gel chromatography, thereby obtaining 15.4 g (0.051 mol) of an acrylate ester represented by the above chemical formula (2) (yield: 85%).

$^1$H-NMR (300 MHz, CDCl$_3$, TMS)

δ: 6.35 (1H, m), 6.09 (1H, m), 5.80 (1H, m), 5.44 (0.36× 1H, m), 4.81 (0.28×1H, m), 4.71 (0.36×1H, m), 4.92 (0.33× 1H, s), 4.19 (0.67×1H, s), 3.41 (0.36×1H, m), 3.33 (0.28×1H, m), 2.88 (0.36×1H, m), 2.75 (1H, m), 2.49 (1H, m), 2.05-1.80 (2H, m), 1.70-1.55 (3H, m), 1.41 (3H, s), 1.36 (6H, s), 1.30 (1H, m)

(Synthesis of Monomer (1'))

0.0541 g of hydroquinone, 43.0 g (0.5 mol) of methacrylic acid and 0.19 g (0.0013 mol) of trifluoromethanesulfonic acid were added to a four-necked glass flask with an internal volume of 200 ml and equipped with a stirrer, a thermometer and a reflux condenser, and the temperature was elevated to 80° C. while stirring. Then, at the same temperature, 17.32 g (0.1 mol) of 5-norbornene-2-sulfonamide was added thereto over 3 hours. The reaction mixture was stirred for 4 hours at an internal temperature of 80 to 85° C., and was then cooled to room temperature. Then, 30 g of distilled water and 100 g of ethyl acetate were added in this order to the reaction mixture, followed by the addition of 24.3 g (0.36 mol) of a 25% by weight aqueous ammonia. At this time, the pH of the reaction mixture was 7.2. Subsequently, the reaction mixture was separated into an aqueous phase and organic phase, and the organic phase was washed twice with 30 g of distilled water, followed by concentration, and the obtained residue was purified by silica gel chromatography (developer: hexane/ethyl acetate=50/50), thereby obtaining 21.5 g (0.083 mol) of an methacrylate ester represented by the above chemical formula (1') (yield: 83%).

$^1$H-NMR (300 MHz, CDCl$_3$, TMS, ppm) δ: 6.03 (1H, m), 5.51 (1H, m), 5.47 (0.6×1H, s), 5.35 (0.33×1H, m), 5.29 (0.6×1H, s), 5.24 (0.8×1H, s), 4.75 (0.33×1H, m), 4.64 (0.33× 1H, m), 3.53 (0.33×1H, m), 3.43 (0.33×1H, m), 3.01 (0.33× 1H, m), 2.75 (1H, m), 2.47 (1H, m), 2.02-1.88 (2H, m), 1.87 (3H, s), 1.78-1.50 (3H, m), 1.39 (1H, m)

SYNTHESIS EXAMPLES

Synthesis of Polymer Compound (A)-1

2.5 g of the monomer (2), 1.03 g of the monomer (3) and 0.30 g of dimethyl azobisisobutyrate (product name: V-601 manufactured by Wako Pure Chemical Industries, Ltd.) as a polymerization initiator were dissolved in 35.3 g (10 wt. %) of tetrahydrofuran (THF), and the solution was then stirred at 70° C. for 5 hours to polymerize. The resulting polymer solution was added to 704 g (20 wt. %) of heptane to precipitate, followed by drying, thereby yielding 2.64 g of a white powder (polymer compound (A)-1).

In the following formula (A)-1, the composition of the polymer compound (A)-1 represented by the ratio l:m (molar ratio) of the respective monomers is l:m=50:50. With respect to the polymer compound (A)-1, the weight average molecular weight (Mw) was 11,200, and the dispersity (Mw/Mn) was 4.70.

[Chemical Formula 62]

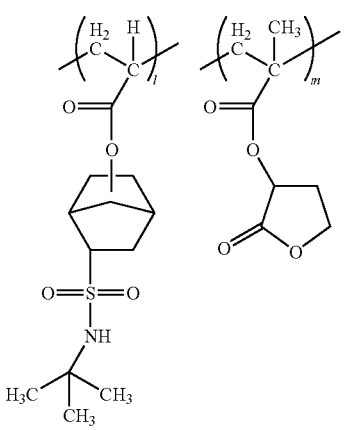

(A)-1

Synthesis of Polymer Compound (A)-2

4.28 g of the monomer (1), 4.07 g of the monomer (4) and 0.21 g of dimethyl azobisisobutyrate (product name: V-601 manufactured by Wako Pure Chemical Industries, Ltd.) as a polymerization initiator were dissolved in 150 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was added to 1,000 ml of heptane to precipitate a resin, and the precipitated resin was then filtered. Furthermore, the obtained resin was dissolved in 40 mL of THF, the resulting solution was poured into a mixture composed of water (450 ml)/methanol (50 ml) to precipitate a resin, and the precipitated resin was then filtered. The thus obtained resin was dried, thereby yielding 3.40 g of a white solid (polymer compound (A)-2).

In the following formula (A)-2, the composition of the polymer compound (A)-2 represented by the ratio l:m (molar ratio) of the respective monomers is l:m=50:50. With respect to the polymer compound (A)-2, the weight average molecular weight (Mw) was 4,800, and the dispersity (Mw/Mn) was 2.16.

[Chemical Formula 63]

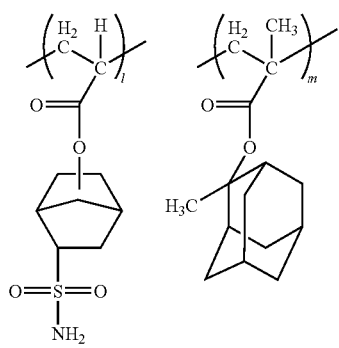

(A)-2

Synthesis of Polymer Compound (A)-3

1.71 g of the monomer (1), 2.38 g of the monomer (3), 3.27 g of the monomer (4) and 0.21 g of dimethyl azobisisobutyrate (product name: V-601 manufactured by Wako Pure Chemical Industries, Ltd.) as a polymerization initiator were dissolved in 200 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 60 mL of THF, the resulting solution was poured into a mixture composed of water (900 ml)/methanol (100 ml) to precipitate a resin, and the precipitated resin was then filtered. Furthermore, the obtained resin was dissolved in 40 mL of THF, the resulting solution was poured into a mixture composed of water (250 ml)/methanol (250 ml) to precipitate a resin, and the precipitated resin was then filtered. The thus obtained resin was dried, thereby yielding 2.45 g of a white solid. The obtained white solid is termed polymer compound (A)-3.

In the following formula (A)-3, the composition of the polymer compound (A)-3 represented by the ratio l:m:n (molar ratio) of the respective monomers is l:m:n=20:40:40. With respect to the polymer compound (A)-3, the weight average molecular weight (Mw) was 7,100, and the dispersity (Mw/Mn) was 1.83.

[Chemical Formula 64]

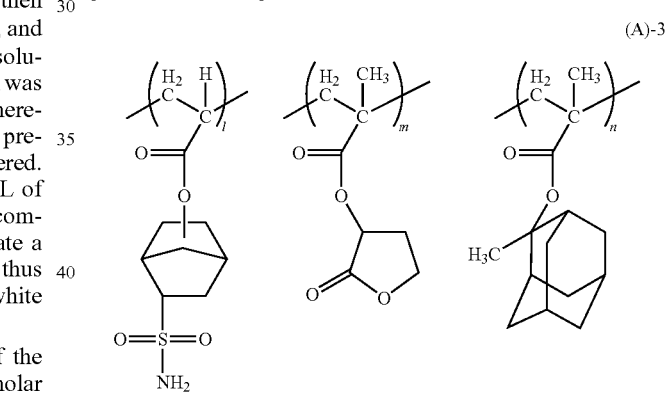

(A)-3

Synthesis of Polymer Compound (A)-3'

1.71 g of the monomer (1), 2.38 g of the monomer (3), 3.27 g of the monomer (4) and 0.21 g of dimethyl azobisisobutyrate (product name: V-601 manufactured by Wako Pure Chemical Industries, Ltd.) as a polymerization initiator were dissolved in 200 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 70 mL of THF, the resulting solution was poured into 200 ml of isopropanol, followed by the addition of 1,000 ml of heptane thereto to precipitate a resin, and the precipitated resin was then filtered. The thus obtained resin was dried, thereby yielding 2.8 g of a white solid. The obtained white solid is termed polymer compound (A)-3'.

In the above formula (A)-3, the composition of the polymer compound (A)-3' represented by the ratio l:m:n (molar ratio)

of the respective monomers is l:m:n=20:40:40. With respect to the polymer compound (A)-3', the weight average molecular weight (Mw) was 4,900, and the dispersity (Mw/Mn) was 2.38.

Synthesis of Polymer Compound (A)-3"

1.71 g of the monomer (1), 2.38 g of the monomer (3), 3.27 g of the monomer (4) and 0.21 g of dimethyl azobisisobutyrate (product name: V-601 manufactured by Wako Pure Chemical Industries, Ltd.) as a polymerization initiator were dissolved in 150 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 70 mL of THF, the resulting solution was poured into 200 ml of isopropanol, followed by the addition of 1,000 ml of heptane thereto to precipitate a resin, and the precipitated resin was then filtered. The thus obtained resin was dried, thereby yielding 2.8 g of a white solid. The obtained white solid is termed polymer compound (A)-3".

In the above formula (A)-3, the composition of the polymer compound (A)-3" represented by the ratio l:m:n (molar ratio) of the respective monomers is l:m:n=20:40:40. With respect to the polymer compound (A)-3", the weight average molecular weight (Mw) was 8,300, and the dispersity (Mw/Mn) was 2.02.

Synthesis of Polymer Compound (A)-4

4.28 g of the monomer (1), 3.41 g of the monomer (5) and 0.21 g of dimethyl azobisisobutyrate (product name: V-601 manufactured by Wako Pure Chemical Industries, Ltd.) as a polymerization initiator were dissolved in 150 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 60 mL of THF, the resulting solution was poured into a mixture composed of water (900 ml)/methanol (100 ml) to precipitate a resin, and the precipitated resin was then filtered. Furthermore, the obtained resin was dissolved in 60 mL of THF, the resulting solution was added to 1,000 ml of heptane to precipitate crystals, followed by drying, thereby yielding 2.37 g of a white solid (polymer compound (A)-4).

In the following formula (A)-4, the composition of the polymer compound (A)-4 represented by the ratio l:m (molar ratio) of the respective monomers is l:m=50:50. With respect to the polymer compound (A)-4, the weight average molecular weight (Mw) was 5,200, and the dispersity (Mw/Mn) was 2.88.

[Chemical Formula 65]

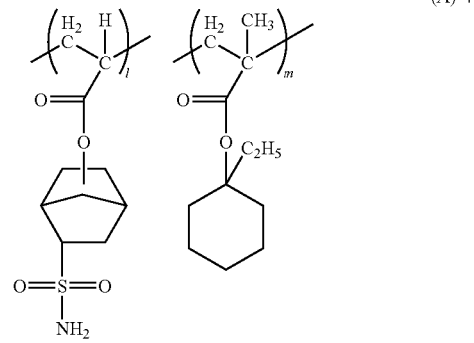

(A)-4

Synthesis of Polymer Compound (A)-5

4.28 g of the monomer (1), 4.35 g of the monomer (6) and 0.21 g of dimethyl azobisisobutyrate (product name: V-601 manufactured by Wako Pure Chemical Industries, Ltd.) as a polymerization initiator were dissolved in 60 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 60 mL of THF, the resulting solution was added to 1,000 ml of heptane to precipitate crystals, and the precipitated crystals were then filtered. Furthermore, the obtained crystals were dissolved in 40 mL of THF, the resulting solution was poured into a mixture composed of water (1,000 ml)/methanol (500 ml) to precipitate a resin, and the precipitated resin was then filtered. Furthermore, the obtained resin was dissolved in 40 mL of THF, the resulting solution was added to a mixture composed of water (450 ml)/methanol (50 ml) to precipitate crystals, followed by drying, thereby yielding 2.44 g of a white solid (polymer compound (A)-5).

In the following formula (A)-5, the composition of the polymer compound (A)-5 represented by the ratio l:m (molar ratio) of the respective monomers is l:m=50:50. With respect to the polymer compound (A)-5, the weight average molecular weight (Mw) was 15,700, and the dispersity (Mw/Mn) was 2.14.

[Chemical Formula 66]

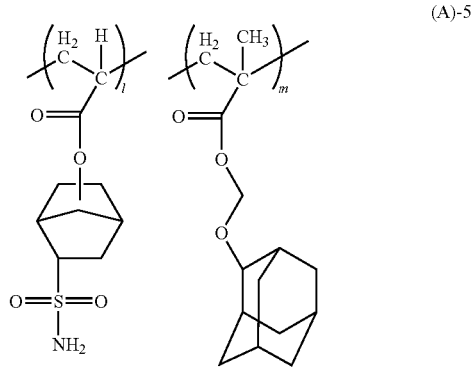

(A)-5

Synthesis of Polymer Compound (A)-6

4.28 g of the monomer (1), 2.48 g of the monomer (7) and 0.21 g of dimethyl azobisisobutyrate (product name: V-601 manufactured by Wako Pure Chemical Industries, Ltd.) as a polymerization initiator were dissolved in 150 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated using an evaporator. Thereafter, the concentrated solution was dissolved in 70 mL of THF, the resulting solution was poured into 200 ml of isopropanol, followed by the addition of 1,000 ml of heptane thereto to precipitate a resin, and the precipitated resin was then filtered. The thus obtained resin was dried, thereby yielding 3.87 g of a white solid (polymer compound (A)-6).

In the following formula (A)-6, the composition of the polymer compound (A)-6 represented by the ratio l:m (molar ratio) of the respective monomers is l:m=50:50. With respect to the polymer compound (A)-6, the weight average molecular weight (Mw) was 5,000, and the dispersity (Mw/Mn) was 1.93.

[Chemical Formula 67]

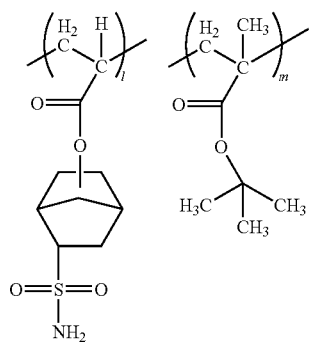

(A)-6

Synthesis of Polymer Compound (A)-7

1.71 g of the monomer (1), 2.46 g of the monomer (4), 3.89 g of the monomer (8) and 0.21 g of dimethyl azobisisobutyrate (product name: V-601 manufactured by Wako Pure Chemical Industries, Ltd.) as a polymerization initiator were dissolved in 200 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 70 mL of THF, the resulting solution was poured into 200 ml of isopropanol, followed by the addition of 1,000 ml of heptane thereto to precipitate a resin, and the precipitated resin was then filtered. The thus obtained resin was dried, thereby yielding 4.0 g of a white solid (polymer compound (A)-7).

In the following formula (A)-7, the composition of the polymer compound (A)-7 represented by the ratio l:m:n (molar ratio) of the respective monomers is l:m:n=20:30:50. With respect to the polymer compound (A)-7, the weight average molecular weight (Mw) was 7,200, and the dispersity (Mw/Mn) was 1.77.

[Chemical Formula 68]

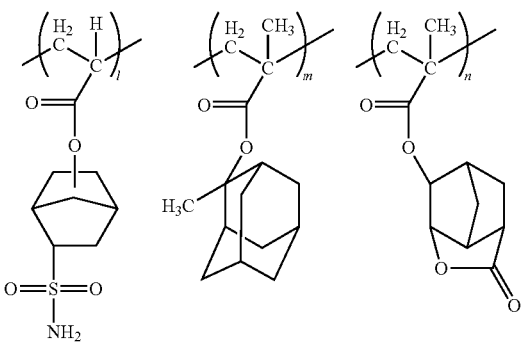

(A)-7

Synthesis of Polymer Compound (A)-8

4.0 g of the monomer (1) and 0.11 g of dimethyl azobisisobutyrate (product name: V-601 manufactured by Wako Pure Chemical Industries, Ltd.) as a polymerization initiator were dissolved in 32 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. A resin was precipitated in the THF in the end. The thus obtained resin was reprecipitated and was then dried, thereby yielding 2.18 g of a white solid (polymer compound (A)-8).

With respect to the polymer compound (A)-8, the weight average molecular weight (Mw) was 5,920, and the dispersity (Mw/Mn) was 3.68.

[Chemical Formula 69]

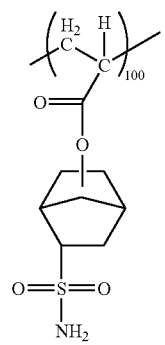

(A)-8

Synthesis of Polymer Compound (A)-8'

5.0 g of the monomer (1') and 0.21 g of dimethyl azobisisobutyrate (product name: V-601 manufactured by Wako Pure Chemical Industries, Ltd.) as a polymerization initiator were dissolved in 150 ml of tetrahydrofuran (THF).

Subsequently, nitrogen was bubbled through the solution for approximately 10 minutes, and the solution was then stirred under heating for 4 hours using a 80° C. oil bath, and then cooled to room temperature. A resin was precipitated in the THF in the end. The obtained resin was dissolved in 50 ml of dimethyl sulfoxide (DMSO), and the resulting solution was dropwise added to 500 ml of isobutanol (IBA), followed by the addition of 500 ml of heptane thereto to precipitate crystals. The thus obtained crystals were filtered and were then dried, thereby yielding 4.04 g of a white solid (polymer compound (A)-8').

The polymer compound (A)-8' is represented by the following formula (A)-8'. With respect to the polymer compound (A)-8', the weight average molecular weight (Mw) was 13,000, and the dispersity (Mw/Mn) was 4.2.

[Chemical Formula 70]

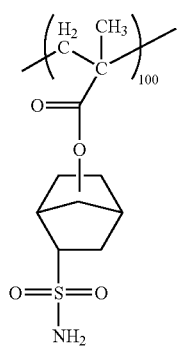

(A)-8'

Synthesis of Polymer Compound (A)-9

2.85 g of the monomer (1), 1.72 g of the monomer (9) and 0.12 g of dimethyl azobisisobutyrate (product name: V-601 manufactured by Wako Pure Chemical Industries, Ltd.) as a polymerization initiator were dissolved in a mixture composed of 30 ml of tetrahydrofuran (THF) and 2 ml of dimethyl sulfoxide (DMSO).

Subsequently, nitrogen was bubbled through the solution for approximately 10 minutes, and the solution was then stirred under heating for 4 hours using a 70° C. oil bath, and then cooled to room temperature. A resin was precipitated in the THF in the end. The thus obtained resin was reprecipitated and was then dried, thereby yielding 2.17 g of a white solid (polymer compound (A)-9).

In the following formula (A)-9, the composition of the polymer compound (A)-9 represented by the ratio l:m (molar ratio) of the respective monomers is l:m=60:40. With respect to the polymer compound (A)-9, the weight average molecular weight (Mw) was 5,520, and the dispersity (Mw/Mn) was 2.94.

[Chemical Formula 71]

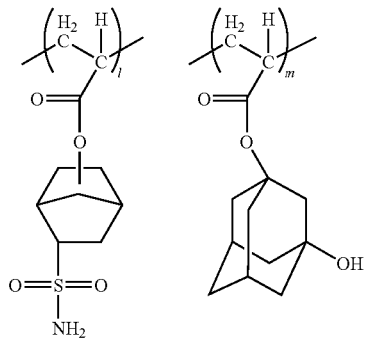

(A)-9

Synthesis of Polymer Compound (A)-9-1

5.14 g of the monomer (1), 3.10 g of the monomer (9) and 0.12 g of dimethyl azobisisobutyrate (product name: V-601 manufactured by Wako Pure Chemical Industries, Ltd.) as a polymerization initiator were dissolved in 60 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. Subsequently, the reaction solution was filtered, and the obtained filtrate was then concentrated and dried to solidify. The obtained precipitates were dissolved in 60 ml of THF, and the resulting solution was added to a mixed solution composed of 200 ml of isobutanol and 800 ml of heptane to precipitate crystals. The thus obtained crystals were filtered and were then dried, thereby yielding 4.8 g of a white solid (polymer compound (A)-9-1).

In the above formula (A)-9, the composition of the polymer compound (A)-9-1 represented by the ratio l:m (molar ratio) of the respective monomers is l:m=59:41. With respect to the polymer compound (A)-9-1, the weight average molecular weight (Mw) was 3,400, and the dispersity (Mw/Mn) was 1.76.

Synthesis of Polymer Compound (A)-9-2

3.43 g of the monomer (1), 4.66 g of the monomer (9) and 0.12 g of dimethyl azobisisobutyrate (product name: V-601 manufactured by Wako Pure Chemical Industries, Ltd.) as a polymerization initiator were dissolved in 60 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 60 mL of THF, the resulting solution was poured into 1,000 ml of heptane to precipitate a resin, and the precipitated resin was then filtered. Furthermore, the obtained resin was dissolved in 50 mL of THF, and the resulting solution was poured into a mixed solvent composed of 200 ml of isobutanol and 800 ml of heptane to precipitate a resin. The thus obtained resin was filtered and was then dried, thereby yielding 5.92 g of a white solid (polymer compound (A)-9-2).

In the above formula (A)-9, the composition of the polymer compound (A)-9-2 represented by the ratio 1:m (molar ratio) of the respective monomers is 1:m=38:62. With respect to the polymer compound (A)-9-2, the weight average molecular weight (Mw) was 5,900, and the dispersity (Mw/Mn) was 2.26.

Synthesis of Polymer Compound (A)-9-3

4.28 g of the monomer (1), 3.87 g of the monomer (9) and 0.12 g of dimethyl azobisisobutyrate (product name: V-601 manufactured by Wako Pure Chemical Industries, Ltd.) as a polymerization initiator were dissolved in 60 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. The resulting reaction solution was transparent. Subsequently, the reaction solution was concentrated and dried to solidify using an evaporator. Thereafter, the resultant was dissolved in 60 mL of THF, the resulting solution was poured into 1,000 ml of heptane to precipitate a resin, and the precipitated resin was then filtered. Further, the obtained resin was dissolved in 50 mL of THF, the resulting solution was poured into a mixed solvent composed of 200 ml of isobutanol and 800 ml of heptane to precipitate a resin, and the precipitated resin was then filtered. Furthermore, the obtained resin was dissolved in 50 mL of THF, the resulting solution was dropwise added to 200 ml of isobutanol, followed by the addition of 800 ml of heptane thereto to precipitate a resin, and the thus obtained resin was filtered and was then dried, thereby yielding 4.98 g of a white solid (polymer compound (A)-9-3).

In the above formula (A)-9, the composition of the polymer compound (A)-9-3 represented by the ratio l:m (molar ratio) of the respective monomers is l:m=48:52. With respect to the polymer compound (A)-9-3, the weight average molecular weight (Mw) was 3,400, and the dispersity (Mw/Mn) was 1.83.

Synthesis of Polymer Compound (A)-9-4

4.28 g of the monomer (1), 3.87 g of the monomer (9) and 0.12 g of dimethyl azobisisobutyrate (product name: V-601 manufactured by Wako Pure Chemical Industries, Ltd.) as a polymerization initiator were dissolved in 60 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. Subsequently, the reaction solution was filtered, and the obtained filtrate was then concentrated and dried to solidify. The resultant was dissolved in 60 ml of THF, and the resulting solution was added to a mixed solution composed of 200 ml of isobutanol and 800 ml of heptane to precipitate crystals. The thus obtained crystals were filtered and were then dried, thereby yielding 6.89 g of a white solid (polymer compound (A)-9-4).

In the above formula (A)-9, the composition of the polymer compound (A)-9-4 represented by the ratio l:m (molar ratio) of the respective monomers is l:m=51:49. With respect to the polymer compound (A)-9-4, the weight average molecular weight (Mw) was 4,300, and the dispersity (Mw/Mn) was 1.86.

Synthesis of Polymer Compound (A)-9-5

2.5 g of the monomer (1), 1.42 g of the monomer (9) and 0.18 g of dimethyl azobisisobutyrate (product name: V-601 manufactured by Wako Pure Chemical Industries, Ltd.) as a polymerization initiator were dissolved in 200 ml of propylene glycol monomethyl ether (PGME).

Subsequently, nitrogen was bubbled through the solution for approximately 10 minutes, and the solution was then stirred under heating for 4 hours using a 80° C. oil bath, and then cooled to room temperature. Subsequently, the reaction solution was filtered, the obtained filtrate was then concentrated and dried to solidify, and the resultant was dissolved in 50 ml of PGME. Thereafter, the obtained solution was dropwise added to 200 ml of isobutanol, followed by the addition of 1,000 ml of heptane thereto to precipitate crystals. The thus obtained crystals were filtered and were then dried, thereby yielding 2.20 g of a white solid (polymer compound (A)-9-5).

In the above formula (A)-9, the composition of the polymer compound (A)-9-5 represented by the ratio l:m (molar ratio) of the respective monomers is 1:m=68:32. With respect to the polymer compound (A)-9-5, the weight average molecular weight (Mw) was 2,900, and the dispersity (Mw/Mn) was 2.60.

Synthesis of Polymer Compound (A)-10

4.28 g of the monomer (1), 2.59 g of the monomer (9), 0.758 g of the monomer (10) and 0.12 g of dimethyl azobisisobutyrate (product name: V-601 manufactured by Wako Pure Chemical Industries, Ltd.) as a polymerization initiator were dissolved in 80 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. Subsequently, the reaction solution was filtered, and the obtained filtrate was then concentrated and dried to solidify using an evaporator. Thereafter, the resultant was dissolved in 70 mL of THF, and the resulting solution was poured into 1,000 ml of heptane to precipitate a resin. The thus obtained resin was filtered and was then dried, thereby yielding 4.98 g of a white solid (polymer compound (A)-10).

In the following formula (A)-10, the composition of the polymer compound (A)-10 represented by the ratio l:m:n (molar ratio) of the respective monomers is l:m:n=50:33:17. With respect to the polymer compound (A)-10, the weight average molecular weight (Mw) was 4,400, and the dispersity (Mw/Mn) was 2.01.

[Chemical Formula 72]

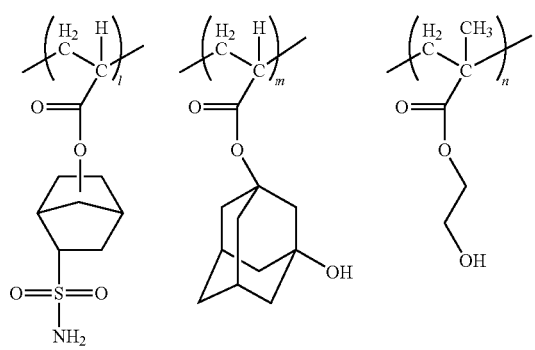

(A)-10

Synthesis of Polymer Compound (A)-10-1

4.28 g of the monomer (1), 2.59 g of the monomer (9), 0.758 g of the monomer (10) and 0.12 g of dimethyl azobisisobutyrate (product name: V-601 manufactured by Wako Pure Chemical Industries, Ltd.) as a polymerization initiator were dissolved in 60 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. Subsequently, the reaction solution was filtered, and the obtained filtrate was then concentrated and dried to solidify using an evaporator. Thereafter, the resultant was dissolved in 70 mL of THF, and the resulting solution was poured into 1,000 ml of heptane to precipitate a resin. The thus obtained resin was filtered and was then dried, thereby yielding 3.05 g of a white solid (polymer compound (A)-10-1).

In the above formula (A)-10, the composition of the polymer compound (A)-10-1 represented by the ratio l:m:n (molar ratio) of the respective monomers is l:m:n=46:37:17. With respect to the polymer compound (A)-10-1, the weight average molecular weight (Mw) was 3,200, and the dispersity (Mw/Mn) was 1.97.

Synthesis of Polymer Compound (A)-11

3.43 g of the monomer (1), 3.10 g of the monomer (9), 1.86 g of the monomer (11) and 0.12 g of dimethyl azobisisobutyrate (product name: V-601 manufactured by Wako Pure Chemical Industries, Ltd.) as a polymerization initiator were dissolved in 60 ml of tetrahydrofuran (THF).

Subsequently, nitrogen was bubbled through the solution for approximately 10 minutes, and the solution was then stirred under heating for 4 hours using a 70° C. oil bath, and then cooled to room temperature. Subsequently, the reaction solution was concentrated and dried to solidify using an evaporator. Thereafter, the resultant was dissolved in 40 mL of THF, and the resulting solution was poured into 1,000 ml of heptane to precipitate a resin. The thus obtained resin was filtered and was then dried, thereby yielding 6.97 g of a white solid (polymer compound (A)-11).

In the following formula (A)-11, the composition of the polymer compound (A)-11 represented by the ratio l:m:n (molar ratio) of the respective monomers is l:m:n=39:40:21. With respect to the polymer compound (A)-11, the weight average molecular weight (Mw) was 5,000, and the dispersity (Mw/Mn) was 1.89.

[Chemical Formula 73]

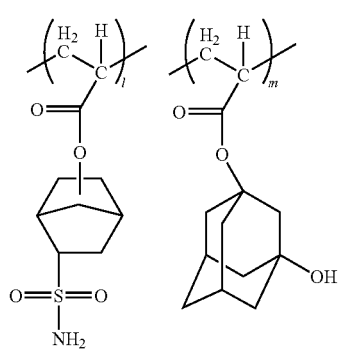

(A)-11

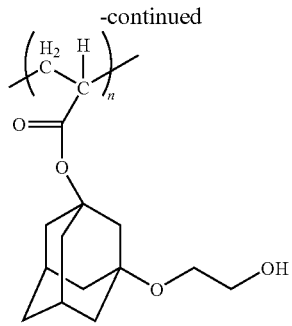

Synthesis of Polymer Compound (A)-11-1

6.86 g of the monomer (1), 3.10 g of the monomer (9), 7.44 g of the monomer (11) and 0.24 g of dimethyl azobisisobutyrate (product name: V-601 manufactured by Wako Pure Chemical Industries, Ltd.) as a polymerization initiator were dissolved in 100 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 50 mL of PGME. Thereafter, the obtained solution was dropwise added to 200 ml of IBA, followed by the addition of 1,000 ml of heptane thereto to precipitate crystals, and the precipitated crystals were collected by filtration. The same operation was repeated once more and the obtained crystals were dried, thereby yielding 15.22 g of a white solid (polymer compound (A)-11-1).

In the above formula (A)-11, the composition of the polymer compound (A)-11-1 represented by the ratio l:m:n (molar ratio) of the respective monomers is l:m:n=36:24:40. With respect to the polymer compound (A)-11-1, the weight average molecular weight (Mw) was 11,100, and the dispersity (Mw/Mn) was 2.32.

Synthesis of Polymer Compound (A)-11-2

3.43 g of the monomer (1), 1.55 g of the monomer (9), 3.72 g of the monomer (11) and 0.24 g of dimethyl azobisisobutyrate (product name: V-601 manufactured by Wako Pure Chemical Industries, Ltd.) as a polymerization initiator were dissolved in 200 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 100 mL of PGME. Thereafter, the obtained solution was dropwise added to 200 ml of IBA, followed by the addition of 1,000 ml of heptane thereto to precipitate crystals, and the precipitated crystals were collected by filtration. The thus obtained crystals were dried, thereby yielding 5.3 g of a white solid (polymer compound (A)-11-2).

In the above formula (A)-11, the composition of the polymer compound (A)-11-2 represented by the ratio l:m:n (molar ratio) of the respective monomers is l:m:n=40:23:37. With respect to the polymer compound (A)-11-2, the weight average molecular weight (Mw) was 4,100, and the dispersity (Mw/Mn) was 1.82.

Synthesis of Polymer Compound (A)-11-3

4.28 g of the monomer (1), 2.59 g of the monomer (9), 1.55 g of the monomer (11) and 0.24 g of dimethyl azobisisobutyrate (product name: V-601 manufactured by Wako Pure Chemical Industries, Ltd.) as a polymerization initiator were dissolved in 200 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 100 mL of PGME. Thereafter, the obtained solution was dropwise added to 200 ml of IBA, followed by the addition of 1,000 ml of heptane thereto to precipitate crystals, and the precipitated crystals were collected by filtration. The thus obtained crystals were dried, thereby yielding 6.10 g of a white solid (polymer compound (A)-11-3).

In the above formula (A)-11, the composition of the polymer compound (A)-11-3 represented by the ratio l:m:n (molar ratio) of the respective monomers is l:m:n=51:32:17. With respect to the polymer compound (A)-11-3, the weight average molecular weight (Mw) was 2,700, and the dispersity (Mw/Mn) was 1.67.

Synthesis of Polymer Compound (A)-11-4

5.71 g of the monomer (1), 1.72 g of the monomer (9), 1.03 g of the monomer (11) and 0.24 g of dimethyl azobisisobutyrate (product name: V-601 manufactured by Wako Pure Chemical Industries, Ltd.) as a polymerization initiator were dissolved in 200 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 100 mL of PGME. Thereafter, the obtained solution was dropwise added to 200 ml of IBA, followed by the addition of 1,000 ml of heptane thereto to precipitate crystals, and the precipitated crystals were collected by filtration. The thus obtained crystals were dried, thereby yielding 5.30 g of a white solid (polymer compound (A)-11-4).

In the above formula (A)-11, the composition of the polymer compound (A)-11-4 represented by the ratio l:m:n (molar ratio) of the respective monomers is l:m:n=67:21:12. With respect to the polymer compound (A)-11-4, the weight average molecular weight (Mw) was 2,000, and the dispersity (Mw/Mn) was 1.63.

Synthesis of Polymer Compound (A)-11-5

4.28 g of the monomer (1), 2.59 g of the monomer (9), 1.55 g of the monomer (11) and 0.24 g of dimethyl azobisisobutyrate (product name: V-601 manufactured by Wako Pure Chemical Industries, Ltd.) as a polymerization initiator were dissolved in 150 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 100 mL of PGME. Thereafter, the obtained solution was dropwise added to 200 ml of IBA, followed by the addition of 1,000 ml of heptane thereto to precipitate crystals, and the precipitated crystals were collected by filtration. The thus obtained crystals were dried, thereby yielding 1.76 g of a white solid (polymer compound (A)-11-5).

In the above formula (A)-11, the composition of the polymer compound (A)-11-5 represented by the ratio l:m:n (molar ratio) of the respective monomers is l:m:n=52:31:17. With respect to the polymer compound (A)-11-5, the weight average molecular weight (Mw) was 4,000, and the dispersity (Mw/Mn) was 1.76.

Synthesis of Polymer Compound (A)-13

5.14 g of the monomer (1), 2.88 g of the monomer (12) and 0.12 g of dimethyl azobisisobutyrate (product name: V-601 manufactured by Wako Pure Chemical Industries, Ltd.) as a polymerization initiator were dissolved in 50 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 60 mL of PGME. Thereafter, the obtained solution was dropwise added to 200 ml of IBA, followed by the addition of 1,000 ml of heptane thereto to precipitate crystals, and the precipitated crystals were collected by filtration. The thus obtained crystals were dried, thereby yielding 6.47 g of a white solid (polymer compound (A)-13).

In the following formula (A)-13, the composition of the polymer compound (A)-13 represented by the ratio l:m (molar ratio) of the respective monomers is l:m=59:41. With respect to the polymer compound (A)-13, the weight average molecular weight (Mw) was 7,100, and the dispersity (Mw/Mn) was 2.06.

[Chemical Formula 74]

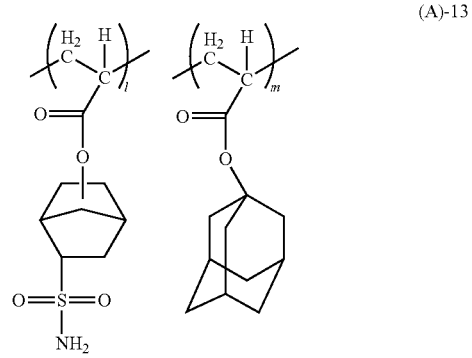

(A)-13

Synthesis of Polymer Compound (A)-14

3.43 g of the monomer (1), 5.58 g of the monomer (11) and 0.12 g of dimethyl azobisisobutyrate (product name: V-601 manufactured by Wako Pure Chemical Industries, Ltd.) as a polymerization initiator were dissolved in 50 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 50 mL of PGME. Thereafter, the obtained solution was dropwise added to 200 ml of IBA, followed by the addition of 1,000 ml of heptane thereto to precipitate crystals, and the precipitated crystals were collected by filtration. The same operation was repeated once more and the obtained crystals were dried, thereby yielding 8.54 g of a white solid (polymer compound (A)-14).

In the following formula (A)-14, the composition of the polymer compound (A)-14 represented by the ratio l:m (molar ratio) of the respective monomers is l:m=37:63. With respect to the polymer compound (A)-14, the weight average molecular weight (Mw) was 12,300, and the dispersity (Mw/Mn) was 2.30.

[Chemical Formula 75]

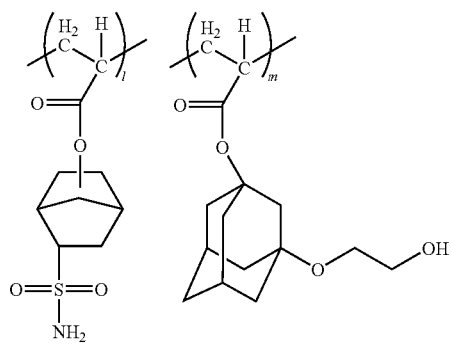

(A)-14

Synthesis of Polymer Compound (A)-15

6.86 g of the monomer (1), 7.44 g of the monomer (11), 2.88 g of the monomer (12) and 0.24 g of dimethyl azobisisobutyrate (product name: V-601 manufactured by Wako Pure Chemical Industries, Ltd.) as a polymerization initiator were dissolved in 100 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 50 mL of PGME. Thereafter, the obtained solution was dropwise added to 200 ml of IBA, followed by the addition of 1,000 ml of heptane thereto to precipitate crystals, and the precipitated crystals were collected by filtration. The same operation was repeated once more and the obtained crystals were dried, thereby yielding 15.58 g of a white solid (polymer compound (A)-15).

In the following formula (A)-15, the composition of the polymer compound (A)-15 represented by the ratio l:m:n (molar ratio) of the respective monomers is l:m:n=36:42:22. With respect to the polymer compound (A)-15, the weight average molecular weight (Mw) was 13,300, and the dispersity (Mw/Mn) was 2.36.

[Chemical Formula 76]

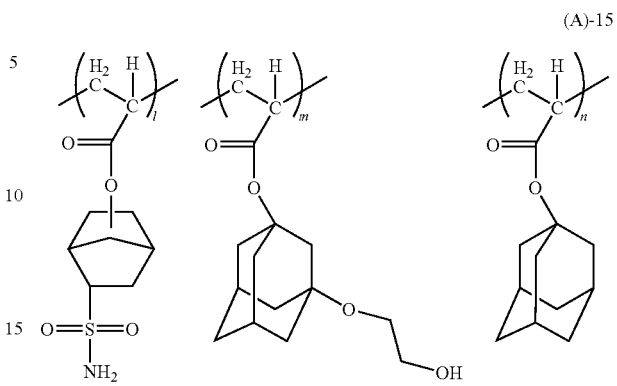

(A)-15

Synthesis of Polymer Compound (A)-15-1

6.86 g of the monomer (1), 7.44 g of the monomer (11), 2.88 g of the monomer (12) and 0.24 g of dimethyl azobisisobutyrate (product name: V-601 manufactured by Wako Pure Chemical Industries, Ltd.) as a polymerization initiator were dissolved in 200 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 100 mL of PGME. Thereafter, the obtained solution was divided into two and each of these aliquots was dropwise added to 200 ml of IBA, followed by the addition of 1,000 ml of heptane thereto to precipitate crystals, and the precipitated crystals were collected by filtration. The same operation was repeated once more. The thus obtained crystals were dried, thereby yielding 15.3 g of a white solid (polymer compound (A)-15-1). In the above formula (A)-15, the composition of the polymer compound (A)-15-1 represented by the ratio l:m:n (molar ratio) of the respective monomers is l:m:n=39:40:21. With respect to the polymer compound (A)-15-1, the weight average molecular weight (Mw) was 7,200, and the dispersity (Mw/Mn) was 2.08.

Synthesis of Polymer Compound (A)-15-2

3.43 g of the monomer (1), 3.72 g of the monomer (11), 1.44 g of the monomer (12) and 0.24 g of dimethyl azobisisobutyrate (product name: V-601 manufactured by Wako Pure Chemical Industries, Ltd.) as a polymerization initiator were dissolved in 200 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 50 mL of PGME. Thereafter, the obtained solution was dropwise added to 200 ml of IBA, followed by the addition of 1,000 ml of heptane thereto to precipitate crystals, and the precipitated crystals were collected by filtration. The thus obtained crystals were dried, thereby yielding 5.7 g of a white solid (polymer compound (A)-15-2).

In the above formula (A)-15, the composition of the polymer compound (A)-15-2 represented by the ratio l:m:n (molar ratio) of the respective monomers is l:m:n=39:40:21. With respect to the polymer compound (A)-15-2, the weight average molecular weight (Mw) was 5,000, and the dispersity (Mw/Mn) was 1.96.

Synthesis of Polymer Compound (A)-15-3

3.85 g of the monomer (1), 4.19 g of the monomer (11), 0.72 g of the monomer (12) and 0.24 g of dimethyl azobisisobutyrate (product name: V-601 manufactured by Wako Pure Chemical Industries, Ltd.) as a polymerization initiator were dissolved in 200 ml of PGME.

Subsequently, nitrogen was bubbled through the solution for approximately 10 minutes, and the solution was then stirred under heating for 4 hours using a 80° C. oil bath, and then cooled to room temperature. Subsequently, the reaction solution was concentrated and dried to solidify using an evaporator, and the resultant was then dissolved in 50 mL of PGME. Thereafter, the obtained solution was dropwise added to 200 ml of IBA, followed by the addition of 1,000 ml of heptane thereto to precipitate crystals, and the precipitated crystals were collected by filtration. The thus obtained crystals were dried, thereby yielding 4.6 g of a white solid (polymer compound (A)-15-3).

In the above formula (A)-15, the composition of the polymer compound (A)-15-3 represented by the ratio l:m:n (molar ratio) of the respective monomers is l:m:n=44:44:12. With respect to the polymer compound (A)-15-3, the weight average molecular weight (Mw) was 3,300, and the dispersity (Mw/Mn) was 1.68.

The polymer compounds (A)-1 to (A)-11-5 and (A)-13 to (A)-15-3 are resins containing each of the structural units derived from the aforementioned monomers (1) to (12) at respective proportions. With respect to proportions, the percentage (compositional ratio: mol %) of the respective structural units relative to the combined total of all structural units constituting each resin is indicated.

The percentage (compositional ratio: mol %) of the respective structural units relative to the combined total of all structural units constituting each polymer compound, and the weight average molecular weight (Mw) and dispersity (Mw/Mn) of each polymer compound are shown in Tables 1 and 2.

The weight average molecular weight (Mw) and dispersity (Mw/Mn) were determined by the polystyrene equivalent value as measured by gel permeation chromatography (GPC). The compositional ratio is shown as the molar ratio determined by carbon NMR.

As a comparative resin, a polymer compound represented by the following chemical formula (A)-12 was used (which had a weight average molecular weight (Mw) of 5,000, and a dispersity (Mw/Mn) of 1.34).

[Chemical Formula 77]

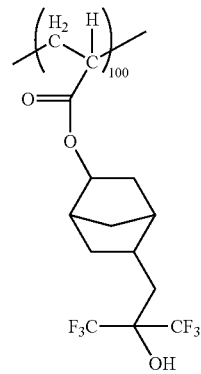

(A)-12

TABLE 1

|  | (1) | (2) | (3) | (4) | (5) | (6) | (7) | (8) | Mw | Mw/Mn |
|---|---|---|---|---|---|---|---|---|---|---|
| (A)-1 | — | 50 | 50 | — | — | — | — | — | 11,200 | 4.70 |
| (A)-2 | 50 | — | — | 50 | — | — | — | — | 4,800 | 2.16 |
| (A)-3 | 20 | — | 40 | 40 | — | — | — | — | 7,100 | 1.83 |
| (A)-3' | 20 | — | 40 | 40 | — | — | — | — | 4,900 | 2.38 |
| (A)-3" | 20 | — | 40 | 40 | — | — | — | — | 8,300 | 2.02 |
| (A)-4 | 50 | — | — | — | 50 | — | — | — | 5,200 | 2.88 |
| (A)-5 | 50 | — | — | — | — | 50 | — | — | 15,700 | 2.14 |
| (A)-6 | 50 | — | — | — | — | — | 50 | — | 5,000 | 1.93 |
| (A)-7 | 20 | — | — | 30 | — | — | — | 50 | 7,200 | 1.77 |

TABLE 2

|  | (1) | (1') | (9) | (10) | (11) | (12) | Mw | Mw/Mn |
|---|---|---|---|---|---|---|---|---|
| (A)-8 | 100 | — | — | — | — | — | 5,920 | 3.68 |
| (A)-8' | — | 100 | — | — | — | — | 13,000 | 4.2 |
| (A)-9 | 60 | — | 40 | — | — | — | 5,520 | 2.94 |
| (A)-9-1 | 59 | — | 41 | — | — | — | 3,400 | 1.76 |
| (A)-9-2 | 38 | — | 62 | — | — | — | 5,900 | 2.26 |
| (A)-9-3 | 48 | — | 52 | — | — | — | 3,400 | 1.83 |
| (A)-9-4 | 51 | — | 49 | — | — | — | 4,300 | 1.86 |
| (A)-9-5 | 68 | — | 32 | — | — | — | 2,900 | 2.60 |
| (A)-10 | 50 | — | 33 | 17 | — | — | 4,400 | 2.01 |
| (A)-10-1 | 46 | — | 37 | 17 | — | — | 3,200 | 1.97 |
| (A)-11 | 39 | — | 40 | — | 21 | — | 5,000 | 1.89 |
| (A)-11-1 | 36 | — | 24 | — | 40 | — | 11,100 | 2.32 |
| (A)-11-2 | 40 | — | 23 | — | 37 | — | 4,100 | 1.82 |
| (A)-11-3 | 51 | — | 32 | — | 17 | — | 2,700 | 1.67 |
| (A)-11-4 | 67 | — | 21 | — | 12 | — | 2,000 | 1.63 |
| (A)-11-5 | 52 | — | 31 | — | 17 | — | 4,000 | 1.76 |
| (A)-13 | 59 | — | — | — | — | 41 | 7,100 | 2.06 |
| (A)-14 | 37 | — | — | — | 63 | — | 12,300 | 2.30 |
| (A)-15 | 36 | — | — | — | 42 | 22 | 13,300 | 2.36 |
| (A)-15-1 | 39 | — | — | — | 40 | 21 | 7,200 | 2.08 |
| (A)-15-2 | 39 | — | — | — | 40 | 21 | 5,000 | 1.96 |
| (A)-15-3 | 44 | — | — | — | 44 | 12 | 3,300 | 1.68 |

<Positive Resist Composition>

The components shown in Table 3 were mixed together and dissolved in an organic solvent to obtain positive resist composition solutions.

TABLE 3

|  | Component (A) | Component (B) | Component (D) | Component (S) |
|---|---|---|---|---|
| Example 1 | (A)-1 [100] | (B)-1 [8] | (D)-1 [1.2] | (S)-1 [2,000] |

TABLE 3-continued

|  | Component (A) | Component (B) | Component (D) | Component (S) |
|---|---|---|---|---|
| Example 2 | (A)-2 [100] | (B)-1 [8] | (D)-1 [1.2] | (S)-1 [2,000] |
| Example 3 | (A)-3 [100] | (B)-1 [8] | (D)-1 [1.2] | (S)-1 [2,000] |
| Example 4 | (A)-4 [100] | (B)-1 [8] | (D)-1 [1.2] | (S)-1 [2,000] |
| Example 5 | (A)-5 [100] | (B)-1 [8] | (D)-1 [1.2] | (S)-1 [2,000] |

In Table 3, the reference characters indicate the following. Further, the values in brackets [ ] indicate the amount (in terms of parts by weight) of the component added.
(A)-1 to (A)-5: the respective polymer compounds (A)-1 to (A)-5 described above.
(B)-1: (4-methylphenyl)diphenylsulfonium nonafluorobutanesulfonate.
(D)-1: tri-n-pentylamine
(S)-1: propylene glycol monomethyl ether (PGME).
(Evaluation of Lithographic Properties)

The following evaluations on lithographic properties were performed using the positive resist composition solutions thus obtained.

An organic antireflection film composition (product name: ARC-29A, manufactured by Brewer Science Ltd.) was applied uniformly onto an 8-inch silicon wafer using a spinner, and the composition was then baked and dried on a hotplate at 205° C. for 60 seconds, thereby forming an organic antireflection film having a film thickness of 77 nm.

Then, the positive resist composition shown in Table 3 was applied onto the antireflection film using a spinner, and was then prebaked (PAB) and dried on a hotplate at 100° C. for 60 seconds, thereby forming a resist film having a film thickness of 150 nm.

Subsequently, the resist film was selectively irradiated with an ArF excimer laser (193 nm) through a mask pattern having a target size of "line width of 120 nm, space width of 120 nm, and (line width):(space width)=1:1", using an ArF exposure apparatus NSR-S302 (manufactured by Nikon Corporation; NA (numerical aperture)=0.60, ⅔ annular illumination).

Thereafter, a post exposure bake (PEB) treatment was conducted at 100° C. for 60 seconds, and the resist film was then developed for 30 seconds at 23° C. in a 2.38% by weight aqueous solution of tetramethylammonium hydroxide (TMAH). The resist film was then washed with water for 30 seconds and dried. At each exposure dose shown in Table 4, it was confirmed that a resist pattern having a line and space pattern (1:1) with a line width of 120 nm and a pitch of 120 nm had been resolved.

TABLE 4

|  | Exposure Dose (mJ/cm$^2$) |
|---|---|
| Example 1 | 45 |
| Example 2 | 29 |
| Example 3 | 7 |
| Example 4 | 13 |
| Example 5 | 29 |

<Negative Resist Composition>

The components shown in Tables 5 and 6 were mixed together and dissolved in an organic solvent to obtain negative resist composition solutions.

TABLE 5

| | Component (A) | Component (B) | Component (C) | Component (D) | Component (S) |
|---|---|---|---|---|---|
| Example 6 | (A)-8 [100] | (B)-2 [2] | (C)-1 [5] | (D)-2 [0.4] | (S)-1 [1,000] (S)-2 [1,000] |
| Example 7 | (A)-9 [100] | (B)-2 [2] | (C)-1 [5] | (D)-2 [0.4] | (S)-1 [1,000] (S)-2 [1,000] |
| Example 8 | (A)-9-2 [100] | (B)-2 [2] | (C)-1 [5] | (D)-2 [0.4] | (S)-1 [2,000] |
| Example 9 | (A)-10 [100] | (B)-2 [2] | (C)-1 [5] | (D)-2 [0.4] | (S)-1 [2,000] |
| Example 10 | (A)-11 [100] | (B)-2 [2] | (C)-1 [5] | (D)-2 [0.4] | (S)-1 [2,000] |
| Comparative Example 1 | (A)-12 [100] | (B)-2 [2] | (C)-1 [5] | (D)-2 [0.4] | (S)-1 [2,000] |

TABLE 6

| | Component (A) | Component (B) | Component (C) | Component (D) | Component (S) |
|---|---|---|---|---|---|
| Example 11 | (A)-10-1 [100] | (B)-2 [2] | (C)-1 [5] | (D)-2 [0.4] | (S)-1 [2,000] |
| Example 12 | (A)-9-3 [100] | (B)-2 [2] | (C)-1 [5] | (D)-2 [0.4] | (S)-1 [2,000] |
| Example 13 | (A)-9-4 [100] | (B)-2 [2] | (C)-1 [5] | (D)-2 [0.4] | (S)-1 [2,000] |
| Example 14 | (A)-9-4 [100] | (B)-2 [2] | (C)-1 [10] | (D)-2 [0.4] | (S)-1 [2,000] |
| Example 15 | (A)-13-1 [100] | (B)-2 [2] | (C)-1 [5] | (D)-2 [0.4] | (S)-1 [2,000] |
| Example 16 | (A)-8-1 [100] | (B)-2 [2] | (C)-1 [5] | (D)-2 [0.4] | (S)-1 [2,000] |
| Example 17 | (A)-15 [100] | (B)-2 [2] | (C)-1 [5] | (D)-2 [0.4] | (S)-1 [2,000] |
| Example 18 | (A)-15-1 [100] | (B)-2 [2] | (C)-1 [5] | (D)-2 [0.4] | (S)-1 [2,000] |
| Example 19 | (A)-11-1 [100] | (B)-2 [2] | (C)-1 [5] | (D)-2 [0.4] | (S)-1 [2,000] |
| Example 20 | (A)-11-2 [100] | (B)-2 [2] | (C)-1 [5] | (D)-2 [0.4] | (S)-1 [2,000] |
| Example 21 | (A)-9-5 [100] | (B)-2 [2] | (C)-1 [5] | (D)-2 [0.4] | (S)-1 [2,000] |
| Example 22 | (A)-15-2 [100] | (B)-2 [2] | (C)-1 [5] | (D)-2 [0.4] | (S)-1 [2,000] |
| Example 23 | (A)-15-3 [100] | (B)-2 [2] | (C)-1 [5] | (D)-2 [0.4] | (S)-1 [2,000] |

In Tables 5 and 6, the reference characters indicate the following. Further, the values in brackets [ ] indicate the amount (in terms of parts by weight) of the component added.
(A)-8 to (A)-15-3: the respective polymer compounds (A)-8 to (A)-15-3 described above.
(B)-2: triphenylsulfonium trifluoromethanesulfonate
(C)-1: tetramethoxymethylated glycoluril (product name: Nikalac MX-270, manufactured by Sanwa Chemical Co., Ltd.)

[Chemical Formula 78]

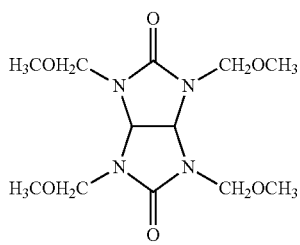

(D)-2: triisopropanolamine
(S)-1: propylene glycol monomethyl ether (PGME)
(S)-2: dimethyl sulfoxide (DMSO)
(Evaluation of Residual Film Properties)

The following evaluations on residual film properties were performed using the negative resist composition solutions thus obtained.

An organic antireflection film composition (product name: ARC-29, manufactured by Brewer Science Ltd.) was applied uniformly onto an 8-inch silicon wafer using a spinner, and the composition was then baked and dried on a hotplate at 205° C. for 60 seconds, thereby forming an organic antireflection film having a film thickness of 77 nm.

The negative resist composition shown in Tables 5 and 6 was then applied onto the organic antireflection film using a spinner, and was then prebaked (PAB) and dried on a hotplate at 80° C. for 60 seconds, thus forming a resist film having a film thickness of 160 nm.

Subsequently, using an ArF exposure apparatus NSR-S302 (product name, manufactured by Nikon Corporation, NA (numerical aperture)=0.60, ⅔ annular illumination), the resist film was then irradiated with an ArF excimer laser (193 nm) using an exposure dose of 1 to 30 mJ/cm$^2$.

Thereafter, a post exposure bake (PEB) treatment was conducted at 100° C. for 60 seconds, and the resist film was then developed for 60 seconds at 23° C. in a 2.38% by weight aqueous solution of tetramethylammonium hydroxide (TMAH). The resist film was then washed with water for 30 seconds, and the film thickness of the resist film was measured.

The residual film ratio (resist film thickness following developing/resist film thickness upon film deposition (prior to exposure)) at an exposure dose of 30 mJ/cm$^2$ was determined. The results are shown in Table 7.

TABLE 7

| | Residual Film Properties (%) |
|---|---|
| Example 6 | 42 |
| Example 7 | 30 |
| Example 8 | 69 |
| Example 9 | 70 |
| Example 10 | 85 |
| Comparative Example 1 | 0 |
| Example 11 | 75 |
| Example 12 | 82 |
| Example 13 | 80 |
| Example 14 | 75 |
| Example 15 | 95 |
| Example 16 | 90 |
| Example 17 | 99 |
| Example 18 | 99 |
| Example 19 | 97 |
| Example 20 | 96 |
| Example 21 | 33 |

TABLE 7-continued

| | Residual Film Properties (%) |
|---|---|
| Example 22 | 92 |
| Example 23 | 90 |

In those cases where the composition of Comparative Example 1 was used, the residual film ratio within an exposure dose from 1 to 30 mJ/cm$^2$ was always 0%, and thus it became apparent that the crosslinking reaction did not proceed, and the composition was not able to function as a negative resist composition.

On the other hand, it was confirmed that all of the resist compositions of present examples according to the present invention exhibited excellent residual film properties, and were able to function as negative resist compositions.

(Evaluation of Lithographic Properties)

The following evaluations on lithographic properties were performed using the negative resist composition solutions of Examples 8, 9 and 10.

An organic antireflection film composition (product name: ARC-29, manufactured by Brewer Science Ltd.) was applied uniformly onto an 8-inch silicon wafer using a spinner, and the composition was then baked and dried on a hotplate at 205° C. for 60 seconds, thereby forming an organic antireflection film having a film thickness of 77 nm.

Each of the negative resist compositions of Examples 8, 9 and 10 was then applied onto the organic antireflection film using a spinner, and was then prebaked (PAB) and dried on a hotplate at 80° C. for 60 seconds, thus forming a resist film having a film thickness of 160 nm.

Subsequently, using an ArF exposure apparatus NSR-S302 (product name, manufactured by Nikon Corporation, NA (numerical aperture)=0.60, ⅔ annular illumination), the resist film was then irradiated with an ArF excimer laser (193 nm) through a mask pattern with a line and space pattern (1:1).

Thereafter, a post exposure bake (PEB) treatment was conducted at 100° C. for 60 seconds, and the resist film was then developed for 60 seconds at 23° C. in a 2.38% by weight aqueous solution of tetramethylammonium hydroxide (TMAH). The developed resist film was then washed with water for 30 seconds and dried. It was confirmed that resist patterns having line and space patterns with the respective line widths shown in Table 8 had been resolved.

TABLE 8

| | Exposure Dose (mJ/cm$^2$) | Line Width (nm) |
|---|---|---|
| Example 8 | 28.0 | 200 |
| Example 9 | 24.0 | 150 |
| Example 10 | 27.0 | 140 |

INDUSTRIAL APPLICABILITY

According to the present invention, a novel polymer compound, a resist composition and a method of forming a resist pattern which can be used in lithography applications are provided. Therefore, the present invention is extremely useful in industry.

The invention claimed is:
1. A polymer compound comprising a structural unit (a0) represented by general formula (a0-1) shown below:

[Chemical Formula 1]

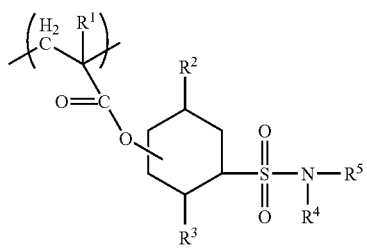

(a0-1)

wherein $R^1$ represents a hydrogen atom, an alkyl group of 1 to 5 carbon atoms or a fluorinated alkyl group of 1 to 5 carbon atoms; $R^2$ and $R^3$ each independently represents a hydrogen atom, an alkyl group or an alkoxy group, or $R^2$ and $R^3$ may be bonded together to form an alkylene group that may include an oxygen atom or sulfur atom at an arbitrary position, —O— or —S—; $R^4$ and $R^5$ each independently represents a hydrogen atom, an alkyl group that may include an oxygen atom at an arbitrary position, a cycloalkyl group that may include an oxygen atom at an arbitrary position or an alkoxycarbonyl group.

2. The polymer compound according to claim 1, further comprising a structural unit (a1) derived from an acrylate ester having an acid dissociable, dissolution inhibiting group.

3. The polymer compound according to claim 1, further comprising a structural unit (a2) derived from an acrylate ester having a lactone-containing cyclic group.

4. The polymer compound according to claim 1, further comprising a structural unit (a3) that is outside the definition of the structural unit (a0), and is derived from an acrylate ester that contains a polar group-containing aliphatic hydrocarbon group.

5. The polymer compound according to claim 4, wherein the structural unit (a3) is a structural unit (a'3) derived from an acrylate ester containing a hydroxyl group-containing aliphatic cyclic group and/or a structural unit (a''3) derived from an acrylic acid that has no cyclic structure and has an alcoholic hydroxyl group on a side chain.

6. The polymer compound according to claim 1, further comprising a structural unit (a4) that is outside the definition of the structural units (a0) to (a3), and is derived from an acrylate ester that contains a non-acid-dissociable, aliphatic polycyclic group.

7. A resist composition comprising:
a resin component (A) which contains the polymer compound of claim 1; and
an acid-generator component (B) which generates acid upon irradiation.

8. A method of forming a resist pattern comprising:
applying a resist composition of claim 7 to a substrate to form a resist film on the substrate;
subjecting the resist film to exposure; and
developing the resist film to form a resist pattern.

* * * * *